US011428521B2

(12) United States Patent
Bhattacharyya et al.

(10) Patent No.: US 11,428,521 B2
(45) Date of Patent: Aug. 30, 2022

(54) METROLOGY METHOD, TARGET AND SUBSTRATE

(71) Applicant: ASML NETHERLANDS B.V., Veldhoven (NL)

(72) Inventors: Kaustuve Bhattacharyya, Veldhoven (NL); Henricus Wilhelmus Maria Van Buel, 's-Hertogenbosch (NL); Christophe David Fouquet, Retie (BE); Hendrik Jan Hidde Smilde, Veldhoven (NL); Maurits Van der Schaar, Eindhoven (NL); Arie Jeffrey Den Boef, Waalre (NL); Richard Johannes Franciscus Van Haren, Waalre (NL); Xing Lan Liu, Veldhoven (NL); Johannes Marcus Maria Beltman, Knegsel (NL); Andreas Fuchs, Meerbusch (DE); Omer Abubaker Omer Adam, Eindhoven (NL); Michael Kubis, Meerbusch (DE); Martin Jacobus Johan Jak, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/519,641

(22) Filed: Nov. 5, 2021

(65) Prior Publication Data
US 2022/0057192 A1    Feb. 24, 2022

Related U.S. Application Data

(63) Continuation of application No. 16/931,832, filed on Jul. 17, 2020, now Pat. No. 11,204,239, which is a
(Continued)

(51) Int. Cl.
*G01B 11/14*     (2006.01)
*G03F 7/20*      (2006.01)

(52) U.S. Cl.
CPC .......... *G01B 11/14* (2013.01); *G03F 7/70633* (2013.01); *G03F 7/70683* (2013.01)

(58) Field of Classification Search
CPC ............ G03F 7/70066; G03F 7/70133; G03F 7/70158; G03F 7/70341; G03F 7/70625;
(Continued)

(56) References Cited

U.S. PATENT DOCUMENTS

| 6,612,159 B1 | 9/2003 | Knutrud |
| 7,065,737 B2 | 6/2006 | Phan et al. |

(Continued)

FOREIGN PATENT DOCUMENTS

| CN | 101278237 | 10/2008 |
| CN | 101903832 | 12/2010 |

(Continued)

OTHER PUBLICATIONS

Nuriel Amir et al., "Multi Layer Overlay Measurement Recent Developments," Proc. of SPIE, vol. 8681, pp. 86812V-1-86812V-8 (2013).

(Continued)

*Primary Examiner* — Hoa Q Pham
(74) *Attorney, Agent, or Firm* — Pillsbury Winthrop Shaw Pittman LLP

(57) ABSTRACT

A diffraction measurement target that has at least a first sub-target and at least a second sub-target, and wherein (1) the first and second sub-targets each include a pair of periodic structures and the first sub-target has a different design than the second sub-target, the different design including the first sub-target periodic structures having a different pitch, feature width, space width, and/or segmen-
(Continued)

tation than the second sub-target periodic structure or (2) the first and second sub-targets respectively include a first and second periodic structure in a first layer, and a third periodic structure is located at least partly underneath the first periodic structure in a second layer under the first layer and there being no periodic structure underneath the second periodic structure in the second layer, and a fourth periodic structure is located at least partly underneath the second periodic structure in a third layer under the second layer.

29 Claims, 18 Drawing Sheets

Related U.S. Application Data continuation of application No. 16/507,297, filed on Jul. 10, 2019, now Pat. No. 10,718,604, which is a continuation of application No. 14/835,504, filed on Aug. 25, 2015, now Pat. No. 10,386,176.

(60) Provisional application No. 62/170,008, filed on Jun. 2, 2015, provisional application No. 62/090,801, filed on Dec. 11, 2014.

(58) Field of Classification Search
CPC ............ G03F 7/70616; G03F 7/70633; G03F 7/70683; G03F 17/5081; H01L 22/10; G06F 17/5072; G01B 11/06; G01B 11/272; G01B 11/27; G01B 11/24
USPC .................................................. 356/399–401
See application file for complete search history.

(56) References Cited

U.S. PATENT DOCUMENTS

| | | | |
|---|---|---|---|
| 7,346,878 | B1 | 3/2008 | Cohen et al. |
| 7,408,642 | B1 | 8/2008 | DiBiase |
| 7,587,704 | B2 | 9/2009 | Ye et al. |
| 7,608,468 | B1 | 10/2009 | Ghinovker |
| 7,667,842 | B2 | 2/2010 | Schulz |
| 7,671,990 | B1 | 3/2010 | Adel et al. |
| 7,678,516 | B2 | 3/2010 | Monahan et al. |
| 7,821,650 | B2 | 10/2010 | Van Der Schaar et al. |
| 7,876,438 | B2 | 1/2011 | Ghinovker et al. |
| 7,879,627 | B2 | 2/2011 | Ghinovker et al. |
| 7,898,662 | B2 | 3/2011 | Van Der Schaar et al. |
| 8,035,824 | B2 | 10/2011 | Ausschnitt |
| 8,040,511 | B1 | 10/2011 | Krishnan |
| 8,330,281 | B2 | 12/2012 | Ghinovker et al. |
| 8,339,595 | B2 | 12/2012 | Den Boef |
| 8,411,287 | B2 | 4/2013 | Smilde et al. |
| 8,845,317 | B2 | 9/2014 | Suehira et al. |
| 8,867,020 | B2 | 10/2014 | Smilde et al. |
| 8,908,181 | B2 | 12/2014 | Chen et al. |
| 9,007,585 | B2 | 4/2015 | Cohen |
| 9,081,303 | B2 | 7/2015 | Cramer et al. |
| 9,709,903 | B2* | 7/2017 | Choi ................... G03F 7/70633 |
| 10,133,188 | B2 | 11/2018 | Jak |
| 10,254,658 | B2* | 4/2019 | Slotboom ........... G03F 7/70633 |
| 10,718,604 | B2 | 7/2020 | Bhattacharyya |
| 2003/0021467 | A1 | 1/2003 | Adel et al. |
| 2003/0223630 | A1 | 12/2003 | Adel |
| 2004/0066517 | A1 | 4/2004 | Huang et al. |
| 2006/0103033 | A1* | 5/2006 | Van Haren ............ G03F 9/7092 257/797 |
| 2006/0274312 | A1 | 12/2006 | Endo |
| 2007/0076205 | A1 | 4/2007 | Schulz |
| 2007/0291269 | A1 | 12/2007 | Van Der Schaar et al. |
| 2008/0144036 | A1* | 6/2008 | Schaar ................ G03F 7/70633 356/446 |
| 2008/0148875 | A1 | 6/2008 | Hoogenboom |
| 2008/0230929 | A1 | 9/2008 | Shin et al. |
| 2010/0175033 | A1 | 7/2010 | Adel et al. |
| 2010/0328655 | A1 | 12/2010 | Den Boef |
| 2011/0003256 | A1 | 1/2011 | Van Der Heijden et al. |
| 2011/0027704 | A1 | 2/2011 | Cramer et al. |
| 2011/0043791 | A1 | 2/2011 | Smilde et al. |
| 2012/0044470 | A1 | 2/2012 | Smilde et al. |
| 2012/0242970 | A1 | 9/2012 | Smilde et al. |
| 2013/0050501 | A1 | 2/2013 | Warnaar et al. |
| 2013/0107259 | A1 | 5/2013 | Choi |
| 2013/0258310 | A1 | 10/2013 | Smilde |
| 2013/0271740 | A1 | 10/2013 | Quintanilha |
| 2013/0342831 | A1 | 12/2013 | Levinski et al. |
| 2014/0002822 | A1 | 1/2014 | Chen et al. |
| 2014/0051016 | A1 | 2/2014 | Chiou et al. |
| 2014/0141536 | A1 | 5/2014 | Levinski |
| 2014/0254916 | A1 | 9/2014 | Lee et al. |
| 2015/0050755 | A1 | 2/2015 | Ausschnitt et al. |
| 2015/0242558 | A1 | 8/2015 | Amit |
| 2016/0117847 | A1 | 4/2016 | Pandev |
| 2016/0161863 | A1 | 6/2016 | Den Boef |
| 2016/0178351 | A1 | 6/2016 | Amit |
| 2016/0327605 | A1 | 11/2016 | Pandev |
| 2016/0334715 | A1 | 11/2016 | Smilde et al. |
| 2016/0334716 | A1 | 11/2016 | Mieher |
| 2016/0370718 | A1 | 12/2016 | Demirer |
| 2017/0090302 | A1 | 3/2017 | Slotboom |
| 2019/0064677 | A1 | 2/2019 | Jak |

FOREIGN PATENT DOCUMENTS

| | | |
|---|---|---|
| CN | 103398666 | 11/2013 |
| JP | 2004-508711 | 3/2004 |
| JP | 2008-021984 | 1/2008 |
| JP | 2008-117909 | 5/2008 |
| JP | 2009-510770 | 3/2009 |
| JP | 2011-507264 | 3/2011 |
| JP | 2012-514871 | 6/2012 |
| KR | 100612410 | 8/2006 |
| WO | 2009/078708 | 6/2009 |
| WO | 2009/106279 | 9/2009 |
| WO | 2011/012624 | 2/2011 |
| WO | 2012018673 | 2/2012 |
| WO | 2013/178422 | 12/2013 |
| WO | 2013178422 | 12/2013 |
| WO | 2014039689 | 3/2014 |
| WO | 2014052811 | 4/2014 |
| WO | 2014/082938 | 6/2014 |
| WO | 2014/193983 | 12/2014 |
| WO | 2014/194095 | 12/2014 |
| WO | 2015/113724 | 8/2015 |
| WO | 2015/124397 | 8/2015 |

OTHER PUBLICATIONS

Taiwan Office Action dated Aug. 23, 2016 in corresponding Taiwan Patent Application No. 104128221.
Japanese Office Action dated Feb. 28, 2018 in corresponding Japanese Patent Application No. 2017-511601.
Chinese Office Action dated Apr. 2, 2018 in corresponding Chinese Patent Application No. 201580056531.5.
Korean Office Action issued in corresponding Korean Patent Application No. 10-2017-7008532, dated Jul. 26, 2018.
International Search Report and Written Opinion dated Feb. 26, 2016 in corresponding International Patent Application No. PCT/EP2015/069062.
Japanese Office Action issued in corresponding Japanese Patent Application No. 2018-193964, dated Nov. 25, 2019.
Liu, Zephyr et al.: "OPO reduction by novel target design", Proc. of SPIE, vol. 11325, Mar. 29, 2020.
Intel, "Where does overlay metrologx fit in?", LithoVision, 2018.
Taiwanese Office Action issued in corresponding Taiwanese Patent Application No. 109106753, dated Jun. 25, 2021.
Japanese Office Action issued in corresponding Japanese Patent Application No. 2020-066321, dated Apr. 30, 2021.
Ausschnitt et al.: "Multi-layer Overlay Metrology", Proc. of SPIE, vol. 6152, 615210, Mar. 24, 2006.

(56) References Cited

OTHER PUBLICATIONS

Lee et al.: "Tighter process control of poly- and active-to-contact overlay registration via multilayer analysis", Proc. of SPIE, vol. 3998, Jun. 2, 2000.
Israeli Office Action issued in corresponding Israeli Patent Application No. 250588, dated Jul. 8, 2019.
Chinese Office Action and Search Report issued in corresponding Chinese patent Application No. 2020102645393, dated Jan. 19, 2022.

* cited by examiner

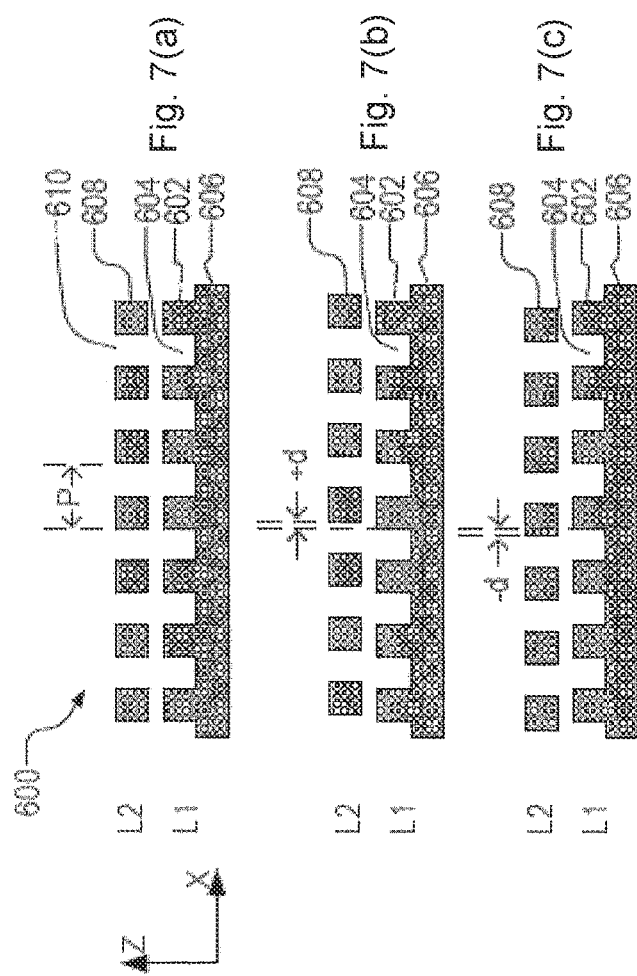
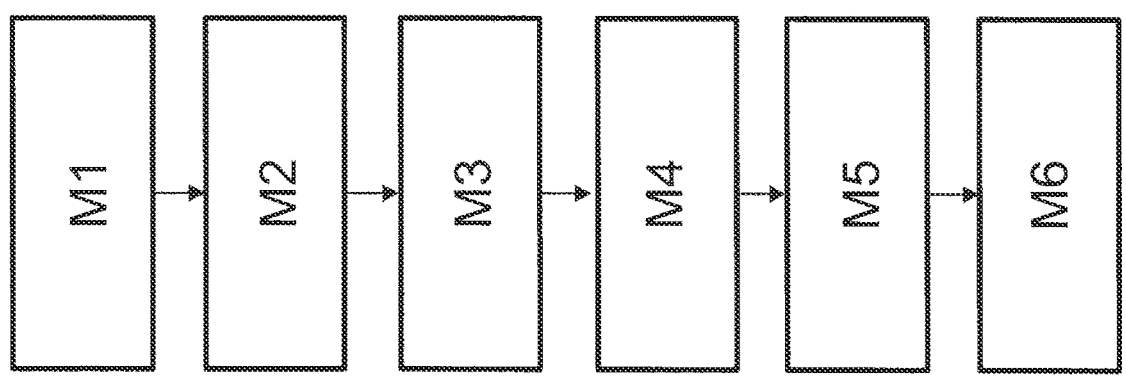
Fig. 6

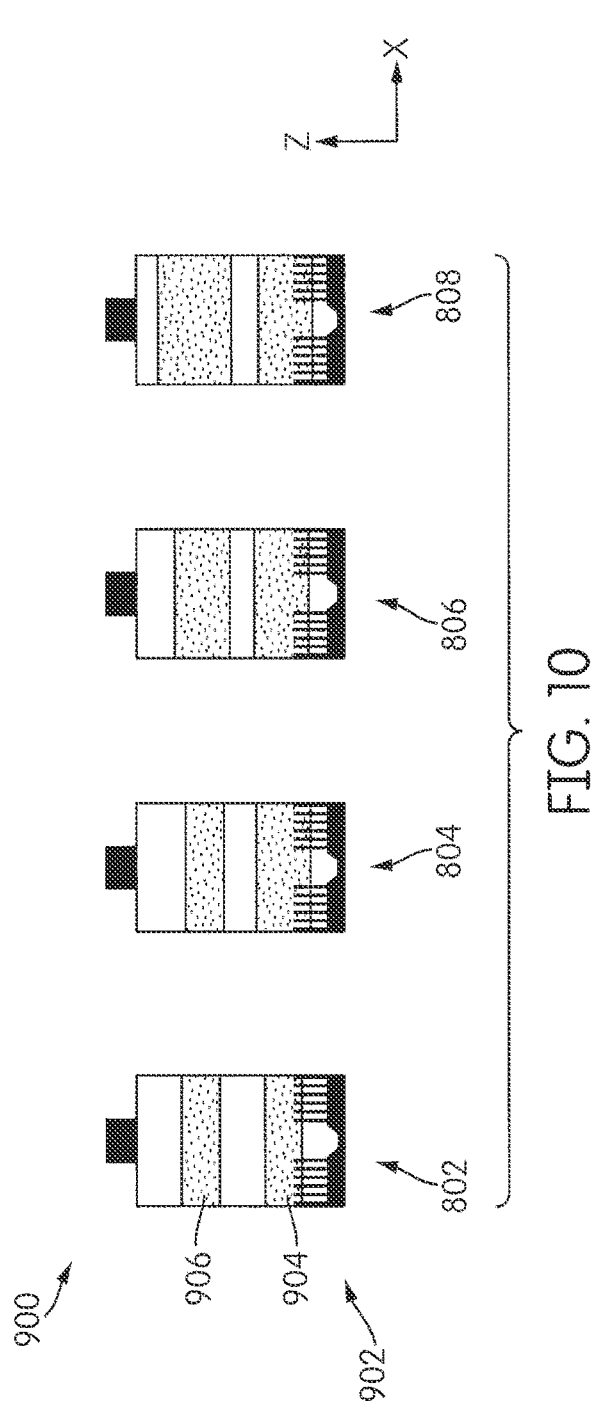
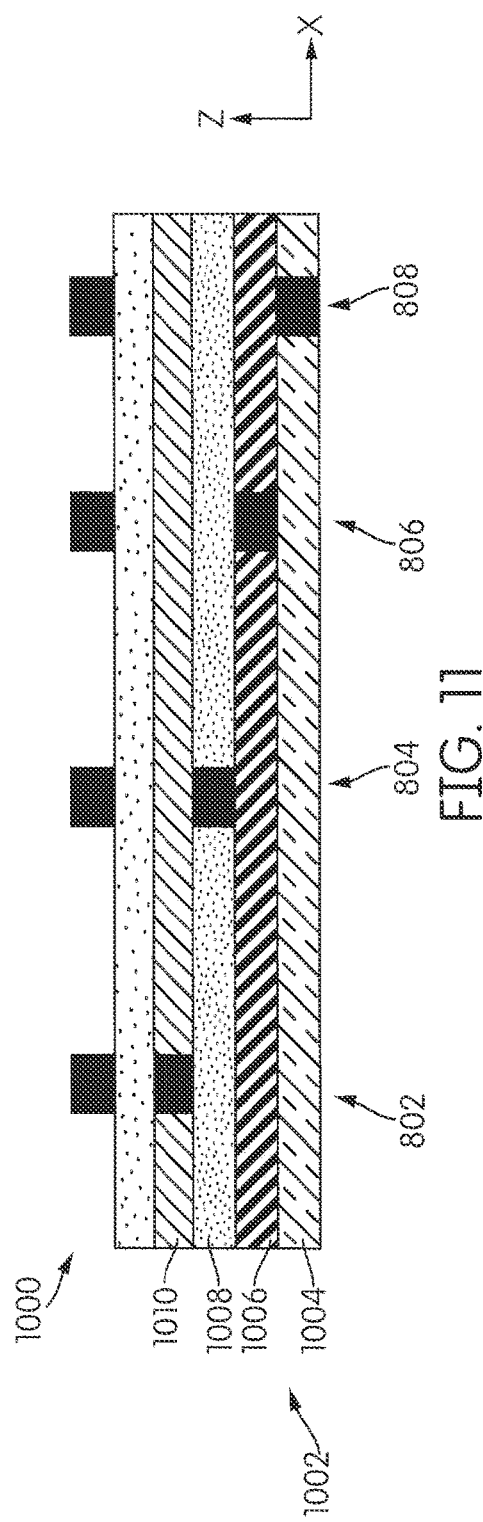

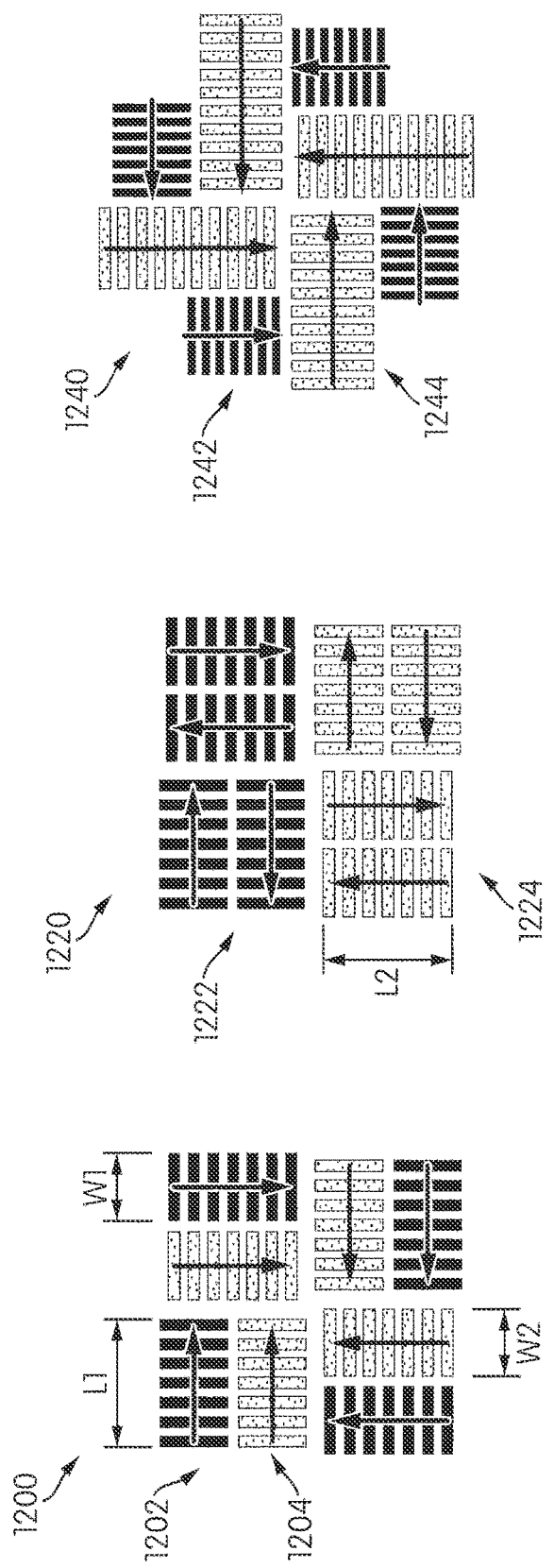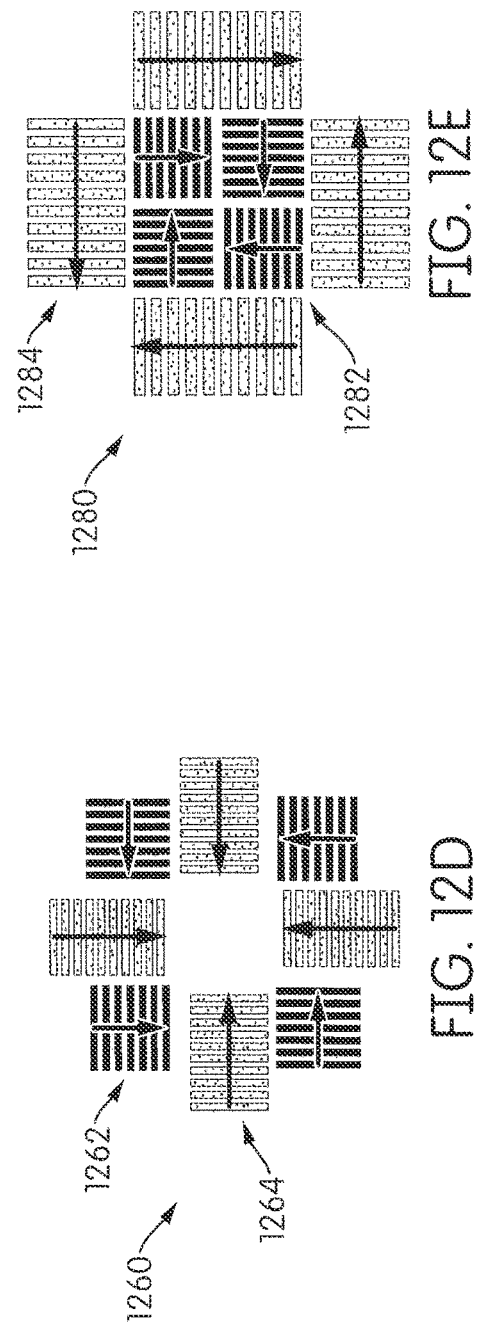
FIG. 12A
FIG. 12B
FIG. 12C
FIG. 12D
FIG. 12E

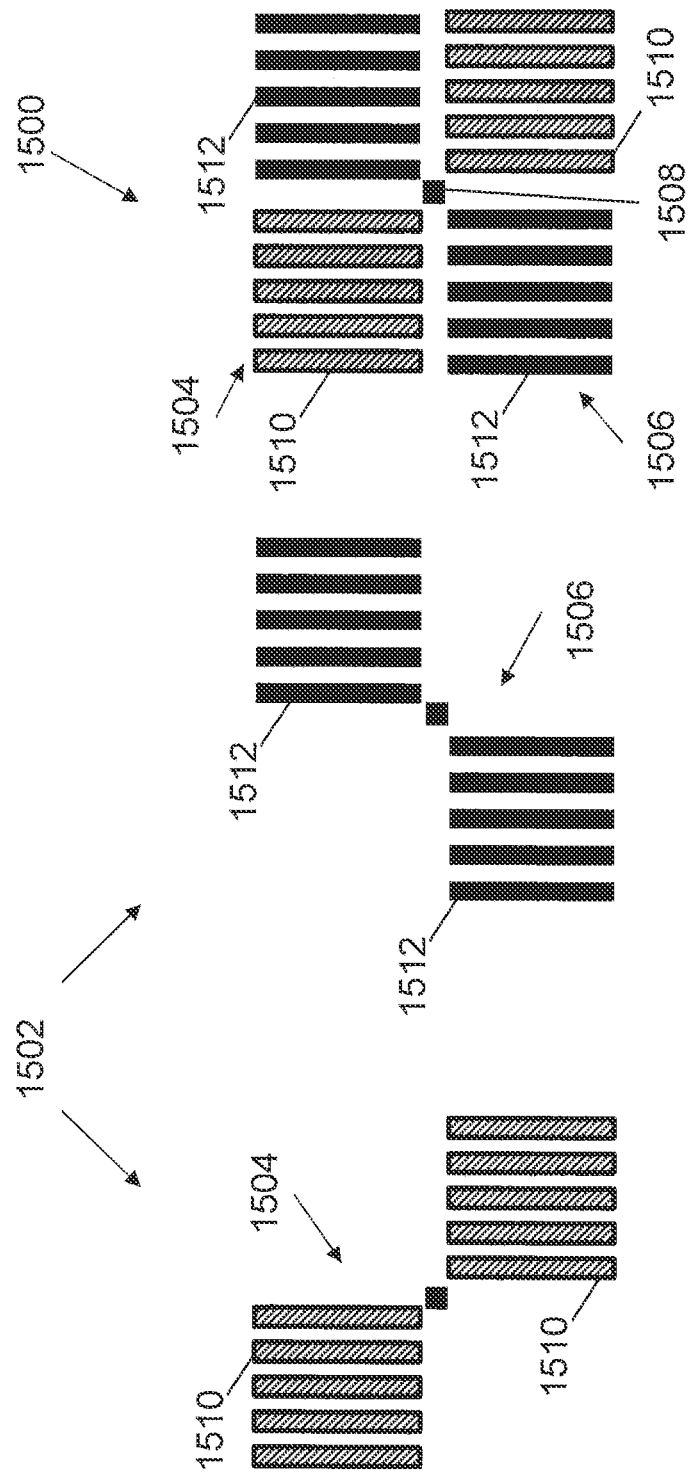

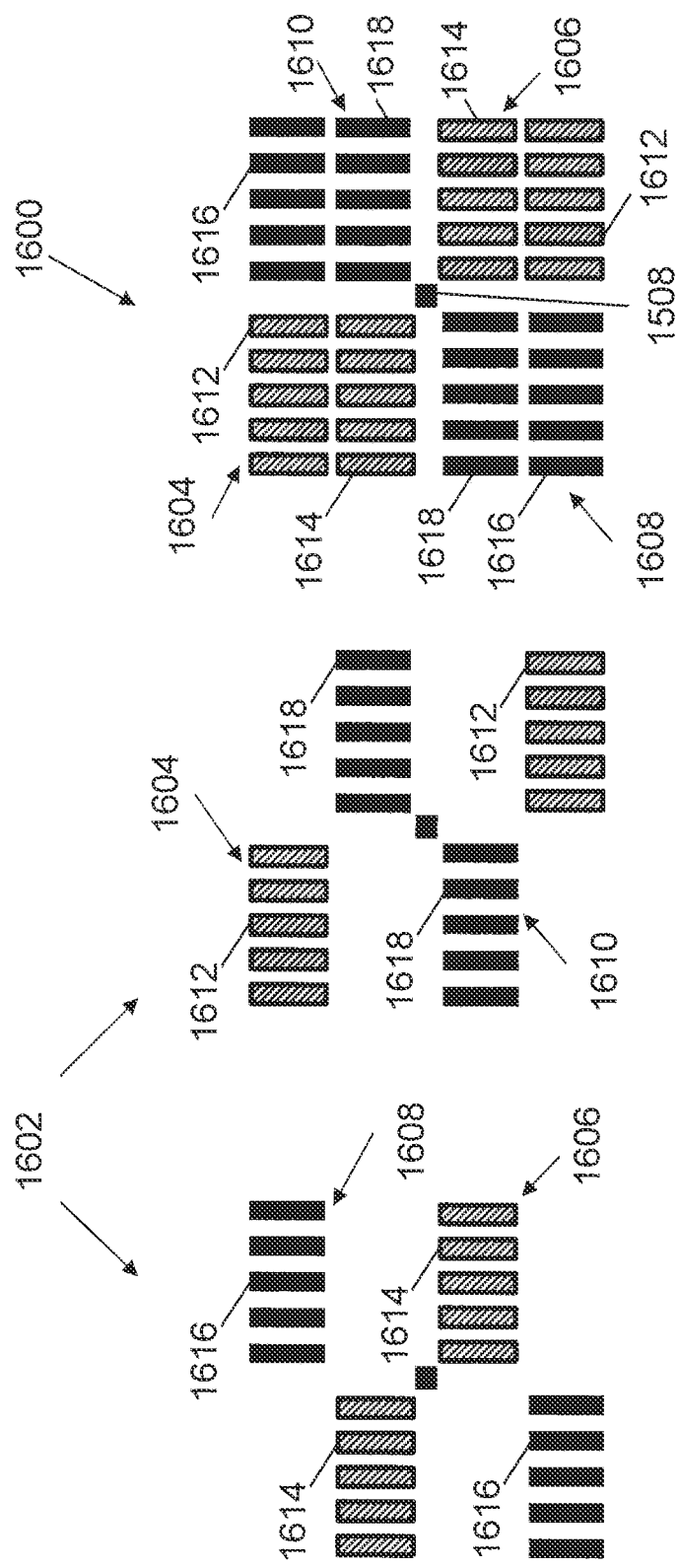

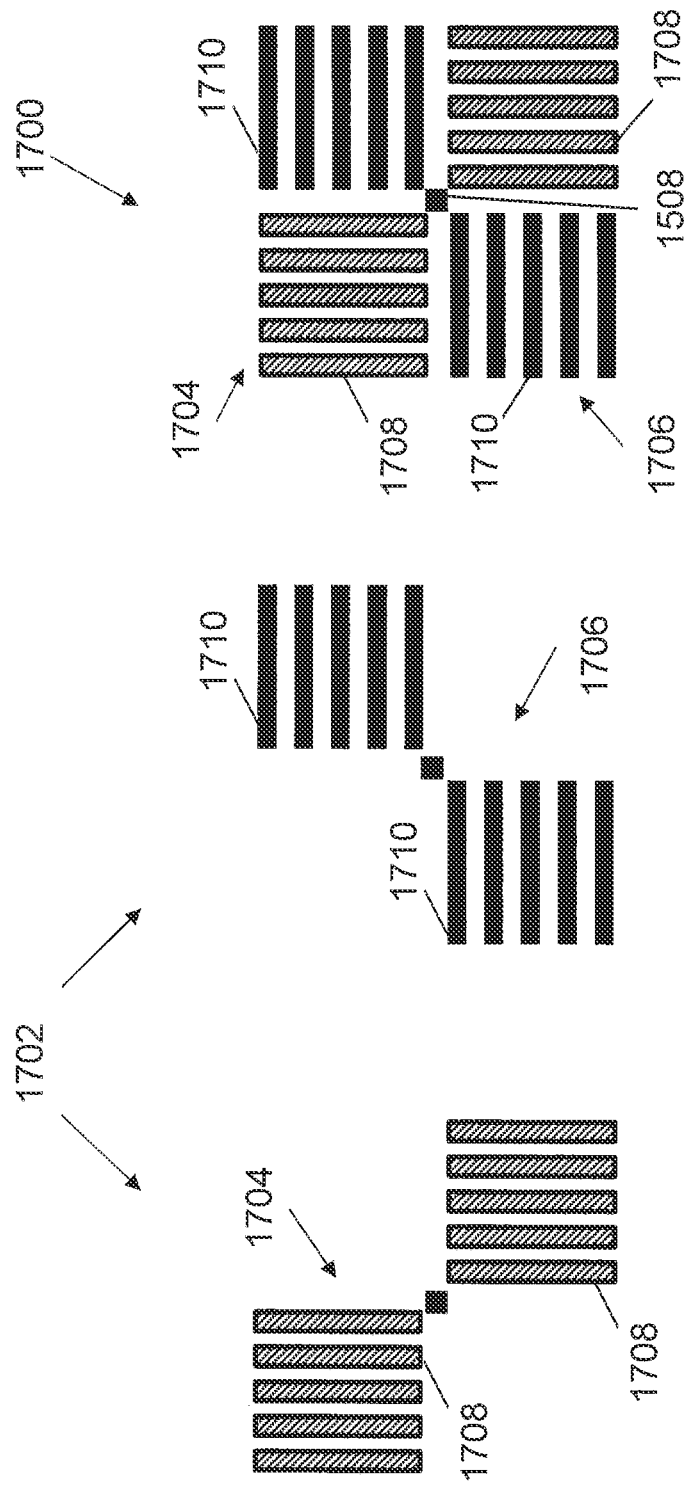

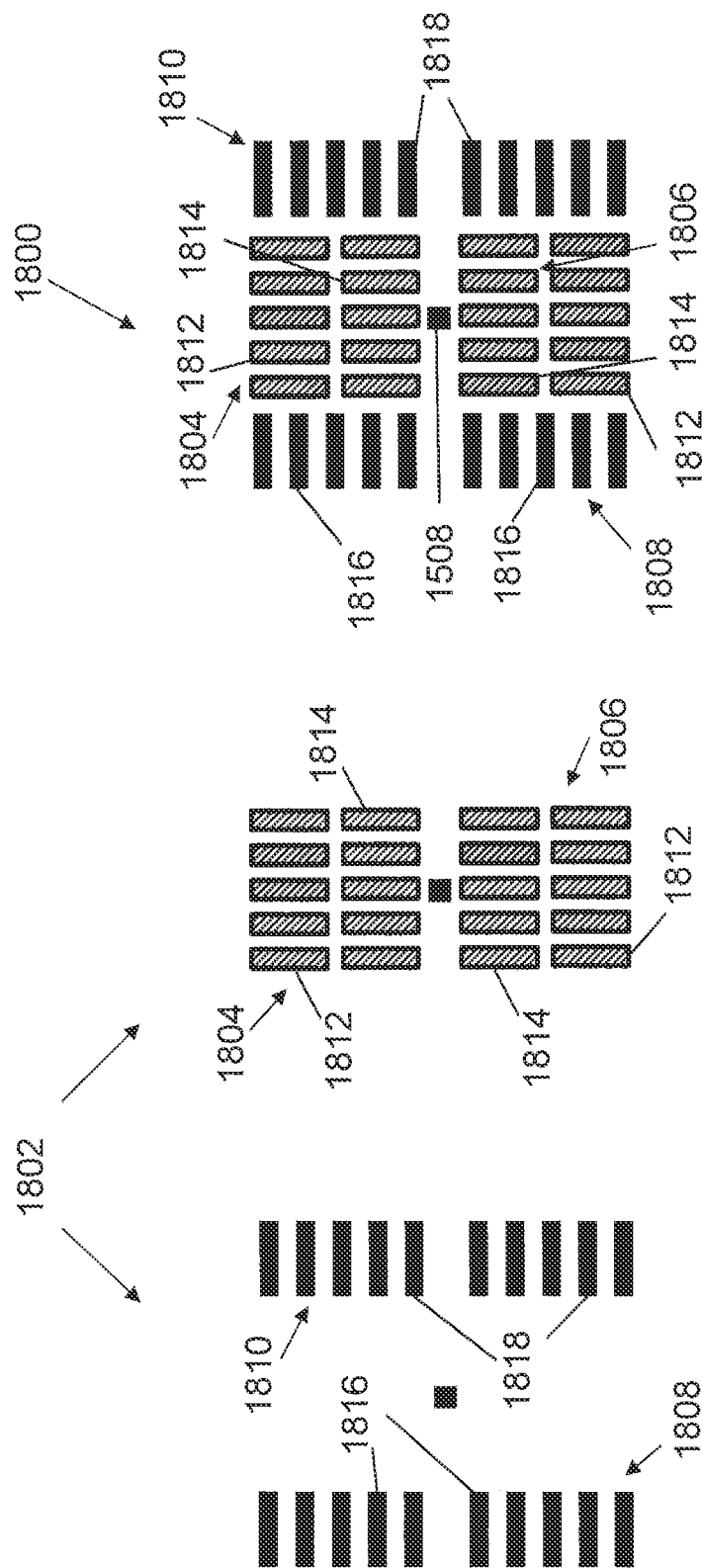

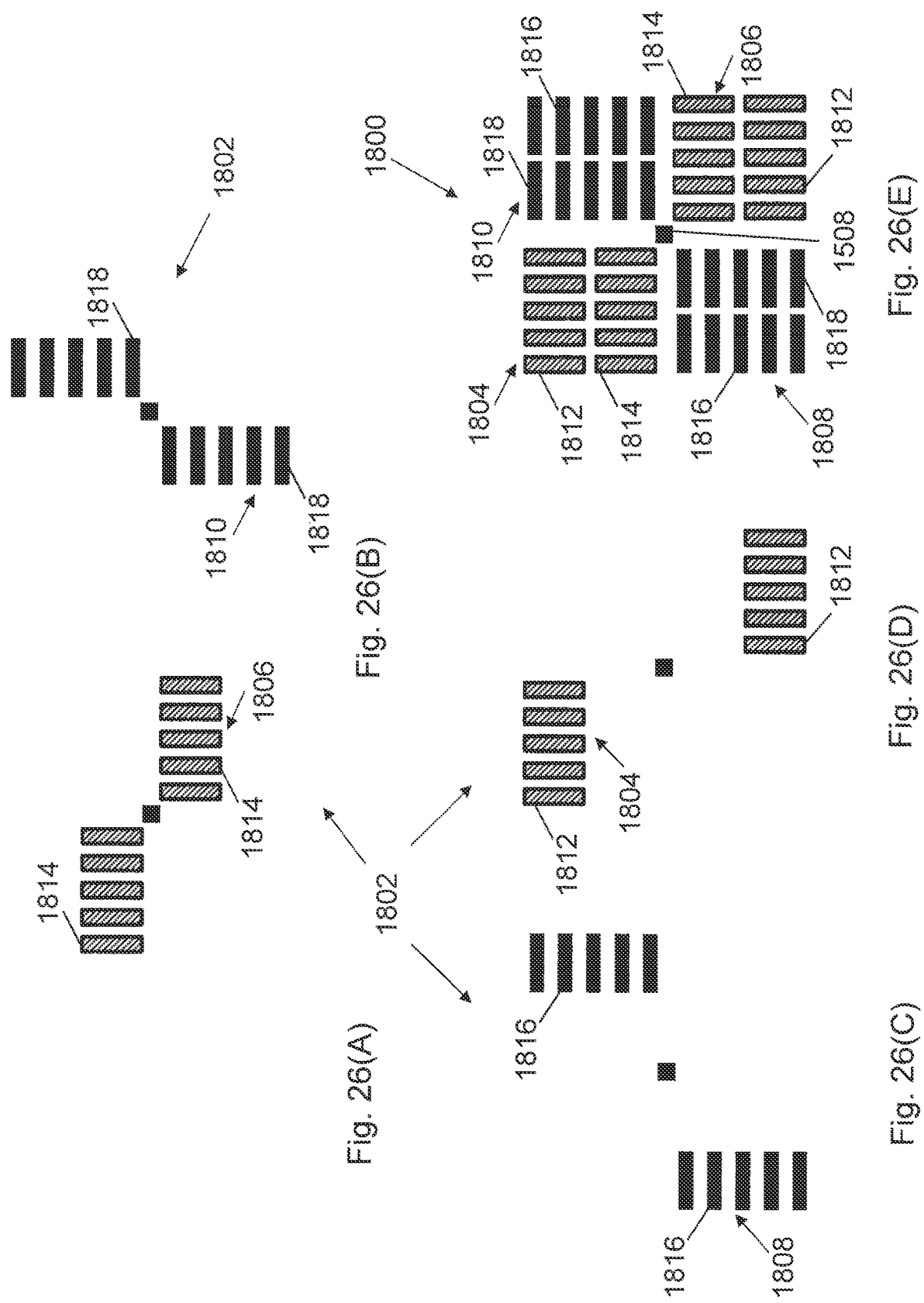

METROLOGY METHOD, TARGET AND SUBSTRATE

This application is a continuation of U.S. patent application Ser. No. 16/931,832, filed on Jul. 17, 2020, now allowed, which is a continuation of U.S. patent application Ser. No. 16/507,297, filed on Jul. 10, 2019, now U.S. Pat. No. 10,718,604, which is a continuation of U.S. patent application Ser. No. 14/835,504, filed on Aug. 25, 2015, now U.S. Pat. No. 10,386,176, which claims priority under 35 U.S.C. § 119(e) to U.S. Provisional Patent Application No. 62/090,801, filed on Dec. 11, 2014, and to U.S. Provisional Patent Application No. 62/170,008, filed on Jun. 2, 2015, and priority under 35 U.S.C. § 119(a) to European Patent Application No. 14182962.2, filed on Aug. 29, 2014. The entire contents of each of the foregoing applications is incorporated herein in by reference.

FIELD

The present disclosure relates to a method, apparatus, and substrate for metrology usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, one or more parameters of the patterned substrate are measured. Parameters may include, for example, the overlay error between successive layers formed in or on the patterned substrate and critical linewidth of developed photosensitive resist. This measurement may be performed on a target surface of a product substrate and/or in the form of a dedicated metrology target. Metrology targets (or marks) may comprise, for example, combinations of horizontal and vertical bars, forming for example periodic structures such as gratings.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

SUMMARY

It is desirable to provide a method and apparatus for metrology using a target, in which throughput, flexibility and/or accuracy can be improved. Furthermore, although not limited to this, it would be of great advantage, if this could be applied to small target structures that can be read out with a dark-field image-based technique.

In an embodiment, there is provided a method of measuring a parameter of a lithographic process, the method comprising: illuminating a diffraction measurement target on a substrate with radiation, the measurement target comprising at least a first sub-target and at least a second sub-target, wherein the first and second sub-targets each comprise a pair of periodic structures and wherein the first sub-target has a different design than the second sub-target, the different design comprising the first sub-target periodic structures having a different pitch, feature width, space width, and/or segmentation than the second sub-target periodic structures; and detecting radiation scattered by at least the first and second sub-targets to obtain for that target a measurement representing the parameter of the lithographic process.

In an embodiment, there is provided a substrate having a diffraction measurement target, the measurement target comprising at least a first sub-target and at least a second sub-target, wherein the first and second sub-targets each comprise a pair of periodic structures and wherein the first sub-target has a different design than the second sub-target, the different design comprising the first sub-target periodic structures having a different pitch, feature width, space width, and/or segmentation than the second sub-target periodic structures.

In an embodiment, there is provided a method of measuring a parameter of a lithographic process, the method comprising: illuminating a diffraction measurement target on a substrate with radiation, the measurement target comprising at least a first sub-target and at least a second sub-target in a first layer, wherein the first sub-target comprises a first periodic structure and the second sub-target comprises a second periodic structure, wherein a third periodic structure is located at least partly underneath the first periodic structure in a second different layer under the first layer and there being no periodic structure underneath the second periodic structure in the second layer, and wherein a fourth periodic structure is located at least partly underneath the second periodic structure in a third different layer under the second layer; and detecting radiation scattered by at least the first through fourth periodic structures to obtain for that target a measurement representing the parameter of the lithographic process.

In an embodiment, there is provided a substrate having a diffraction measurement target, the measurement target comprising at least a first sub-target and at least a second sub-target, wherein the first sub-target comprises a first periodic structure and the second sub-target comprises a second periodic structure, wherein a third periodic structure is located at least partly underneath the first periodic structure in a second different layer under the first layer and there being no periodic structure underneath the second periodic structure in the second layer, and wherein a fourth periodic structure is located at least partly underneath the second periodic structure in a third different layer under the second layer.

In an embodiment, there is provided a method of measuring a parameter of a lithographic process, the method comprising: illuminating a diffraction measurement target on a substrate with radiation, the measurement target comprising at least a first sub-target and at least a second sub-target, wherein the first and second sub-targets each comprise a first pair of periodic structures having features extending in a first direction and a second pair of periodic structures having features extending in a second different direction, and wherein the first sub-target has a different design than the second sub-target; and detecting radiation scattered by at least the first and second sub-targets to obtain for that target a measurement representing the parameter of the lithographic process.

In an embodiment, there is provided a substrate having a diffraction measurement target, the measurement target comprising at least a first sub-target and at least a second sub-target, wherein the first and second sub-targets each comprise a first pair of periodic structures having features extending in a first direction and a second pair of periodic structures having features extending in a second different direction, and wherein the first sub-target has a different design than the second sub-target.

In an embodiment, there is provided a method of measuring a parameter of a lithographic process, the method comprising: illuminating a diffraction measurement target on a substrate with radiation, the measurement target comprising at least a first sub-target and at least a second sub-target, wherein the first and second sub-targets each comprise a first pair of periodic structures having features extending in a first direction and a second pair of periodic structures having features extending in a second different direction, and wherein at least part of each of the periodic structures of the first and second sub-targets is within a contiguous area of less than or equal to 1000 µm² on the substrate; and detecting radiation scattered by at least the first and second sub-targets to obtain for that target a measurement representing the parameter of the lithographic process.

In an embodiment, there is provided a substrate having a diffraction measurement target, the measurement target comprising at least a first sub-target and at least a second sub-target, wherein the first and second sub-targets each comprise a first pair of periodic structures having features extending in a first direction and a second pair of periodic structures having features extending in a second different direction, and wherein at least part of each of the periodic structures of the first and second sub-targets is within a contiguous area of less than or equal to 1000 µm² on the substrate.

In an embodiment, there is provided a method of metrology target design, the method comprising: receiving an indication for the design of a diffractive metrology target having a plurality of sub-targets, each sub-target comprising a first pair of periodic structures having features extending in a first direction and a second pair of periodic structures having features extending in a second different direction; receiving a constraint on the area, a dimension, or both, of the diffractive metrology target; and selecting, by a processor, a design of the diffractive metrology target based at least on the constraint.

In an embodiment, there is provided a diffraction measurement target comprising at least a first sub-target and at least a second sub-target, wherein the first and second sub-targets each comprise a pair of periodic structures and wherein the first sub-target has a different design than the second sub-target, the different design comprising the first sub-target periodic structures having a different pitch, feature width, space width, and/or segmentation than the second sub-target periodic structures.

In an embodiment, there is provided a diffraction measurement target comprising at least a first sub-target and at least a second sub-target that, when on a substrate, are in a first layer, wherein the first sub-target comprises a first periodic structure and the second sub-target comprises a second periodic structure, and comprising a third periodic structure, when on the substrate, located at least partly underneath the first periodic structure in a second different layer under the first layer and there being no periodic structure underneath the second periodic structure in the second layer, and comprising a fourth periodic structure, when on the substrate, located at least partly underneath the second periodic structure in a third different layer under the second layer.

In an embodiment, there is provided a diffraction measurement target comprising at least a first sub-target and at least a second sub-target, wherein the first and second sub-targets each comprise a first pair of periodic structures having features extending in a first direction and a second pair of periodic structures having features extending in a second different direction, and wherein the first sub-target has a different design than the second sub-target.

In an embodiment, there is provided a diffraction measurement target comprising at least a first sub-target and at least a second sub-target, wherein the first and second sub-targets each comprise a first pair of periodic structures having features extending in a first direction and a second pair of periodic structures having features extending in a second different direction, and wherein at least part of each of the periodic structures of the first and second sub-targets is within a contiguous area of less than or equal to 1000 µm² on a substrate.

In an embodiment, there is provided a method comprising: illuminating with radiation a diffraction measurement target on a substrate, the measurement target comprising at least a first sub-target, a second sub-target and a third sub-target, wherein the first, second and third sub-targets are different in design.

In an embodiment, there is provided a diffraction metrology target comprising at least a first sub-target, a second sub-target and a third sub-target, wherein the first, second and third sub-targets are different in design.

In an embodiment, there is provided a method comprising measuring overlay between two layers, the method comprising: illuminating with radiation a diffraction measurement target on a substrate having a portion of the target on each of the two layers, wherein the two layers are separated by at least one other layer.

In an embodiment, there is provided a method of devising a measurement target, having a plurality of sub-targets, involving locating an assist feature at a periphery of the sub-targets, the assist feature being configured to reduce measured intensity peaks at the periphery of the sub-targets. Thus, in an embodiment, there is provided a method of devising an arrangement of a diffraction measurement target, the target comprising a plurality of sub-targets, each sub-target comprising a plurality of periodic structures and each sub-target designed to measure a different layer-pair or to measure for a different process stack, the method comprising: locating the periodic structures of the sub-targets within a target area; and locating an assist feature at a periphery of the sub-targets, the assist feature configured to reduce a measured intensity peak at the periphery of the sub-targets.

In an embodiment, there is provided a diffraction measurement target comprising: a plurality of sub-targets in a target area of the target, each sub-target comprising a plurality of periodic structures and each sub-target designed to measure a different layer-pair or to measure for a different process stack; and an assist feature at the periphery of the sub-targets, the assist feature configured to reduce a measured intensity peak at the periphery of the sub-targets.

In an embodiment, there is provided a method of manufacturing devices wherein a device pattern is applied to a series of substrates using a lithographic process, the method including inspecting at least a diffraction measurement target formed as part of or beside the device pattern on at least one of the substrates using a method as described herein and controlling the lithographic process for later substrates in accordance with the result of the method.

In an embodiment, there is provided a patterning device configured to at least in part form a diffraction measurement target as described herein.

In an embodiment, there is provided a non-transitory computer program product comprising machine-readable instructions for causing a processor to cause performance of a method as described herein.

In an embodiment, there is provided a non-transitory computer program product comprising machine-readable instructions for causing a processor to cause performance of a method as described herein.

In an embodiment, there is provided a non-transitory computer program product comprising machine-readable instructions or data defining a target as described herein.

In an embodiment, there is provided a substrate comprising a target as described herein.

In an embodiment, there is provided a system comprising: an inspection apparatus configured to provide a beam on a diffraction measurement target on a substrate and to detect radiation diffracted by the target to determine a parameter of a lithographic process; and a non-transitory computer program product as described herein.

Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which.

FIG. 6 is a flowchart showing the steps of an overlay measurement method using the apparatus of FIG. 3 and adaptable to embodiments of the present invention;

FIGS. 7(a) to 7(c) show schematic cross-sections of overlay periodic structures having different overlay values in the region of zero;

FIG. 10 illustrates use of an extended operating range metrology target according to an embodiment of the invention to account for process stack variation;

FIG. 11 illustrates use of an extended operating range metrology target according to an embodiment of the invention for multiple layer overlay measurement;

FIGS. 12A-E illustrate variations of an extended operating range metrology target according to an embodiment of the invention;

FIGS. 22(A)-(C) illustrate an extended operating range metrology target according to an embodiment of the invention;

FIGS. 23(A)-(C) illustrate an extended operating range metrology target according to an embodiment of the invention;

FIGS. 24(A)-(C) illustrate an extended operating range metrology target according to an embodiment of the invention;

FIGS. 25(A)-(C) illustrate an extended operating range metrology target according to an embodiment of the invention; and FIGS. 26(A)-(E) illustrate an extended operating range metrology target according to an embodiment of the invention

DETAILED DESCRIPTION OF EXEMPLARY EMBODIMENTS

Before describing embodiments in detail, it is instructive to present an example environment in which embodiments may be implemented.

Figure 1:
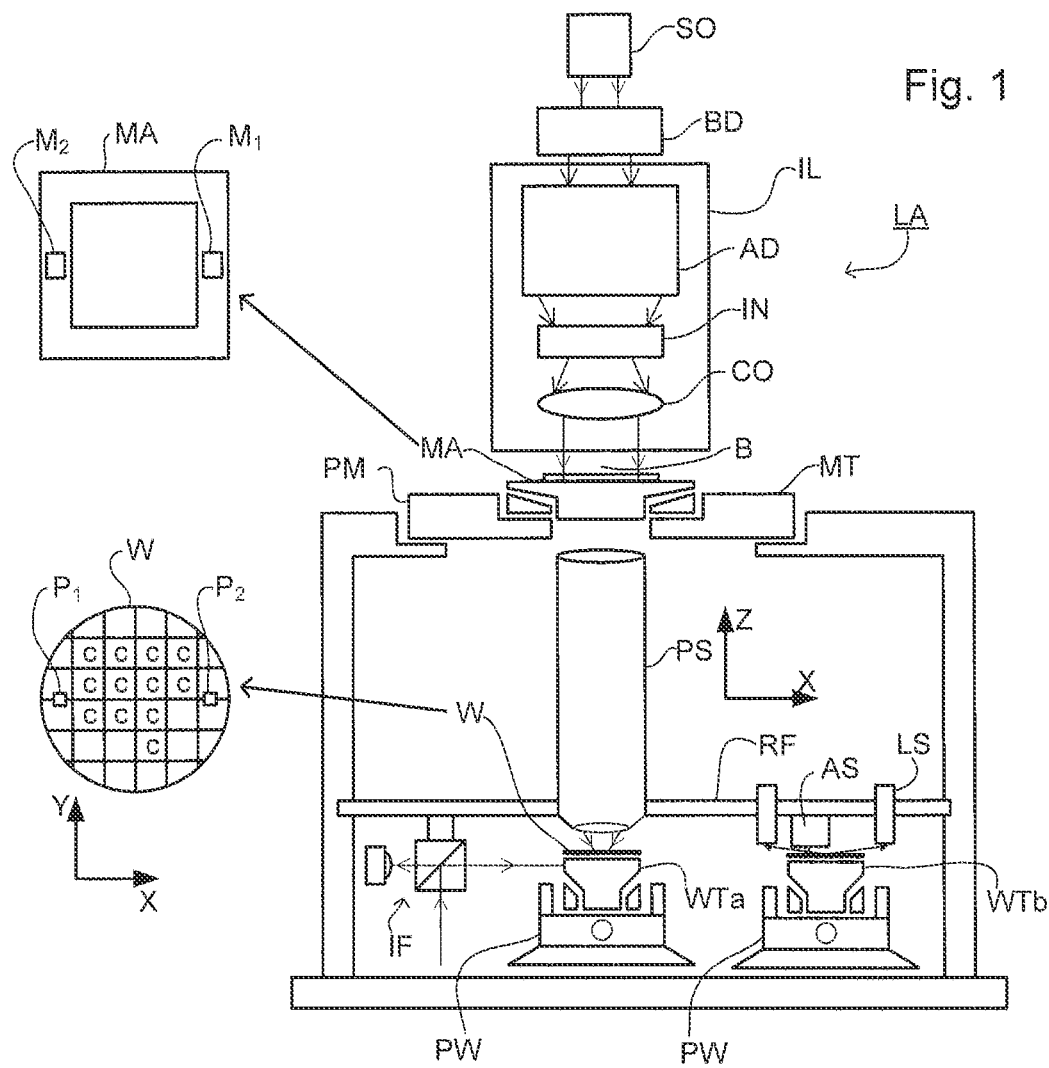
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has at least two tables WTa, WTb (e.g., two substrate tables) and at least two stations—an exposure station and a measurement station—between which at least one of the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
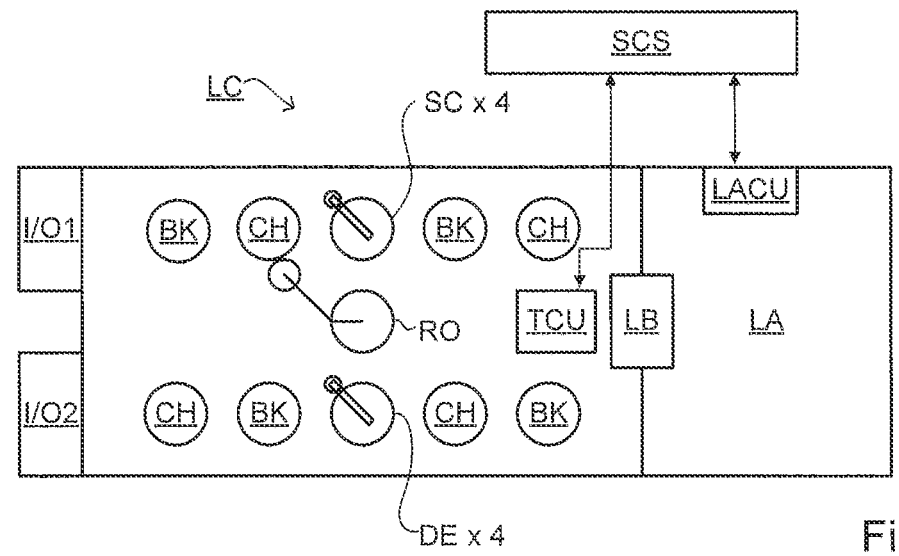
FIG. 2 depicts a lithographic cell or cluster according to an embodiment of the invention.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same lot/batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measures one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure (e.g., grating) layout, e.g., 40 µm by 40 µm. In that case, the measurement beam often has a spot size that is smaller than the periodic structure layout (i.e., the periodic structure layout is underfilled). This simplifies mathematical reconstruction of the target as it can be regarded as infinite. However, for example, so the target can be positioned in among product features, rather than in the scribe lane, the size of a target has been reduced, e.g., to 20 µm by 20 µm or less, or to 10 µm by 10 µm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

A dark field metrology apparatus suitable for use in embodiments of the invention is shown in FIG. 3(*a*). A target T (comprising a periodic structure) and diffracted rays are illustrated in more detail in FIG. 3(*b*). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from a different (e.g., opposite) direction, labeled 'south'. Other modes of illumination are possible by using different apertures. The rest of the pupil plane is desirably dark as any unnecessary radiation outside the desired illumination mode may interfere with the desired measurement signals.

As shown in FIG. 3(*b*), target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Where a composite periodic structure target is provided, each individual periodic structure within the target will give rise to its own diffraction spectrum. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3(*a*) and 3(*b*) are shown somewhat off axis, purely to enable them to be more easily distinguished in the diagram.

At least the 0 and +1 orders diffracted by the target on substrate W are collected by objective lens 16 and directed back through prism 15. Returning to FIG. 3(*a*), both the first and second illumination modes are illustrated, by designating diametrically opposite (in this case) apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1$^{st}$ and the +1$^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for asymmetry measurement as well as for many measurement purposes such as reconstruction, which are not described in detail here. The first examples to be described will use the second measurement branch to measure asymmetry.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the features of a periodic structure of the target as such will not be formed, if only one of the −1 and +1 orders is present.

The particular forms of aperture plate 13 and stop 21 shown in FIG. 3 are purely examples. In another embodiment, on-axis illumination of the targets is used and an aperture stop with an off-axis aperture is used to pass substantially only one first order of diffracted radiation to the sensor (the apertures shown at 13 and 21 are effectively swapped in that case). In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the aperture stop 21, or by substituting a pupil-stop having a different pattern, or by replacing the fixed field stop with a programmable spatial light modulator. In that case the illumination side of the measurement optical system can remain constant, while it is the imaging side that has first and second modes. In practice, there are many possible types of measurement method, each with its own advantages and disadvantages. In one method, the illumination mode is changed to measure the different orders. In another method, the imaging mode is changed. In a third method, the illumination and imaging modes remain unchanged, but the target is rotated through, e.g., 180 degrees. In each case the desired effect is the same, namely to select first and second portions of the non-zero order diffracted radiation which are, e.g., symmetrically opposite one another in the diffraction spectrum of the target.

While the optical system used for imaging in the present examples has a wide entrance pupil which is restricted by the aperture stop 21, in other embodiments or applications the entrance pupil size of the imaging system itself may be small enough to restrict to the desired order, and thus serve also as the field stop. Different aperture plates are shown in FIGS. 3(*c*) and (*d*) which can be used as described further below.

Typically, a target will be aligned with its periodic structure features running either north-south or east-west. That is to say, a periodic structure (e.g., grating) will be aligned in the X direction or the Y direction of the substrate W. But, it may be angled at a different angle, i.e., at 45°. Aperture plate 13N or 13S is used to measure a periodic structure of a target oriented in one direction (e.g., X, Y or other direction depending on the set-up). For measurement of a periodic structure at another angle (e.g., substantially orthogonal), rotation of the target might be implemented (e.g., rotation through 90° and 270° for substantially orthogonal periodic structures). Or, illumination from another angle (e.g., east or west) may be provided in the illumination optics, using the aperture plate 13E or 13W, shown in FIG. 3(*c*), which may have the apertures at the appropriate angle (e.g., east or west). The aperture plates 13N to 13W can be separately formed and interchanged, or they may be a single aperture plate which can be rotated by appropriate angle (e.g., 90, 180 or 270 degrees).

Different aperture plates are shown in FIGS. 3(*c*) and (*d*). FIG. 3(*c*) illustrates two further types of off-axis illumination mode. In a first illumination mode of FIG. 3(*c*), aperture plate 13E provides off-axis illumination from a direction designated, for the sake of description only, as 'east' relative to the 'north' previously described. As noted above, the 'east' may be at a different angle than as shown. In a second illumination mode of FIG. 3(*c*), aperture plate 13W is used to provide similar illumination, but from a different (e.g., opposite) direction, labeled 'west'. FIG. 3(*d*) illustrates two further types of off-axis illumination mode. In a first illumination mode of FIG. 3(*d*), aperture plate 13NW provides off-axis illumination from the directions designated 'north' and 'west' as previously described. In a second illumination mode, aperture plate 13SE is used to provide similar illumination, but from a different (e.g., opposite) direction, labeled 'south' and 'east' as previously described. Provided that crosstalk between these different diffraction signals is not too great, measurements of periodic structures extending in different directions (e.g., both X and Y) can be performed without changing the illumination mode. The use of these, and numerous other variations and applications of the apparatus are described in, for example, the prior published patent application publications mentioned above. As mentioned already, the off-axis apertures illustrated in FIGS. 3(*c*)

and (d) could be provided in the aperture stop 21 instead of in aperture plate 13. In that case, the illumination would be on axis.

Figure 4:
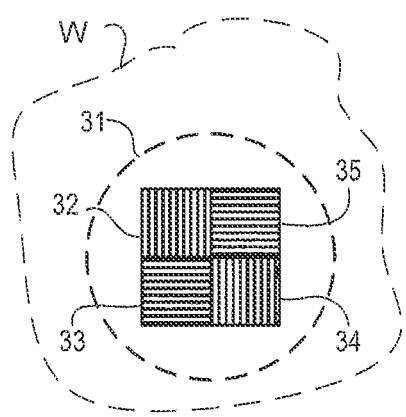
FIG. 4 depicts a form of multiple periodic structure (e.g., grating) target and an outline of a measurement spot on a substrate.

FIG. 4 depicts an example composite metrology target formed on a substrate. The composite target comprises four periodic structures (e.g., gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures formed by overlying periodic structures of another target that is patterned in a different layer of the device formed on substrate W. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the overlay bias facilitates distinguishing between the layer-pairs. The meaning of overlay bias will be explained below, particularly with reference to FIG. 7.

FIGS. 7(a)-(c) show schematic cross sections of overlay periodic structures of respective targets T, with different biases. These can be used on substrate W, as seen in FIGS. 3 and 4. Periodic structures with periodicity in the X direction are shown for the sake of example only. Different combinations of these periodic structures with different biases and with different orientations can be provided.

Starting with FIG. 7(a), a composite overlay target 600 formed in two layers, labeled L1 and L2, is depicted. In the lower layer L1, a first periodic structure is formed by features (e.g., lines) 602 and spaces 604 on a substrate 606. In layer L2, a second periodic structure is formed by features (e.g., lines) 608 and spaces 610. (The cross-section is drawn such that the features 602, 608 extend into the page.) The periodic structure pattern repeats with a pitch P in both layers. Lines 602 and 608 are mentioned for the sake of example only, other types of features such as dots, blocks and via holes can be used. In the situation shown at FIG. 7(a), there is no overlay error and no bias, so that each periodic structure feature 608 lies exactly over a periodic structure feature 602 in the lower periodic structure.

At FIG. 7(b), the same target with a bias +d is depicted such that the features 608 of the upper periodic structure are shifted by a distance d to the right, relative to the features 602 of the lower periodic structure. That is, features 608 and features 602 are arranged so that if they were both printed exactly at their nominal locations, features 608 would be offset relative to the features 602 by the distance d. The bias distance d might be a few nanometers in practice, for example 5-60 nm, while the pitch P is for example in the range 300-1000 nm, for example 500 nm or 600 nm. At FIG. 7(c), the same target with a bias −d is depicted such that the features 608 are shifted to the left relative to the features 602. Biased targets of this type shown at FIGS. 7(a) to (c) are described in, for example, the patent application publications mentioned above.

Further, while FIGS. 7(a)-(c) depicts the features 608 lying over the features 602 (with or without a small bias of +d or −d applied), which is referred to as a "line on line" target having a bias in the region of zero, a target may have a programmed bias of P/2, that is half the pitch, such that each feature 608 in the upper periodic structure lies over a space 604 in the lower periodic structure. This is referred to as a "line on trench" target. In this case, a small bias of +d or −d may also be applied. The choice between "line on line" target or a "line on trench" target depends on the application.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in the image captured by sensor 23.

Figure 3A:
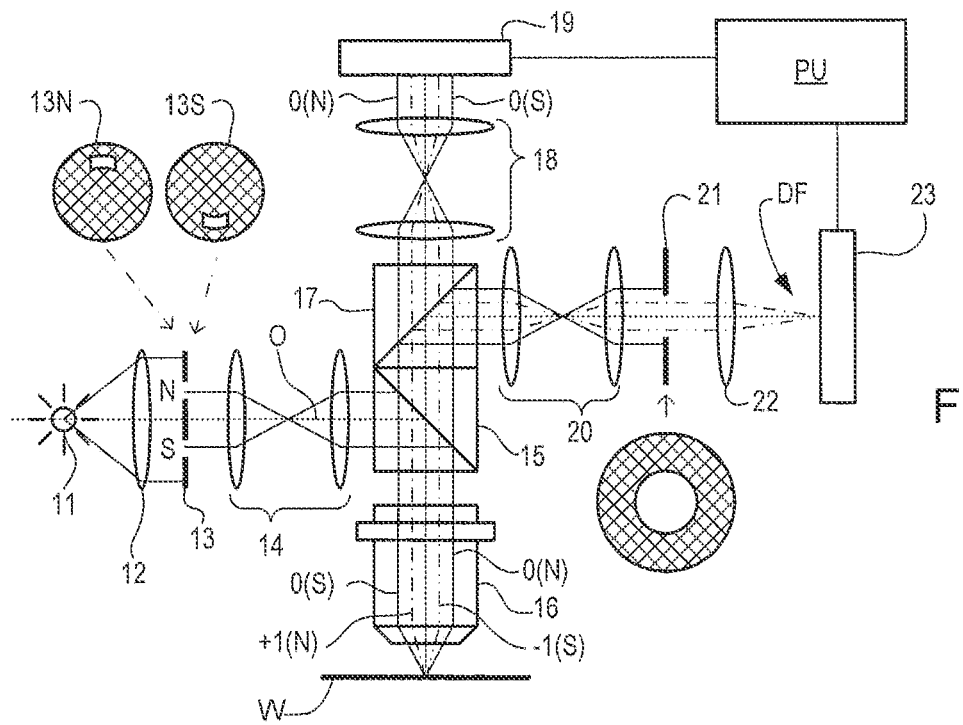
FIG. 3(a) is schematic diagram of a dark field scatterometer for use in measuring targets according to embodiments of the invention using a first pair of illumination apertures providing certain illumination modes.
Figure 3B:
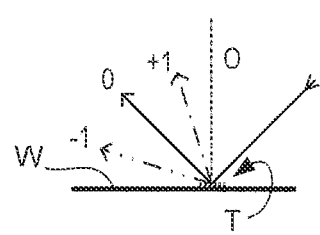
FIG. 3(b) is a schematic detail of a diffraction spectrum of a target periodic structure for a given direction of illumination.
Figure 3C:
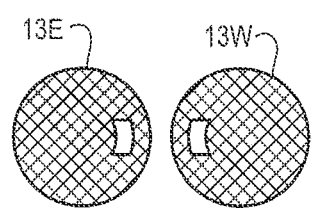
FIG. 3(c) is a schematic illustration of a second pair of illumination apertures providing further illumination modes in using a scatterometer for diffraction based overlay measurements.
Figure 3D:
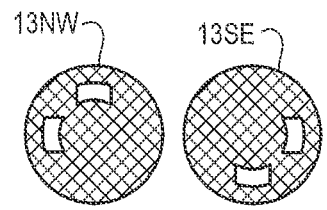
FIG. 3(d) is a schematic illustration of a third pair of illumination apertures combining the first and second pairs of apertures providing further illumination modes in using a scatterometer for diffraction based overlay measurements.
Figure 5:
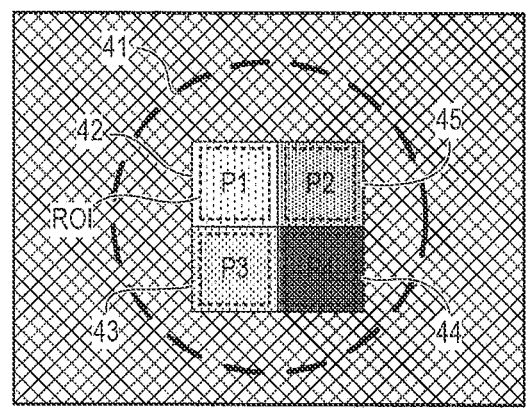
FIG. 5 depicts an image of the target of FIG. 4 obtained in the apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the sensor 19 cannot resolve the different individual periodic structures 32 to 35, the sensor 23 can do so. The cross-hatched rectangle represents the field of the image on the sensor, within which the illuminated spot 31 on the substrate is imaged into a corresponding circular area 41. In an embodiment, the field is dark. Within this image, rectangular areas 42-45 represent the images of the periodic structures 32 to 35. If the periodic structures are located in product areas, product features may also be visible in the periphery of this image field. While only a single composite grating target is shown in the dark field image of FIG. 5, in practice a product made by lithography may have many layers, and overlay measurements are desired to be made between different pairs of layers. For each overlay measurement between pair of layers, one or more composite grating targets are used, and therefore other composite targets may be present within the image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter. For example, comparing the intensities reveals asymmetries that can be used as a measure of overlay. In another technique for measuring asymmetry and hence overlay, the sensor 19 is used.

FIG. 6 illustrates how, using for example the method described in PCT patent application publication no. WO 2011/012624 and U.S. patent application publication no.

2011/027704 and using for example the apparatus of FIGS. 3 and 4, overlay error between the two layers containing the component periodic structures 32 to 35 is measured through asymmetry of the periodic structures, as revealed by comparing their intensities in the +1 order and −1 order dark field images.

At step M1, the substrate, for example a semiconductor wafer, is processed through the lithographic cell of FIG. 2 one or more times, to create a structure including the target comprising periodic structures 32-35 that form a metrology target. At M2, using the metrology apparatus of FIG. 3, an image of the periodic structures 32 to 35 is obtained using one of the first order diffracted beams (say −1). In an embodiment, a first illumination mode (e.g., the illumination mode created using aperture plate 13NW) is used. Then, whether by changing the illumination mode, or changing the imaging mode, or by rotating substrate W by 180° in the field of view of the metrology apparatus, a second image of the periodic structures using the other first order diffracted beam (+1) can be obtained (step M3). Consequently, the +1 diffracted radiation is captured in the second image. In an embodiment, the illuminated mode is changed and a second illumination mode (e.g., the illumination mode created using aperture plate 13SE) is used. It is a matter of design choice whether all the periodic structures can be captured in each image, or whether there needs to be relative movement between the measurement apparatus and the substrate so as to capture the periodic structures in separate images. In either case, it is assumed that first and second images of all the component periodic structures are captured via sensor 23.

Note that, by including only half of the first order diffracted radiation in each image, the 'images' referred to here are not conventional dark field microscopy images. The individual periodic structure features are not resolved, because only one of the +1 and −1 order diffracted radiation is present. Each periodic structure will be represented simply by an area of a certain intensity level. In step M4, a region of interest (ROI) is identified within the image of each component periodic structure, from which intensity levels will be measured. This is done because, particularly around the edges of the individual grating images, intensity values can be highly dependent on process variables such as resist thickness, composition, line shape, as well as edge effects generally.

Having identified the region of interest P1, P2, P3, P4 for each respective individual periodic structure 32-35 and measured its intensity, the asymmetry of the periodic structure, and hence, e.g., overlay error, can then be determined. This is done by the image processor and controller PU in step M5 comparing the intensity values obtained for +1 and −1 orders for each periodic structure 32-35 to identify any difference in their intensity, i.e., an asymmetry. The term "difference" is not intended to refer only to subtraction. Differences may be calculated in ratio form. Thus, the intensity difference is calculated at step M5 to obtain a measurement of asymmetry for each periodic structure. In step M6 the measured asymmetries for a number of periodic structures are used together with, if applicable, knowledge of the overlay biases of those periodic structures to calculate one or more performance parameters of the lithographic process in the vicinity of the target T. A performance parameter of interest may be overlay. Other parameters of performance of the lithographic process can be calculated such as focus and/or dose. The one or more performance parameters can be fed back for improvement of the lithographic process, and/or used to improve the measurement and calculation process of FIG. 6 itself.

Figure 8:
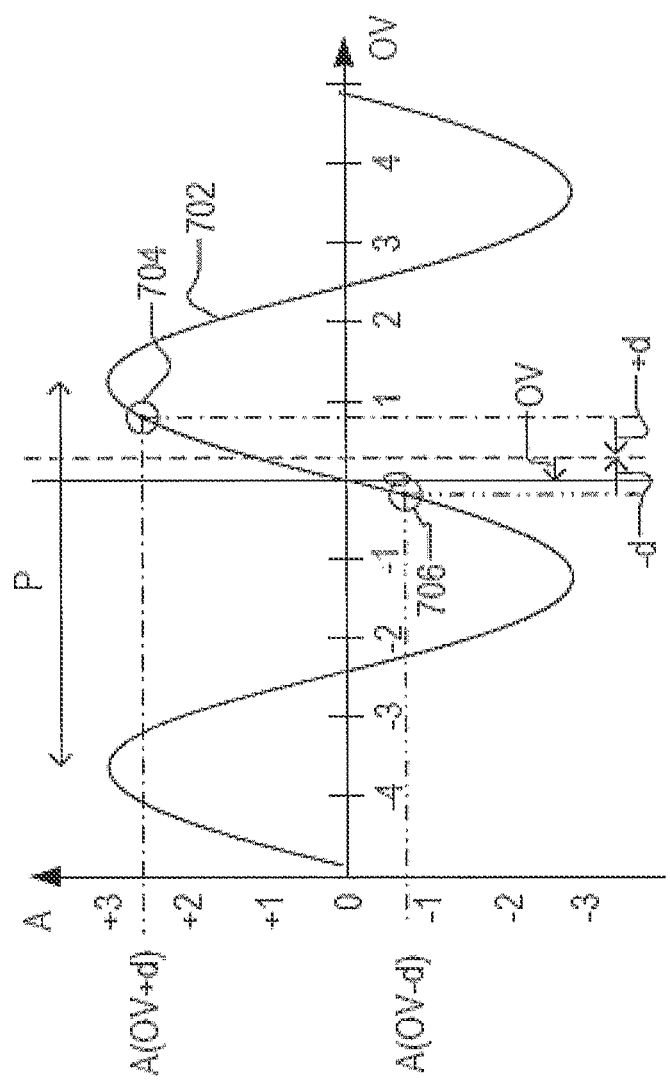
FIG. 8 illustrates principles of overlay measurement in an ideal target structure.

In an embodiment to determine overlay, FIG. 8 depicts a curve 702 that illustrates the relationship between overlay error OV and measured asymmetry A for an 'ideal' target having zero offset and no feature asymmetry within the individual periodic structures forming the overlay periodic structure. This graph is to illustrate the principles of determining the overlay only, and in the graph, the units of measured asymmetry A and overlay error OV are arbitrary.

In the 'ideal' situation of FIGS. 7(a)-(c), the curve 702 indicates that the measured asymmetry A has a sinusoidal relationship with the overlay. The period P of the sinusoidal variation corresponds to the period (pitch) of the periodic structures, converted of course to an appropriate scale. The sinusoidal form is pure in this example, but can include harmonics in real circumstances. For the sake of simplicity, it is assumed in this example (a) that only first order diffracted radiation from the target reaches the image sensor 23 (or its equivalent in a given embodiment), and (b) that the experimental target design is such that within these first orders a pure sine-relation exists between intensity and overlay between top and lower periodic structures results. Whether this is true in practice is a function of the optical system design, the wavelength of the illuminating radiation and the pitch P of the periodic structure, and the design and stack of the target.

As mentioned above, biased periodic structures can be used to measure overlay, rather than relying on a single measurement. This bias has a known value defined in the patterning device (e.g. a reticle) from which it was made, that serves as an on-substrate calibration of the overlay corresponding to the measured signal. In the drawing, the calculation is illustrated graphically. In steps M1-M5 of FIG. 6, asymmetry measurements A(+d) and A(−d) are obtained for component periodic structures having biases +d and −d respectively (as shown in FIGS. 7(b) and 7(c), for example). Fitting these measurements to the sinusoidal curve gives points 704 and 706 as shown. Knowing the biases, the true overlay error OV can be calculated. The pitch P of the sinusoidal curve is known from the design of the target. The vertical scale of the curve 702 is not known to start with, but is an unknown factor which we can call a $1^{st}$ harmonic proportionality constant, $K_1$.

In equation terms, the relationship between overlay and asymmetry is assumed to be:

$$A = K_1 \cdot \sin(OV)$$

where OV is expressed on a scale such that the periodic structure pitch P corresponds to an angle $2\pi$ radians. Using two measurements with periodic structures with different, known biases one can solve two equations to calculate the unknowns $K_1$ and overlay OV.

The metrology target described above is designed for one or more particular layers associated with a particular process stack (i.e., the process stack being the processes and material used to construct a particular device or part thereof for the layer, e.g., the one or material layers involved (e.g., the thickness and/or material type thereof), the lithographic exposure process, the resist development process, the bake process, the etch process, etc.) with the flexibility that the metrology target will provide measurement robustness for nominal changes in the process stack. That is, the metrology target is designed using knowledge of the process layers (e.g., their material, thickness, etc.), the processing steps applied to the layers, etc. to arrive at a metrology target that will give good, if not optimal, measurement results for the parameter of the lithographic process being measured.

However, during lithographic process development, the process stack for a certain layer can change significantly beyond the nominal. An existing target cannot handle a large change in the process stack (i.e., a process change). Thus, multiple targets may be designed to aim for extremes of such changes. This requires a new target design, which means the process development has to wait for a significant period of time before such a new target is, for example, taped-out on the mask; thus, R&D cycle time is increased significantly. Moreover, multiple targets can mean significant costs in creating different patterning devices (e.g., masks) for each different target. Or, the space to accommodate such targets (i.e., available space on the patterning device pattern) may not be available and/or the throughput to measure such multiple targets can be significantly impacted.

Further, a typical diffraction-based overlay target is used to measure overlay between a pair of layers. But, new processes (e.g., multi-patterning processes, via-last processes, etc.) are driving a need to do overlay measurements between not only a single layer-pair but among multiple layer-pairs. Similarly to the process development example discussed above, a solution for multi-layer overlay would be to increase the number of overlay targets (i.e., different targets needed for different layer-pairs) and hence the number of measurements increase (i.e., a measurement for each pair of the multi-layer combinations). This is at a cost of target "real estate" (i.e., available space on the patterning device pattern to accommodate these individual layer-pair targets) and throughput due to the increased measurement times.

So, according to an embodiment of the invention, there is provided a diffraction metrology target comprising a multi-periodic structure target-cluster (a single cluster of periodic structures) that is small in total size, but includes a set of multi-design periodic structures; for convenience of reference, this target is referred to as an extended operating range metrology target. So, for, e.g., process development, a sub-set of periodic structures from the extended operating range metrology target can be used for a certain process stack condition while another sub-set(s) of periodic structures from the extended operating range metrology target can be used for another process stack condition thus being able to account for significant variations in the process stack. Alternatively or additionally, for, e.g., multi-layer overlay, a sub-set of periodic structures from the extended operating range metrology target can be used for a certain layer-pair while another sub-set(s) of periodic structures of the extended operating range metrology target can be used for another layer-pair thus enabling multi-layer overlay.

Thus, in the situation of significant process stack variation (e.g., variation of the process stack that can't be properly handled by a particular periodic structure design of a metrology target), the extended operating range metrology target allows putting significantly different designs (all within a reasonable size of a target) that will increase the chance of successful measurement results if a change is made to the process stack. This could increase the chance of first time measurement success due the presence of different designs pro-actively anticipating for process stack variations. And, in the situation of multi-overlay measurement, the extended operating range metrology target allows measuring of overlay between multiple layers in one measurement sequence. That is, in an embodiment, multiple layer-pairs can be measured in one measurement sequence and in an embodiment, the diffraction data of multiple layer-pairs can be detected simultaneously.

By having the differently designed periodic structures in the extended operating range metrology target, significant variations in the process stack and/or multi-layer can be handled by a single metrology target with differently designed sets of periodic structures therein. Thereby, the cost of creating different patterning devices (e.g., masks) for each different individual target and/or the cost of measuring time can be significantly reduced. Further, by the relatively small size of the extended operating range metrology target, the cost of target "real estate" (i.e., available space on the patterning device pattern to accommodate these individual layer-pair targets) for multiple different individual targets and the cost of throughput due to the increased measurement times may be significantly reduced. So, the extended operating range metrology target can bring all these multiple targets within a single target-cluster that is small enough from a real-estate point of view and also more favorable in terms of measurement time compared to multiple individual targets.

Figure 9:
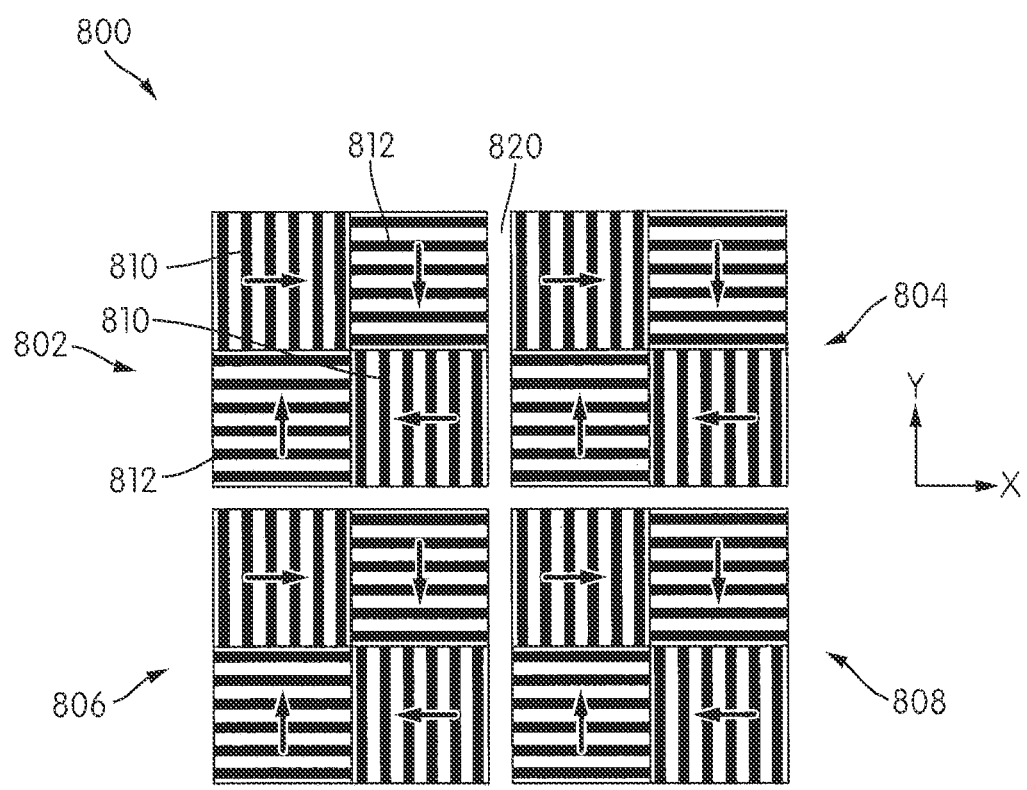
FIG. 9 illustrates an extended operating range metrology target according to an embodiment of the invention.

Referring to FIG. 9, an embodiment of an extended operating range metrology target 800 is depicted. The extended operating range metrology target 800 comprises a plurality of sub-targets, in this example, four diffraction sub-targets 802, 804, 806, 808. As will be appreciated, a different number of sub-targets may be provided. For example, just two sub-targets may be provided. Alternatively, three, five, six, seven, eight, etc. sub-targets may be provided. In an embodiment, each sub-target 802-808 is separated from a neighboring sub-target by a gap 820. In an embodiment, the gap is 200 nm or more, 250 nm or more, 350 nm or more, 500 nm or more, 750 nm or more, or 1 μm or more. The gap facilitates reconstruction of the sub-targets so that they can be separately identified. Further, the gap may help prevent cross-talk of diffraction from one sub-target extending over to another sub-target.

Each sub-target comprises a periodic structure. In an embodiment, each sub-target comprises at least a pair of periodic structures. In an embodiment, each sub-target comprises at least two pairs of periodic structures. In an embodiment, the features (e.g., lines) of the periodic structures in a sub-target extend in a same direction. In an embodiment, at least one periodic structure of a sub-target may have features extending in a different direction (e.g., substantially perpendicular) to the direction in which the features of another periodic structure of the sub-target extend. In an embodiment, the direction(s) in which features of periodic structures of one sub-target extend may be different from that of another sub-target.

In an embodiment, as shown in FIG. 9, each sub-target has a first pair of periodic structures 810 having features extending in a first direction (e.g., X-direction) and a second pair of periodic structures 812 having features extending in a second different direction (e.g., a second direction substantially perpendicular to the first direction such as the Y-direction). As discussed above, one or more of the sub-targets need not have the second pair of periodic structures extend in a different direction or the second different direction may be non-perpendicular and non-parallel to the first direction for one or more of the sub-targets. In this example, each sub-target 802-808 has a similar overall layout as the target of FIG. 4. That is, each sub-target has a first pair of periodic structures with features extending in the X-direction in opposite corners and a second pair of periodic structures with features extending in the Y-direction in opposite corners to the first pair of periodic structures. However, the layout of the sub-targets may be different than as depicted in FIG. 9. For example, the locations of the periodic structures may be different. As another example, the length and/or width of one pair of periodic structures may be different than the length and/or width of another pair of periodic structures. The relative angles in which one pair of periodic structures extends to another pair of periodic structures may be different. Examples of different layouts for sub-targets are described with respect to FIGS. 12A-E.

The sub-targets 802-808 have a size such that they can fully or at least partly fit within the same contiguous area as the target of FIG. 4. For example, the extended operating range metrology target 800 may have outer dimensions within or equal to 25 µm×25 µm, within or equal to 20 µm×20 µm, within or equal to 16 µm×16 µm, within or equal to 12 µm×12 µm, within or equal to 10 µm×10 µm, or within or equal to 8 µm×8 µm. In an embodiment, at least part of each of sub-target is within a contiguous area of a certain size on the substrate. In an embodiment, at least part of each periodic structure of the plurality of sub-targets is within the contiguous area of the certain size on the substrate. In an embodiment, each periodic structure of the plurality of sub-targets is within the contiguous area of the certain size on the substrate. In an embodiment, the certain size is less than or equal to 1000 µm$^2$, less than or equal to 900 µm$^2$, less than or equal to 800 µm$^2$, less than or equal to 700 µm$^2$, less than or equal to 600 µm$^2$, less than or equal to 500 µm$^2$, less than or equal to 450 µm$^2$, less than or equal to 400 µm$^2$, less than or equal to 350 µm$^2$, less than or equal to 300 µm$^2$, less than or equal to 250 µm$^2$, less than or equal to 200 µm$^2$, less than or equal to 150 µm$^2$, or less than or equal to 100 µm$^2$. In an embodiment, each of the periodic structures of the sub-targets 802-808 is no smaller than about 3 µm×3 µm or no smaller than about 4 µm×4 µm. In an embodiment, each of the periodic structures of the sub-targets 802-808 is no smaller than about 9 µm$^2$ or no smaller than about 16 µm$^2$.

In an embodiment, at least part of each of sub-target is within the area of the measurement spot (e.g., within the width of the measurement spot) on the substrate. In an embodiment, at least part of each periodic structure of the plurality of sub-targets is within the area of the measurement spot (e.g., within the width of the measurement spot) on the substrate. In an embodiment, each periodic structure of the plurality of sub-targets is within the area of the measurement spot (e.g., within the width of the measurement spot) on the substrate. In an embodiment, the measurement spot has a width (e.g., diameter) of about 35 µm or less, of about 30 µm or less, of about 25 µm or less, or of about 20 µm or less, of about 15 µm or less, or of about 10 µm or less. So, in an embodiment, multiple sub-targets can be measured in one measurement sequence and in an embodiment, the diffraction data of multiple sub-targets can be detected simultaneously.

Like with the target of FIG. 4, in an embodiment, a plurality of the sub-targets at least partly overlay another periodic structure (which other periodic structure is not shown in FIG. 9 merely for clarity). In an embodiment, each of the sub-targets 802-806 at least partly overlays a respective periodic structure. In an embodiment, a first extended operating range metrology target 800 overlays a second extended operating range metrology target 800. In that case, each of the plurality of the sub-targets 802-806 of the first extended operating range metrology target 800 would overlay respective sub-targets 802-806 of the second extended operating range metrology target 800. In an embodiment, the first extended operating range metrology target 800 may be in one layer and the second extended operating range metrology target 800 may be in one other layer. In an embodiment, the first extended operating range metrology target 800 may be in one layer and the second extended operating range metrology target 800 may have each of a plurality of sub-targets in different layers.

Further, besides multiple sub-targets being created within a single layout, each of a plurality of the sub-targets is designed for (a) a different process condition, and/or (b) a different layer-pair for multi-layer overlay. In other words, in an embodiment, a first sub-target 802 of the plurality of sub-targets has a different design than a second sub-target 804 of the plurality of sub-targets. In an embodiment, each of the sub-targets 802-808 may have a different design. In an embodiment, two or more sub-targets 802, 808 of the plurality of sub-targets may have a different design than two or more other sub-targets 804, 806 of the plurality of sub-targets.

Referring to FIG. 10, the use of an example of an extended operating range metrology target 900, 902 (of the design of FIG. 9) having a plurality of sub-targets designed for different process conditions is depicted. For ease of reference, the sub-targets 802, 804, 806, 808 are depicted in a row in FIG. 10. As will be appreciated from the layout of FIG. 9, the sub-targets 806, 808 in FIG. 10 would in practice be located in "front" or "behind" the sub-targets 802, 804 in FIG. 10, i.e., in or out of the page respectively. Further, in this embodiment, the first extended operating range metrology target 900 is at one layer and the second extended operating range metrology target 902 is at one other layer. That is, in FIG. 10, each of the sub-targets 802, 804, 806, 808 of the first extended operating range metrology target 900 is at a top layer and each of the sub-targets 802, 804, 806, 808 of the second extended operating range metrology target 902 is in a single layer underneath the first extended operating range metrology target 900, such that each of the sub-targets 802, 804, 806, 808 of the first extended operating range metrology target 900 at least partly overlays a respective sub-target 802, 804, 806, 808 of the second extended operating range metrology target 902.

In the example of FIG. 10, each of the sub-targets 802, 804, 806, 808 is designed for a different process stack. In this example, sub-target 802 is designed for a process stack having a first layer 904 of 100 nm and a second layer 906 of 100 nm, sub-target 804 is designed for a different process stack having a first layer 904 of 100 nm and a second layer 906 of 110 nm, sub-target 806 is designed for a different process stack having a first layer 904 of 110 nm and a second layer 906 of 110 nm, and sub-target 808 is designed for a process stack having a first layer 904 of 120 nm and a second layer 906 of 110 nm. As will be appreciated, the conditions of the different process stacks may be different than those used in this example. For example, the process conditions can be other than layer thicknesses. Other process conditions may include refractive index, layer material, etch rate, bake temperature, exposure focus, exposure dose, etc. Further, while in this embodiment, the extended operating range metrology target 900 is differently designed than the associated extended operating range metrology target 902 which it overlays (e.g., in FIG. 10, periodic structure features in the extended operating range metrology target 902 are segmented, while periodic features in the extended operating range metrology target 900 are not), the extended operating range metrology target 900 and the extended operating range metrology target 902 may be the same. Further, while 4 different process stacks are capable of being successfully measured in FIG. 10, there may be a different number of process stacks that could be capable of being successfully measured.

In terms of difference in design, the difference is, in an embodiment, a difference in pitch of the periodic structures between at least one of the sub-targets 802, 804, 806, 808 and another of the sub-targets 802, 804, 806, 808. In an embodiment, the pitch is selected from the range of 100 nm to 1000 nm. In an embodiment, the difference in design is a difference in feature (e.g., line) or space width of the periodic structures between at least one of the sub-targets 802, 804, 806, 808 and another of the sub-targets 802, 804, 806, 808. In an embodiment, the difference in design is a difference in segmentation of features of the periodic structures (e.g., a broken line, rather than a solid line) between at least one of the sub-targets 802, 804, 806, 808 and another of the sub-targets 802, 804, 806, 808. In an embodiment, the difference in design is a difference in bias (e.g., amount and/or direction) of the periodic structures between at least one of the sub-targets 802, 804, 806, 808 and another of the sub-targets 802, 804, 806, 808. In an embodiment, the bias is selected in the range of 1 nm to 60 nm. The arrows depict an embodiment of the direction of bias. To be sure a bias is not required. In an embodiment, the difference in design is a difference in feature or space width between overlying extended operating range metrology targets (e.g., a difference in "top and bottom CD"), e.g., a feature or space width of at least one of the sub-targets 802, 804, 806, 808 of a first extended operating range metrology target is different than the feature or space width of associated at least one of the sub-targets 802, 804, 806, 808 of an overlying second extended operating range metrology target. In an embodiment, the difference in design is a difference in layout of the sub-targets 802, 804, 806, 808 and their associated periodic structures. See, e.g., FIGS. 12A-E described hereafter. In an embodiment, the difference in design is a difference in optimum wavelength for the measuring beam between at least one of the sub-targets 802, 804, 806, 808 and another of the sub-targets 802, 804, 806, 808. Where the same wavelength measurement recipe is used for each of the sub-targets 802, 804, 806, 808, the sub-targets 802, 804, 806, 808 may be optimized to accept a minimal performance loss on each sub-target. Or, in an embodiment, multiple wavelengths may be used for the plurality of sub-targets or wavelengths may be separated out of broadband radiation applied to the sub-targets. As will be appreciated, a combination of design parameters may be used.

So, in an embodiment, the extended operating range metrology targets 900, 902 may be provided, in a first example, to a process stack that has the characteristics of sub-target 802, namely a process stack having a first layer 904 of 100 nm and a second layer 906 of 100 nm. Accordingly, when the measurements of those extended operating range metrology targets 900, 902 are made, the measurement results from sub-target 802 will be good for that process stack while the measurement results from sub-targets 804, 806, and 808 will be less so. But, conveniently, the same extended operating range metrology targets 900, 902 may be provided, in a second example, to a process stack that has the characteristics of sub-target 804, namely a process stack having a first layer 904 of 100 nm and a second layer 906 of 110 nm. Accordingly, when the measurements of those extended operating range metrology targets 900, 902 are made in this different process stack, the measurement results from sub-target 804 in this case will be good for that process stack while the measurement results from sub-targets 802, 806, and 808 will be less so.

To determine whether the measurement results are good, one or more different techniques may be used. For example, in the first example mentioned above, there may simply not be any or significantly weaker measurement results from sub-targets 804, 806, and 808 because they are effectively unmeasurable. In another example, a residual (e.g., an overlay residual) can be measured for each of the sub-targets and a lower or lowest residual for one of the sub-targets may signify that the measurement results from the sub-target are good. In another example, the same parameter (e.g., overlay) may be measured by another process. As an example, an electrical test may be performed to determine a value for the parameter and the sub-target with the nearest value to that measured by the electrical test may signify that the measurement results from the sub-target are good.

Referring to FIG. 11, the use of an example of an extended operating range metrology target 1000, 1002 (of the design of FIG. 9) having a plurality of sub-targets for multi-layer overlay is depicted. For ease of reference, the sub-targets 802, 804, 806, 808 are depicted in a row in FIG. 11. As will be appreciated from the layout of FIG. 9, the sub-targets 806, 808 in FIG. 11 would in practice be located in "front" or "behind" the sub-targets 802, 804 in FIG. 11, i.e., in or out of the page respectively. Further, in this embodiment, the first extended operating range metrology target 900 is at one layer and the second extended operating range metrology target 902 has each of a plurality of sub-targets in different layers. That is, in FIG. 11, each of the sub-targets 802, 804, 806, 808 of the first extended operating range metrology target 900 is at a top layer and each of the sub-targets 802, 804, 806, 808 of the second extended operating range metrology target 902 is in a different layer underneath the first extended operating range metrology target 900, such that each of the sub-targets 802, 804, 806, 808 of the first extended operating range metrology target 900 at least partly overlays a respective sub-target 802, 804, 806, 808 of the second extended operating range metrology target 902.

In the example of FIG. 11, each of the sub-targets 802, 804, 806, 808 is designed for a different layer. In this example, sub-target 802 is designed for measuring overlay for a first layer-pair of the top layer and layer 1010, sub-target 804 is designed for measuring overlay for a second layer-pair of the top layer and layer 1008, sub-target 806 is designed for measuring overlay for a third layer-pair of the top layer and layer 1006, and sub-target 808 is designed for measuring overlay for a fourth layer-pair of the top layer and layer 1004. While each sub-target in this example measures a different layer-pair, in an embodiment, two or more of the sub-targets may measure a first layer-pair and one or more other sub-targets may measure a second layer-pair. Further, while 4 different layer-pairs are capable of being measured in FIG. 11, there may be a different number of layer-pairs capable of being measured.

In this embodiment, each of the sub-targets 802, 804, 806, 808 of the first extended operating range metrology target 900 has a same design and the sub-targets 802, 804, 806, 808 of the first extended operating range metrology target 900 is the same in terms of design as the sub-targets 802, 804, 806, 808 of the second extended operating range metrology target 902. However, as noted above, two or more of the sub-targets 802, 804, 806, 808 of the second extended operating range metrology target 902 are in different layers (and thus of different design), while still underlying the first extended operating range metrology target 900. In an embodiment, one or more of the sub-targets 802, 804, 806, 808 of the first extended operating range metrology target 900 may have a different design than another one or more of the sub-targets 802, 804, 806, 808 of the first extended operating range metrology target 900. In an embodiment, one or more of the sub-targets 802, 804, 806, 808 of the first extended operating range metrology target 900 may have a different design than one or more of the sub-targets 802, 804, 806, 808 of the second extended operating range metrology target 902. p In an embodiment, because of the location of each of the sub-targets 802, 804, 806, 808 in the extended operating range metrology target, the overlay for each specific different layer-pair can be readily made. Moreover, since the extended operating range metrology target has sub-targets 802, 804, 806, 808 for each different layer-pair, the measurement of a plurality of different layer-pairs may be taken in one measurement sequence, e.g., the diffraction information each of the different layer-pairs may be captured at once. Instead of or in addition to using the measured overlay value of each different layer-pair separately, the average, median or other statistical value of the measurements using the sub-targets 802, 804, 806, 808 may be used for process control. This may be useful where there is a concern over the specific reliability of one or more of the sub-targets 802, 804, 806, 808 due their smallness. The statistical value can help eliminate anomalies.

FIGS. 12A-E depict further embodiments of an extended operating range metrology target. In an embodiment, these embodiments of extended operating range metrology target are designed for multi-layer overlay measurement. However, additionally or alternatively, these extended operating range metrology targets may be used, with appropriate modifications, for process stack variation (i.e., different sub-targets of the extended operating range metrology target are designed for different process stack conditions). Of course, the design possibilities for the extended operating range metrology target are not limited to those depicted in FIGS. 9 and 12A-E. Different design variations of the extended operating range metrology target are possible to, e.g., accommodate different or more process stack variations, different amounts of layers, different layout constraints, etc. Further, each of the extended operating range metrology target designs in FIGS. 12A-E depicts two sub-targets. As will be appreciated, the extended operating range metrology target may have more than two sub-targets.

In an embodiment, the extended operating range metrology target is designed to maximize the number of features exposed to radiation. In an embodiment, the extended operating range metrology target is designed to maximize the same type of periodic structures (e.g., same dimensions, area, etc.). In an embodiment, the extended operating range metrology target is designed to maximize symmetry. In an embodiment, the extended operating range metrology target is designed to maximize the size of periodic structures of one sub-target against the size of periodic structures of another sub-target while maintaining substantially the same or similar diffraction efficiency for each of those sub-targets.

Referring to FIG. 12A, there is depicted an embodiment of an extended operating range metrology target 1200 having a first sub-target 1202 and a second sub-target 1204. Compared with the extended operating range metrology target of FIG. 9, the sub-targets are "interleaved" with each other with in this case the periodic structures of the second sub-target 1204 meeting at the center of the extended operating range metrology target 1200 and the periodic structures of the first sub-target 1202 being arranged around the periphery. In this embodiment, the length L1 and width W1 of each periodic structure of the first sub-target 1202 is substantially the same as the length L2 (see FIG. 12B) and width W2 of each periodic structure of the second sub-target 1204. In an embodiment, the length L1, L2 is 8 μm and the width W1, W2 is 4 μm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a bias difference between the first and second sub-targets 1202, 1204. The arrows depict an embodiment of the direction of bias. To be sure a bias is not required. In an embodiment, the bias is less than or equal to 60 nm. In an embodiment, the extended operating range metrology target 1200 is capable of measuring overlay in the range of 30 nm or less.

Referring to FIG. 12B, there is depicted an embodiment of an extended operating range metrology target 1220 having a first sub-target 1222 and a second sub-target 1224. Each of the sub-targets is a distinct contiguous portion of the extended operating range metrology target 1220. In this case, the first sub-target 1222 is in the "top" part and the second sub-target 1224 is in the "bottom" part. In this embodiment, the length L1 and width W1 of each periodic structure of the first sub-target 1222 is substantially the same as the length L2 and width W2 of each periodic structure of the second sub-target 1224. In an embodiment, the length L1, L2 is 8 μm and the width W1, W2 is 4 μm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a difference in bias between the first and second sub-targets 1222, 1224. The arrows depict an embodiment of the direction of bias. To be sure a bias is not required. In an embodiment, the bias is less than or equal to 60 nm. In an embodiment, the extended operating range metrology target 1220 is capable of measuring overlay in the range of 30 nm or less.

Referring to FIG. 12C, there is depicted an embodiment of an extended operating range metrology target 1240 having a first sub-target 1242 and a second sub-target 1244. The design of FIG. 12C is similar to the design of FIG. 12A in that the sub-targets are "interleaved" with each other with in this case the periodic structures of the second sub-target 1244 meeting at the center of the extended operating range metrology target 1240 and the periodic structures of the first sub-target 1242 being arranged around the periphery. In this embodiment, the length L1 of each periodic structure of the first sub-target 1242 is different than the length L2 of each periodic structure of the second sub-target 1244 and the width W1 of each periodic structure of the first sub-target 1242 is substantially the same as the width W2 of each periodic structure of the second sub-target 1244. In an embodiment, the length L1 is 6 μm and the width W1 is 4.9 μm. In an embodiment, the length L2 is 10.4 μm and the width W2 is 4.9 μm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a bias difference between the first and second sub-targets 1242, 1244. The arrows depict an embodiment of the direction of bias. To be sure a bias is not required. In an embodiment, the bias is less than or equal to 60 nm. In an embodiment, the extended operating range metrology target 1240 is capable of measuring overlay in the range of 30 nm or less. This embodiment may be advantageous for multilayer overlay where the second sub-target 1244 is used for a lower layer than the first sub-target 1242 because the nature of the layer material, thickness, etc. significantly attenuates or otherwise disturbs the diffracted radiation from the lower layer. Software for designing the extended operating range metrology target (described in more detail hereafter) can, based on the nature of the layer material, thickness, etc., choose the design parameters (e.g., feature and space width, pitch, layout, etc.) of the periodic structures of the first and second sub-targets 1242, 1244 such that a diffraction efficiency of each of the first and second sub-targets 1242, 1244 is substantially the same or similar. This can help prevent clipping of a measurement sensor from excess diffracted radiation from the first sub-target 1242 or the second sub-target 1244.

Referring to FIG. 12D, there is depicted an embodiment of an extended operating range metrology target 1260 having a first sub-target 1262 and a second sub-target 1264. The design of FIG. 12D is similar to the design of FIG. 12C with the difference that this design is more symmetric. In this case, the second sub-target 1264 is in a cross-shaped form and the first sub-target 1262 is arranged around the periphery. In this embodiment, the length L1 of each periodic structure of the first sub-target 1262 is different than the length L2 of each periodic structure of the second sub-target 1264 and the width W1 of each periodic structure of the first sub-target 1262 is substantially the same as the width W2 of each periodic structure of the second sub-target 1264. In an embodiment, the length L1 is 5.4 μm and the width W1 is 5.4 μm. In an embodiment, the length L2 is 7.5 μm and the width W2 is 5.4 μm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a bias difference between the first and second sub-targets 1262, 1264. The arrows depict an embodiment of the direction of the bias. To be sure a bias is not required. In an embodiment, the bias is less than or equal to 60 nm. In an embodiment, the extended operating range metrology target 1260 is capable of measuring overlay in the range of 30 nm or less. This embodiment may be advantageous for multilayer overlay where the second sub-target 1264 is used for a lower layer than the first sub-target 1262 because the nature of the layer material, thickness, etc. significantly attenuates or otherwise disturbs the diffracted radiation from the lower layer. Software for designing the extended operating range metrology target (described in more detail hereafter) can, based on the nature of the layer material, thickness, etc., choose the design parameters (e.g., feature and space width, pitch, layout, etc.) of the periodic structures of the first and second sub-targets 1262, 1264 such that a diffraction efficiency of each of the first and second sub-targets 1262, 1264 is substantially the same or similar. This can help prevent clipping of a measurement sensor from excess diffracted radiation from the first sub-target 1262 or the second sub-target 1264. This design is slightly more balanced than the design of FIG. 12C.

Referring to FIG. 12E, there is depicted an embodiment of an extended operating range metrology target 1280 having a first sub-target 1282 and a second sub-target 1284. The design of FIG. 12E is similar to the designs of FIGS. 12C and 12D in that the periodic structures of the first and second sub-targets 1282 and 1284 differ. In the design of FIG. 12E, the periodic structures of the first sub-target 1282 are concentrated at the interior and the periodic structures of the second sub-target 1284 are arranged around the periphery. In this embodiment, the length L1 and width W1 of each periodic structure of the first sub-target 1282 is different than the length L2 and width W2 of each periodic structure of the second sub-target 1284. In an embodiment, the length L1 is 6.25 μm and the width W1 is 6.25 μm. In an embodiment, the length L2 is 12.5 μm and the width W2 is 7.5 μm. In an embodiment, feature lengths are in the range of 3500-4000 nm, e.g., 3875 nm. In an embodiment, the spacing between adjacent sides of the periodic structures of the first and second sub-targets is in the range of 150-400 nm, e.g., 250 nm. In an embodiment, the spacing is not uniform between all adjacent sides of the periodic structures of the first and second sub-targets. In an embodiment, there may be a bias difference between the first and second sub-targets 1282, 1284. The arrows depict an embodiment of the direction of bias. To be sure a bias is not required. In an embodiment, the bias is less than or equal to 60 nm. In an embodiment, the extended operating range metrology target 1280 is capable of measuring overlay in the range of 30 nm or less. This embodiment may be advantageous for multilayer overlay where the second sub-target 1284 is used for a lower layer than the first sub-target 1282 because the nature of the layer material, thickness, etc. significantly attenuates or otherwise disturbs the diffracted radiation from the lower layer. Software for designing the extended operating range metrology target (described in more detail hereafter) can, based on the nature of the layer material, thickness, etc., choose the design parameters (e.g., feature and space width, pitch, layout, etc.) of the periodic structures of the first and second sub-targets 1282, 1284 such that a diffraction efficiency of each of the first and second sub-targets 1282, 1284 is substantially the same or similar. This can help prevent clipping of a measurement sensor from excess diffracted radiation from the first sub-target 1282 or the second sub-target 1284. This design is slightly more balanced than the design of FIG. 12C. Further, in this embodiment, the first sub-target 1282 may be smaller than the measurement spot (i.e., the first sub-target 1282 is overfilled), while the second sub-target 1284 would be larger than the measurement spot (i.e., the second sub-target 1284 is underfilled). While underfilled, enough of the second sub-target 1284 may be captured to take a measurement.

Referring to FIGS. 22(A)-(C), the use of an example of an extended operating range metrology target 1500, 1502 having a plurality of sub-targets for multi-layer overlay is depicted. In this embodiment, extended operating range metrology target 1500, 1502 comprises sub-targets 1504 and 1506. The sub-target 1504 comprises periodic structures 1508, while sub-target 1506 comprises periodic structures 1510.

In this example, FIG. 22(A) depicts the location of periodic structures 1510 of sub-target 1504 in a lower layer, designated as layer 1. FIG. 22(B) depicts the location of periodic structures 1512 of sub-target 1506 in a higher layer, designated as layer 2, located above layer 1. FIG. 22(C) depicts the location of periodic structures of sub-targets 1504 and 1506 in a higher layer, designated as layer 3, located above layers 1 and 2. The layers need not be immediately adjacent each other. For example, one or more other layers may be provided between layer 1 and layer 2 or between layer 2 and layer 3, which other layers would not have a periodic structure therein overlapping with any of the periodic structures of FIGS. 22(A)-(C). In an embodiment, the extended operating range metrology target 1500, 1502 may have one or more further sub-targets. In an embodiment, each of the one or more further sub-targets may be located in respective one or more further layers (and thus allow for further layer-pairs to be measured).

Further, in practice, periodic structures in FIG. 22(C) would be at least partly overlying periodic structures in FIG. 22(A) and periodic structures in FIG. 22(C) would be at least partly overlying periodic structures in FIG. 22(B). In particular, periodic structures 1510 in FIG. 22(C) would be at least partly overlying periodic structures 1510 in FIG. 22(A). Further, periodic structures 1512 in FIG. 22(C) would be at least partly overlying periodic structures 1512 in FIG. 22(B). In an embodiment, the order of the periodic structures in the layers may be changed. For example, FIG. 22(C) may be located at layer 2, while FIG. 22(B) may be located at layer 3 (in which case FIG. 22(A) would be at layer 1) or may be located at layer 1 (in which case FIG. 22(A) would be at layer 3). In this case, different layer-pair combinations can be measured, namely overlay between layers 1 and 2 and/or between layers 2 and 3. Or, for example, FIG. 22(C) may be located at layer 1, while FIG. 22(B) may still be located at layer 2 (and thus FIG. 22(A) would be located at layer 3) or FIG. 22(B) may be located at layer 3 (in which case FIG. 22(A) would be located at layer 2).

In this embodiment, the features of the periodic structures 1510 of sub-target 1504 extend in a first direction, which may be denominated as the Y-direction. The periodic structures 1510 accordingly are able to determine overlay in a second direction, which may be denominated as the X-direction, which is substantially orthogonal to the first direction. Further, the features of the periodic structures 1512 of sub-target 1506 extend in the same first direction. Thus, the periodic structures 1512 are likewise able to determine overlay in the X-direction.

In an embodiment, the features of the periodic structures 1510 of sub-target 1504 extend in the second direction. In that case, the periodic structures 1510 are able to determine overlay in the Y-direction. Further, the features of the periodic structures 1512 of sub-target 1506 would extend in the same second direction. Thus, the periodic structures 1512 would likewise be able to determine overlay in the Y-direction.

So, in the embodiment of FIG. 22, the extended operating range metrology target 1500, 1502 allows determination of overlay in the X-direction (or Y-direction) between layer 1 (FIG. 22(A)) and layer 3 (FIG. 22(C)), while also allowing determination of overlay in the X-direction between layer 2 (FIG. 22(B)) and layer 3 (FIG. 22(C)). Thus, in a single measurement sequence, overlay in a same direction between different layer-pairs may be accomplished.

To facilitate checking of alignment of the periodic structures to help ensure that appropriate one or more periodic structures at least partly overlay associated one or more periodic structures, an optional marker 1508 may be provided at each of a plurality of the layers. For example, a coarse alignment may be performed using the marker 1508 to, for example, help ensure that periodic structures are generally overlying other periodic structures (e.g., if one marker 1508 is considerably misaligned from another, measurements may not be made using the target). Additionally or alternatively, the marker 1508 may be used to facilitate alignment of the measurement beam spot in the middle of the target.

Referring to FIGS. 23(A)-(C), the use of an example of an extended operating range metrology target 1600, 1602 having a plurality of sub-targets for multi-layer overlay is depicted. In this embodiment, extended operating range metrology target 1600, 1602 comprises sub-targets 1604, 1606, 1608, 1610. The sub-target 1604 comprises periodic structures 1612, sub-target 1606 comprises periodic structures 1614, sub-target 1608 comprises periodic structures 1616 and sub-target 1610 comprises periodic structures 1618.

In this example, FIG. 23(A) depicts the location of periodic structures 1614 of sub-target 1606 and periodic structures 1616 of sub-target 1608 in a lower layer, designated as layer 1. FIG. 23(B) depicts the location of periodic structures 1612 of sub-target 1604 and periodic structures 1618 of sub-target 1610 in a higher layer, designated as layer 2, located above layer 1. FIG. 23(C) depicts the location of periodic structures of sub-targets 1604, 1606, 1608, 1610 in a higher layer, designated as layer 3, located above layers 1 and 2. The layers need not be immediately adjacent each other. For example, one or more other layers may be provided between layer 1 and layer 2 or between layer 2 and layer 3, which other layers would not have a periodic structure therein overlapping with any of the periodic structures of FIGS. 23(A)-(C).

Further, in practice, periodic structures in FIG. 23(C) would be at least partly overlying periodic structures in FIG. 23(A) and periodic structures in FIG. 23(C) would be at least partly overlying periodic structures in FIG. 23(B). In particular, periodic structures 1614 and 1616 in FIG. 23(C) would be at least partly overlying respective periodic structures 1614 and 1616 in FIG. 23(A). Further, periodic structures 1612 and 1618 in FIG. 23(C) would be at least partly overlying respective periodic structures 1612 and 1618 in FIG. 23(B). In an embodiment, the order of the periodic structures in the layers may be changed. For example, FIG. 23(C) may be located at layer 2, while FIG. 23(B) may be located at layer 3 (in which case FIG. 23(A) would be at layer 1) or may be located at layer 1 (in which case FIG. 23(A) would be at layer 3). In this case, different layer-pair combinations can be measured, namely overlay between layers 1 and 2 and/or between layers 2 and 3. Or, for example, FIG. 23(C) may be located at layer 1, while FIG. 23(B) may still be located at layer 2 (and thus FIG. 23(A) would be located at layer 3) or FIG. 23(B) may be located at layer 3 (in which case FIG. 23(A) would be located at layer 2).

In this embodiment, the features of the periodic structures 1612 of sub-target 1604 extend in a first direction, which may be denominated as the Y-direction. The periodic structures 1612 accordingly are able to determine overlay in a second direction, which may be denominated as the X-direction, which is substantially orthogonal to the first direction. Further, the features of the periodic structures 1614 of sub-target 1606, periodic structures 1616 of sub-target 1608 and periodic structures 1618 of sub-target 1610 extend in the same first direction. Thus, the periodic structures 1614, 1616 and 1618 are likewise respectively able to determine overlay in the X-direction.

In an embodiment, the features of the periodic structures 1612 of sub-target 1604 extend in the second direction. In that case, the periodic structures 1612 are able to determine overlay in the Y-direction. Further, the features of the periodic structures 1614, 1616 and 1618 would extend in the same second direction. Thus, the periodic structures 1614, 1616 and 1618 would likewise be able to determine overlay in the Y-direction.

So, in the embodiment of FIG. 23, the extended operating range metrology target 1600, 1602 allows determination of overlay in the X-direction (or Y-direction) between layer 1 (FIG. 23(A)) and layer 3 (FIG. 23(C)), while also allowing determination of overlay in the X-direction between layer 2 (FIG. 23(B)) and layer 3 (FIG. 23(C)). Moreover, in this case, the overlay in the X-direction (or Y-direction) would be measured at least two times for each layer-pair due to one or more periodic structures of at least two sub-targets being in each layer. For example, in an embodiment, overlay in the X-direction (or Y-direction) between layers 1 and 3 is measured by each of at least sub-targets 1604 and 1610. Similarly, for example, in an embodiment, overlay in the X-direction (or Y-direction) between layers 2 and 3 is measured by each of at least sub-targets 1606 and 1608. Thus, in a single measurement sequence, overlay in a same direction between different layer-pairs may be accomplished a plurality of times for each layer-pair. The overlay results may be statistically combined (e.g., averaged) or combined by weighting (e.g., the overlay value measured for a layer-pair using one sub-target is weighed more than the overlay value for the layer-pair measured using another sub-target).

Referring to FIGS. 24(A)-(C), the use of an example of an extended operating range metrology target 1700, 1702 having a plurality of sub-targets for multi-layer overlay is depicted. In this embodiment, extended operating range metrology target 1700, 1702 comprises sub-targets 1704 and 1706. The sub-target 1704 comprises periodic structures 1708, while sub-target 1706 comprises periodic structures 1710.

In this example, FIG. 24(A) depicts the location of periodic structures 1708 of sub-target 1704 in a lower layer, designated as layer 1. FIG. 24(B) depicts the location of periodic structures 1710 of sub-target 1706 in a higher layer, designated as layer 2, located above layer 1. FIG. 24(C) depicts the location of periodic structures of sub-targets 1704 and 1706 in a higher layer, designated as layer 3, located above layers 1 and 2. The layers need not be immediately adjacent each other. For example, one or more other layers may be provided between layer 1 and layer 2 or between layer 2 and layer 3, which other layers would not have a periodic structure therein overlapping with any of the periodic structures of FIGS. 24(A)-(C).

Further, in practice, periodic structures in FIG. 24(C) would be at least partly overlying periodic structures in FIG. 24(A) and periodic structures in FIG. 24(C) would be at least partly overlying periodic structures in FIG. 24(B). In particular, periodic structures 1708 in FIG. 24(C) would be at least partly overlying periodic structures 1708 in FIG. 24(A). Further, periodic structures 1710 in FIG. 24(C) would be at least partly overlying periodic structures 1710 in FIG. 24(B). In an embodiment, the order of the periodic structures in the layers may be changed. For example, FIG. 24(C) may be located at layer 2, while FIG. 24(B) may be located at layer 3 (in which case FIG. 24(A) would be at layer 1) or may be located at layer 1 (in which case FIG. 24(A) would be at layer 3). In this case, different layer-pair combinations can be measured, namely overlay between layers 1 and 2 and/or between layers 2 and 3. Or, for example, FIG. 24(C) may be located at layer 1, while FIG. 24(B) may still be located at layer 2 (and thus FIG. 24(A) would be located at layer 3) or FIG. 24(B) may be located at layer 3 (in which case FIG. 24(A) would be located at layer 2).

In this embodiment, the features of the periodic structures 1708 of sub-target 1704 extend in a first direction, which may be denominated as the Y-direction. The periodic structures 1708 accordingly are able to determine overlay in a second direction, which may be denominated as the X-direction, which is substantially orthogonal to the first direction. Further, the features of the periodic structures 1710 of sub-target 1706 extend in the second direction. The periodic structures 1710 accordingly are able to determine overlay in the Y-direction.

In an embodiment, the features of the periodic structures 1708 of sub-target 1704 extend in the second direction. In that case, the periodic structures 1708 are able to determine overlay in the Y-direction. Further, in that case, the features of the periodic structures 1710 of sub-target 1706 would extend in the same second direction. Thus, the periodic structures 1710 would likewise be able to determine overlay in the Y-direction.

So, in the embodiment of FIG. 24, the extended operating range metrology target 1700, 1702 allows determination of overlay in the X-direction between layer 1 (FIG. 24(A)) and layer 3 (FIG. 24(C)), while also allowing determination of overlay in the Y-direction between layer 2 (FIG. 24(B)) and layer 3 (FIG. 24(C)). Or, for example, by shifting FIG. 24(B) to layer 1 and shifting FIG. 24(A) to layer 2, the extended operating range metrology target 1700, 1702 in that case would allow for determination of overlay in the Y-direction between layer 1 and layer 3, while also allowing determination of overlay in the X-direction between layer 2 and layer 3. Thus, in a single measurement sequence, overlay in different directions between different layer-pairs may be accomplished.

Referring to FIGS. 25(A)-(C), the use of an example of an extended operating range metrology target 1800, 1802 having a plurality of sub-targets for multi-layer overlay is depicted. In this embodiment, extended operating range metrology target 1800, 1802 comprises sub-targets 1804, 1806, 1810 and 1812. The sub-target 1804 comprises periodic structures 1812, sub-target 1806 comprises periodic structures 1814, sub-target 1808 comprises periodic structures 1816 and sub-target 1810 comprises periodic structure 1818.

In this example, FIG. 25(A) depicts the location of periodic structures 1816 of sub-target 1808 and periodic structure 1818 of sub-target 1810 in a lower layer, designated as layer 1. FIG. 25(B) depicts the location of periodic structures 1812 of sub-target 1806 and periodic structures 1814 of sub-target 1806 in a higher layer, designated as layer 2, located above layer 1. FIG. 25(C) depicts the location of periodic structures of sub-targets 1804, 1806, 1808 and 1810 in a higher layer, designated as layer 3, located above layers 1 and 2. The layers need not be immediately adjacent each other. For example, one or more other layers may be provided between layer 1 and layer 2 or between layer 2 and layer 3, which other layers would not have a periodic structure therein overlapping with any of the periodic structures of FIGS. 25(A)-(C).

Further, in practice, periodic structures in FIG. 25(C) would be at least partly overlying periodic structures in FIG. 25(A) and periodic structures in FIG. 25(C) would be at least partly overlying periodic structures in FIG. 25(B). In particular, periodic structures 1816 and 1818 in FIG. 25(C) would be at least partly overlying associated periodic structures 1816 and 1818 in FIG. 25(A). Further, periodic structures 1812 and 1814 in FIG. 25(C) would be at least partly overlying associated periodic structures 1812 and 1814 in FIG. 25(B). In an embodiment, the order of the periodic structures in the layers may be changed. For example, FIG. 25(C) may be located at layer 2, while FIG. 25(B) may be located at layer 3 (in which case FIG. 25(A) would be at layer 1) or may be located at layer 1 (in which case FIG. 25(A) would be at layer 3). In this case, different layer-pair combinations can be measured, namely overlay between layers 1 and 2 and/or between layers 2 and 3. Or, for example, FIG. 25(C) may be located at layer 1, while FIG. 25(B) may still be located at layer 2 (and thus FIG. 25(A) would be located at layer 3) or FIG. 25(B) may be located at layer 3 (in which case FIG. 25(A) would be located at layer 2).

In this embodiment, the features of the periodic structures 1812 of sub-target 1804 and periodic structures 1814 of sub-target 1806 extend in a first direction, which may be denominated as the Y-direction. The periodic structures 1812 and 1814 accordingly are able to respectively determine overlay in a second direction, which may be denominated as the X-direction, which is substantially orthogonal to the first direction. Further, the features of the periodic structures 1816 of sub-target 1808 and periodic structures 1818 of sub-target 1810 extend in the second direction. The periodic structures 1816 and 1818 accordingly are able to respectively determine overlay in the Y-direction.

In an embodiment, the features of the periodic structures 1812 of sub-target 1804 and periodic structures 1814 of sub-target 1806 extend in the second direction. In that case, the periodic structures 1812 and 1814 are able to determine overlay in the Y-direction. Further, in that case, the features of the periodic structures 1816 of sub-target 1808 and periodic structures 1818 of sub-target 1810 would extend in the first direction. Thus, in that case, the periodic structures 1816 and 1818 are able to determine overlay in the X-direction.

So, in the embodiment of FIG. 25, the extended operating range metrology target 1800, 1802 allows determination of overlay in the X-direction between layer 2 (FIG. 25(B)) and layer 3 (FIG. 25(C)), while also allowing determination of overlay in the Y-direction between layer 1 (FIG. 25(A)) and layer 3 (FIG. 25(C)). Or, for example, by shifting FIG. 25(B) to layer 1 and shifting FIG. 25(A) to layer 2, the extended operating range metrology target 1800, 1802 in that case would allow for determination of overlay in the X-direction between layer 1 and layer 3, while also allowing determination of overlay in the Y-direction between layer 2 and layer 3. Moreover, in this case, the overlay in the X-direction and Y-direction) would be measured at least two times for each layer-pair due to one or more periodic structures of at least two sub-targets being in each layer. For example, in an embodiment, overlay in the X-direction between layers 2 and 3 is measured by each of at least sub-targets 1804 and 1806. Similarly, for example, in an embodiment, overlay in the Y-direction between layers 1 and 3 is measured by each of at least sub-targets 1808 and 1810. Thus, in a single measurement sequence, overlay in different directions between different layer-pairs may be accomplished a plurality of times for each layer-pair. The overlay results may be statistically combined (e.g., averaged) or combined by weighting (e.g., the overlay value measured for a layer-pair using one sub-target is weighed more than the overlay value for the layer-pair measured using another sub-target).

Referring to FIGS. 26(A)-(E), the use of an example of an extended operating range metrology target 1800, 1802 having a plurality of sub-targets for multi-layer overlay is depicted. In this embodiment, extended operating range metrology target 1800, 1802 comprises sub-targets 1804, 1806, 1810 and 1812. The sub-target 1804 comprises periodic structures 1812, sub-target 1806 comprises periodic structures 1814, sub-target 1808 comprises periodic structures 1816 and sub-target 1810 comprises periodic structure 1818.

In this example, FIG. 26(A) depicts the location of periodic structures 1814 of sub-target 1806 in a lower layer, designated as layer 1. FIG. 26(B) depicts the location of periodic structures 1818 of sub-target 1810 in a higher layer, designated as layer 2, located above layer 1. FIG. 26(C) depicts the location of periodic structures 1816 of sub-target 1808 in a higher layer, designated as layer 3, located above layers 1 and 2. FIG. 26(D) depicts the location of periodic structures 1812 of sub-target 1804 in a higher layer, designated as layer 4, located above layers 1-3. FIG. 26(E) depicts the location of periodic structures of sub-targets 1804, 1806, 1808 and 1810 in a higher layer, designated as layer 5, located above layers 1-4. The layers need not be immediately adjacent each other. For example, one or more other layers may be provided between layer 1 and layer 2, between layer 2 and layer 3, between layer 3 and layer 4 and/or between layer 4 and layer 5, which other layers would not have a periodic structure therein overlapping with any of the periodic structures of FIGS. 26(A)-(E).

Further, in practice, periodic structures in FIG. 26(E) would be at least partly overlying periodic structures in FIG. 26(A), periodic structures in FIG. 26(E) would be at least partly overlying periodic structures in FIG. 26(B), periodic structures in FIG. 26(E) would be at least partly overlying periodic structures in FIG. 26(C) and periodic structures in FIG. 26(E) would be at least partly overlying periodic structures in FIG. 26(D). In particular, periodic structures 1814 in FIG. 26(E) would be at least partly overlying periodic structures 1814 in FIG. 26(A). Further, periodic structures 1818 in FIG. 26(E) would be at least partly overlying periodic structures 1818 in FIG. 26(B), periodic structures 1816 in FIG. 26(E) would be at least partly overlying periodic structures 1816 in FIG. 26(C) and periodic structures 1812 in FIG. 26(E) would be at least partly overlying periodic structures 1812 in FIG. 26(D). In an embodiment, the order of the periodic structures in the layers may be changed. For example, FIG. 26(E) may be located at layer 3, while FIG. 26(C) may be located at layer 5 or another layer provided that structure that would otherwise be at that layer is moved to another layer. In this case, different layer-pair combinations can be measured, namely overlay between layers 1 and 3, between layers 2 and 3, between layers 3 and 4 and/or between layers 3 and 5. Or, for example, FIG. 26(E) may be located at layer 2, while FIG. 26(B) may be located at layer 5 or another layer provided that structure that would otherwise be at that layer is moved to another layer.

In this embodiment, the features of the periodic structures 1812 of sub-target 1804 and periodic structures 1814 of sub-target 1806 extend in a first direction, which may be denominated as the Y-direction. The periodic structures 1812 and 1814 accordingly are able to respectively determine overlay in a second direction, which may be denominated as the X-direction, which is substantially orthogonal to the first direction. Further, the features of the periodic structures 1816 of sub-target 1808 and periodic structures 1818 of sub-target 1810 extend in the second direction. The periodic structures 1816 and 1818 accordingly are able to respectively determine overlay in the Y-direction.

In an embodiment, the features of the periodic structures 1812 of sub-target 1804 and periodic structures 1814 of sub-target 1806 extend in the second direction. In that case, the periodic structures 1812 and 1814 are able to determine overlay in the Y-direction. Further, in that case, the features of the periodic structures 1816 of sub-target 1808 and periodic structures 1818 of sub-target 1810 would extend in the first direction. Thus, in that case, the periodic structures 1816 and 1818 are able to determine overlay in the X-direction.

So, in the embodiment of FIG. 26, the extended operating range metrology target 1800, 1802 allows determination of overlay in the X-direction between layer 1 (FIG. 26(A)) and layer 5 (FIG. 26(E)) and between layer 4 (FIG. 26(D)) and layer 5 (FIG. 26(E)), while also allowing determination of overlay in the Y-direction between layer 2 (FIG. 26(B)) and layer 5 (FIG. 26(E)) and between layer 3 (FIG. 26(C)) and layer 5 (FIG. 26(E)). Or, for example, by shifting FIG. 26(B) to layer 1 and shifting FIG. 26(A) to layer 2, the extended operating range metrology target 1800, 1802 in that case would allow for determination of overlay in the X-direction between layer 2 and layer 5, while also allowing determination of overlay in the Y-direction between layer 1 and layer 5. Or, for example, by shifting FIG. 26(C) to layer 4 and shifting FIG. 26(D) to layer 3, the extended operating range metrology target 1800, 1802 in that case would allow for determination of overlay in the X-direction between layer 3 and layer 5, while also allowing determination of overlay in the Y-direction between layer 4 and layer 5. Thus, in a single measurement sequence, overlay in different directions between different layer-pairs may be accomplished.

Further, in the embodiments of FIGS. 24-26, sub-targets have been described and shown as comprising periodic structures having features in one particular direction. This need not be the case. Rather, in FIGS. 24-26, sub-targets may comprise one or more periodic structures having features in a first direction and comprise one or more periodic structure having features in a second different direction. For example, in FIG. 24, sub-target 1704 may comprise a periodic structure 1708 and a periodic structure 1710. Similarly, sub-target 1706 may comprise a periodic structure 1708 and a periodic structure 1710. Similar groupings may be applied in FIGS. 25 and 26.

The extended operating range metrology target can thus open up a new way of working with metrology targets in, e.g., the process development phase and multi-layer overlay measurement. In advanced nodes (with, e.g., difficult and varying processes and/or multiple layers for multi-patterning (e.g., double patterning)), device designers and manufacturers are dynamically changing process stacks and/or using multiple layers and expect that metrology will work. The extended operating range metrology target can thus bring more process robustness to metrology measurements and increase the chance of first-time-success of metrology on a relatively unknown process stack. For example, a benefit from measurement speed can be realized if at least part of each of sub-target of the extended operating range metrology target is within the area of the measurement spot. If so, the extended operating range metrology target can, for example, increase the chance of first time success with metrology on a process stack where process conditions may be unknown. Further, the extended operating range metrology target can enable quick measurement of multiple layers and/or handle significant variations in the process stack with reduced cost in the terms of target "real estate", patterning device manufacture and/or throughput. And, the extended operating range metrology target may be used at development and/or manufacturing sites using existing metrology apparatus and no sensor hardware change may be required.

As described above, in an embodiment, there is provided a system and method to design the extended operating range metrology target. In an embodiment, the extended operating range metrology target should be suited to the different process stacks expected and/or the multilayer overlay measurement desired. Further, the extended operating range metrology target should be able to cover for typical process variations (which are different than the significant differences from different process stacks). Accordingly, in an embodiment, a design methodology is employed to help ensure robustness of the extended operating range metrology target. That is, the extended operating range metrology target, including its sub-targets and its associated periodic structures, can be designed by calculation and/or simulation using process stack information to help ensure robustness of the extended operating range metrology target. In particular, for example, for an extended operating range metrology target for different process stacks, the robustness of each sub-target can be determined for the expected typical process variation associated with the particular different process stack associated with the sub-target.

As alluded to, proposed metrology target designs may be subject to testing and/or simulation in order to confirm their suitability and/or viability, both from a printability and a detectability standpoint. In a commercial environment, good overlay mark detectability may be considered to be a combination of low total measurement uncertainty as well as a short move-acquire-move time, as slow acquisition is detrimental to total throughput for the production line. Modern micro-diffraction-based-overlay targets (μDBO) may be on the order of 10-20 μm on a side, which provides an inherently low detection signal compared to 40×160 μm$^2$ targets such as those used in the context of monitor substrates.

Additionally, once metrology targets that meet the above criteria have been selected, there is a possibility that detectability will change with respect to typical process variations, such as film thickness variation, various etch biases, and/or geometry asymmetries induced by the etch and/or polish processes. Therefore, it may be useful to select a target that has low detectability variation and low variation in the measured parameter of interest (e.g., overlay, alignment, etc.) against various process variations. Likewise, the fingerprint (printing characteristics, including, for example, lens aberration) of the specific machine that is to be used to produce the microelectronic device to be imaged will, in general, affect the imaging and production of the metrology targets. It may therefore be useful to ensure that the metrology targets are resistant to fingerprint effects, as some patterns will be more or less affected by a particular lithographic fingerprint.

Accordingly, in an embodiment, there is provided a method to design an extended operating range metrology target. In an embodiment, it is desirable to simulate various extended operating range metrology target designs in order to confirm the suitability and/or viability of one or more of the proposed extended operating range metrology target designs.

Figure 19:
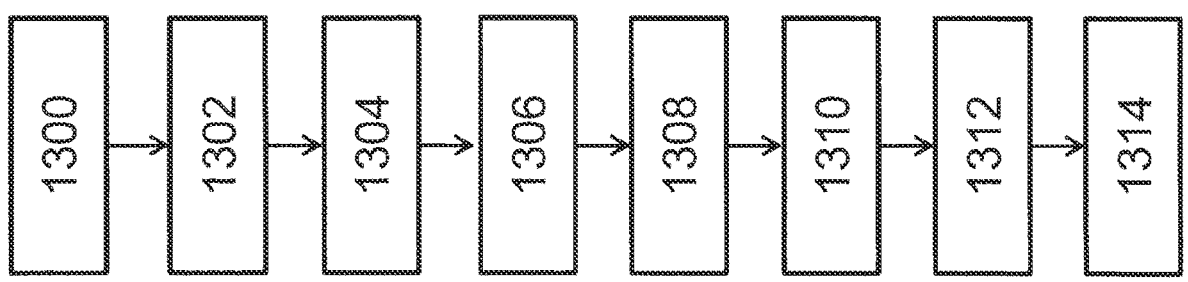
FIG. 19 schematically depicts a system to design an extended operating range metrology target according to an embodiment of the invention.

In a system for simulating a manufacturing process involving lithography and metrology targets, the major manufacturing system components and/or processes can be described by various functional modules, for example, as illustrated in FIG. 19. Referring to FIG. 19, the functional modules may include a design layout module 1300, which defines a metrology target (and/or microelectronic device) design pattern; a patterning device layout module 1302, which defines how the patterning device pattern is laid out in polygons based on the target design; a patterning device model module 1304, which models the physical properties of the pixilated and continuous-tone patterning device to be utilized during the simulation process; an optical model module 1306, which defines the performance of the optical components of the lithography system; a resist model module 1308, which defines the performance of the resist being utilized in the given process; a process model module 1310, which defines performance of the post-resist development processes (e.g., etch); and metrology module 1312, which defines the performance of a metrology system used with the metrology target and thus the performance of the metrology target when used with the metrology system. The results of one or more of the simulation modules, for example, predicted contours and CDs, are provided in a result module 1314.

The properties of the illumination and projection optics are captured in the optical model module 1306 that includes, but is not limited to, NA-sigma (σ) settings as well as any particular illumination source shape, where σ (or sigma) is outer radial extent of the illuminator. The optical properties of the photo-resist layer coated on a substrate—i.e. refractive index, film thickness, propagation and polarization effects—may also be captured as part of the optical model module 1306, whereas the resist model module 1308 describes the effects of chemical processes which occur during resist exposure, post exposure bake (PEB) and development, in order to predict, for example, contours of resist features formed on the substrate. The patterning device model module 1304 captures how the target design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the target design. The target design is generally defined as the pre-OPC patterning device layout, and will be provided in a standardized digital file format such as GDSII or OASIS.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

In a manufacturing process, variations in various process parameters have significant impact on the design of a suitable target that can faithfully reflect a device design. Such process parameters include, but are not limited to, side-wall angle (determined by the etching or development process), refractive index (of a device layer or a resist layer), thickness (of a device layer or a resist layer), frequency of incident radiation, etch depth, floor tilt, extinction coefficient for the radiation source, coating asymmetry (for a resist layer or a device layer), variation in erosion during a chemical-mechanical polishing process, and the like.

A metrology target design can be characterized by various parameters such as, for example, target coefficient (TC), stack sensitivity (SS), overlay impact (OV), or the like. Stack sensitivity can be understood as a measurement of how much the intensity of the signal changes as overlay changes because of diffraction between target (e.g., grating) layers. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Overlay impact measures the change in overlay error as a function of target design.

Described herein is a computer-implemented method of defining a metrology target design for use in, e.g., a metrology system simulation or in a target manufacturing process simulation (e.g., including exposing the metrology target using a lithographic process, developing the metrology target, etching the target, etc.). In an embodiment, one or more design parameters (e.g., geometric dimensions) for the target can be specified and further discrete values or a range of values can be specified for the one or more design parameters. Further, a user and/or the system may impose one or more constraints on one or more design parameters (e.g., a relationship between pitch and space width, a limit on pitch or space width, a relationship between feature (e.g., line) width (CD) and pitch (e.g., feature width is less than pitch), etc.) either in the same layer or between layers, based on, e.g., the lithographic process for which the target is desired. In an embodiment, the one or more constraints may be on the one or more design parameters for which discrete values or a range has been specified, or on one or more other design parameters.

Figure 20:
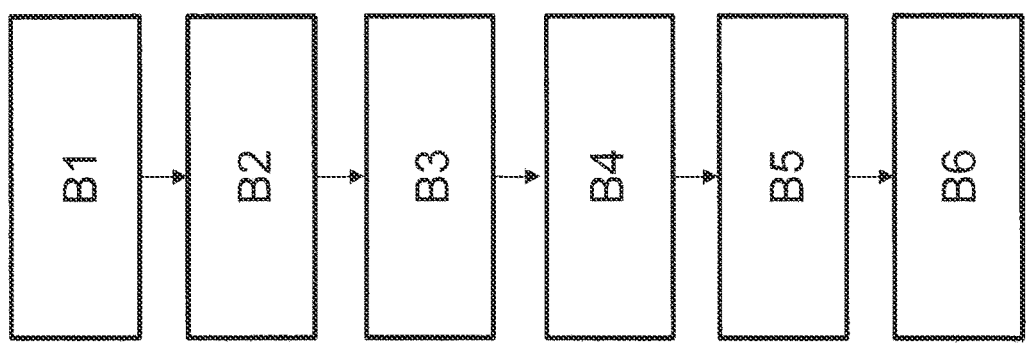
FIG. 20 depicts a flowchart illustrating a process of designing an extended operating range metrology target according to an embodiment of the invention.

FIG. 20 schematically depicts a computer-implemented method of defining an extended operating range metrology target design in accordance with an embodiment. The method includes, at block B1, providing a range or a plurality of values for each of a plurality of design parameters (e.g., geometric dimensions) of a metrology target.

In an embodiment, a user of a metrology target design system may specify one or more of the design parameters (e.g., geometric dimensions) for the metrology target. For example, the user may specify that an extended operating range metrology target is desired. The user may further specify the number of sub-targets of the extended operating range metrology target. Further, in an embodiment, the user may specify (e.g., select) the discrete values or a range of values for each of one or more of the design parameters of the extended operating range metrology target, one or more sub-targets thereof, and one or more periodic structures of the sub-targets. For example, the user may select a range or a set of values for feature (e.g., line) width, space width, size of the extended operating range metrology target, pitch, etc. for the extended operating range metrology target. In an embodiment, where the metrology target comprises multiple periodic structures (gratings), or segmented periodic structures (gratings), the user may select or provide a range or set of values for other design parameters, e.g., shared pitch.

In an embodiment, the design parameters may include any one or more geometric dimensions selected from: pitch of a periodic structure of the target, periodic structure feature (e.g., line) width of the target, periodic structure space width of the target, one or more segmentation parameters of the features of the periodic structure (segmentation pitch/feature width/space width in X and/or Y direction depending on segmentation type). Further, the parameters may be specified for a single layer or a plurality of layers (e.g., two layers or two layers plus an intermediate shielding layer). For a plurality of layers, they may share pitch. For certain metrology targets, e.g. focus or alignment targets, other parameters may be used. Other design parameters may be physical limitations such as one or more selected from: a wavelength of radiation used in the metrology system for the target, polarization of radiation used in the metrology system, numerical aperture of the metrology system, target type, and/or a process parameter. In an embodiment, non-uniform and non-symmetric patterns, for example modulated overlay targets and focus targets, may be provided. Thus, the design parameters may be varied and not necessarily uniform in a particular direction.

At block B2, there is provided one or more constraints for one or more design parameters of the metrology target. Optionally, the user may define one or more constraints. A constraint may be a linear algebraic expression. In an embodiment, the constraint may be non-linear. Some constraints may be related to other constraints. For example, feature width, pitch and space width are related such that if any two of the three are known, the third may be fully determined.

In an embodiment, the user may specify a constraint on the area, a dimension, or both, of the extended operating range metrology target. The user may specify a constraint on the number of sub-targets.

In an embodiment, a constraint may be a metrology parameter constraint. For example, in some metrology systems, the physics of the system may place a constraint. For example, a wavelength of radiation used in the system may constrain the pitch of the target design, e.g., a lower limit. In an embodiment, there is a (upper/lower) limit on pitch as function of wavelength, the type of target and/or the aperture of the metrology system. Physical limitations that can be used as constraints include one or more selected from: a wavelength of radiation used in the metrology system, polarization of radiation used in the metrology system, numerical aperture of the metrology system, and/or target type. In an embodiment, the constraint may be a process parameter constraint (e.g., a constraint dependent on etch type, development type, resist type, etc.).

Depending on the particular process being used, in an embodiment, one or more constraints may be related to a constraint between a design parameter (e.g., geometric dimension) of one layer and a design parameter (e.g., geometric dimension) of another layer.

At block B3, by a processor, the method solves for and/or selects by sampling within the range or the plurality of values for the design parameters, a plurality of metrology target designs having one or more design parameters meeting the one or more constraints. For example, in an embodiment involving solving, one or more potential metrology targets design may be solved for. That is, one or more potential metrology designs may be derived by solving for permitted values using, e.g., one or more equality constraints to solve for specific values. For example, in an embodiment involving sampling, a convex polytope may be defined by the various design parameters and constraints. The volume of the convex polytope may be sampled according to one or more rules to provide sample metrology target designs that meet all the constraints. One or more sampling rules may be applied to sample metrology target designs.

It is to be noted, however, that not all metrology target designs thus discovered are equally representative of process variations. As such, in an embodiment, the metrology target designs discovered using a method described herein may be further simulated, at block B4, to determine, for example, the viability and/or suitability of one or more of the metrology target designs. The simulated metrology target designs may then be evaluated at block B5 to identify which one or more metrology target designs are best or more representative of process variation by, for example, ranking them based on a key performance index or a robustness criteria. At block B6, a particular metrology design may be selected and used, e.g., for measurement.

As noted above, it is desirable to make metrology targets (e.g., overlay targets, alignment targets, focus targets, etc.) smaller. This is to limit the "real-estate" consumption for metrology purposes on, e.g., each production substrate. But with small size comes problems with detection (e.g., image resolution).

In dark-field metrology, a single order of radiation may be transmitted to the detector, and creates a gray-level image of the target. The individual periodic structures are smaller than the illuminated area at read-out of the metrology targets and, therefore, the periodic structure edges are visible in the image. But, the periodic structure edges may present intensity levels that significantly deviate from the average periodic structure intensity. This is called an 'edge effect'.

After a pattern-recognition step of the target in the dark-field image, a region-of-interest (ROI) is selected within the individual periodic structures, which is used in the signal estimate. In this way, the average periodic structure intensity is extracted, while excluding the influence of edge effects. As such, the measured signal may be based only on a few detector pixels corresponding to the center of the periodic structure in the image.

When a target is designed, the target design may be based on "infinitely" large periodic structures of which the feature-space dimensions, pitch, sub-segmentation etc., is optimized. The periodic structures may be positioned around predefined periodic structure centers within the target. As a result, the target area is filled up more or less efficiently depending on the pitch and feature-space dimensions of the periodic structures.

In an embodiment, it is desirable to consider configuration (e.g., optimization) of the entire target layout of an extended operating range metrology target with respect to optimum or improved detectability by the metrology apparatus, including, e.g., optimized periodic structure to periodic structure distance, reduction of edge effects, and maximization of the available grating area. Failure to configure for optimum or improved detectability by the metrology apparatus may lead to one or more of the following issues:

1. Large edge effects at each periodic structure's periphery may be observed in the dark field image. That may have one or more of the following effects:
   The size of available region of interest (ROI) may be reduced (due to cropping of the image to exclude the periodic structure edges), leading to a poor reproducibility of the calculated signal.
   The accuracy of the calculated periodic structure signal (average intensity) may be reduced due to contamination of the signal by optical crosstalk from emission due to edge effects.

Instances of pattern recognition failure may be increased due to a varying image with pronounced edge-effects over the substrate and process variations in time.

The sensitivity of the calculated signal to ROI-positioning errors may be increased; for example, the large edge intensities may be accidentally included into the signal estimation.

The use of the full-scale (of the full dynamic gray-level range) of the detector may be reduced, leading to a reduced reproducibility and sensitivity to systematic non-linear sensor issues at low gray levels.

2. The total area comprising the periodic structures is not maximized within the target region. Therefore, the maximum photon count is not reached (e.g., not optimized for reproducibility).

Figure 13A:
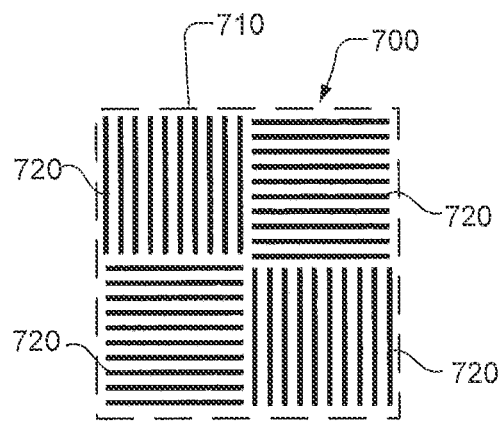
FIG. 13(a) depicts an example of a non-optimized target layout.
Figure 13B:
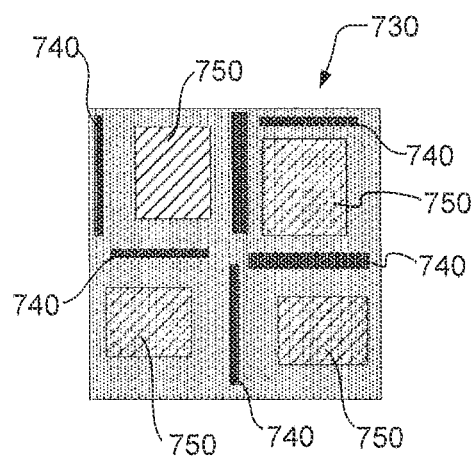
FIG. 13(b) depicts a resulting dark field image of the target layout of FIG. 13(a)

FIG. 13(a) gives an example of a target 700 layout comprising four periodic structures 720. Dashed shape 710 represents the available target area. In FIG. 13(a), the target 700 layout is not optimized for the available target area 710. The number of periodic structure features is calculated as a function of pitches and the available target area 710. Subsequently, the predefined periodic structure features are centered at the predetermined periodic structure midpoint. This results in non-optimized periodic structure to periodic structure distances (i.e. the space between periodic structures is not optimized within the target area). FIG. 13(b) illustrates a resultant dark field image 730 following inspection of the target 700. Regions of medium/high intensity levels 750 can be seen at the periodic structure positions. However, at the periphery of the periodic structures, there are regions of even higher intensity levels 740 resultant from edge effects. This may make the target difficult to analyze using a pattern recognition process, leading to failure-prone pattern recognition.

The measurement apparatus used to measure the target 700 effectively acts as a frequency band filter. When the measurement apparatus measures a single periodic structure 720, it actually detects two structure types. The first structure is that comprising the repeating periodic structure features, having a certain pitch. The second structure is the set of features seen as a single entity having a certain size (half pitch); as these periodic structures are so small, they may be seen as single structures as well as periodic structures. Both of these "structures" give their own sets of Fourier frequencies. If these two sets do not fit together they will create a step Fourier frequency set. The last frequency set has one or more frequencies that pass the band filter of the measurement apparatus. Unfortunately, the intensity of these frequencies is high thereby causing edge effects. In many cases the edge effects result in intensities that are 2 to 4 times greater than the intensity of the maximum intensity grid.

To configure (e.g., optimize) target layout/designs for improved measurement apparatus detection, embodiments described herein propose to use:

1. Configuration (e.g., optimization) of the target layout taking into account the full available target area.
2. Computational lithography modeling using methods similar to optical proximity correction (OPC) to configure (e.g., optimize) the target layout for improved metrology process response (i.e., such configuration in addition to or alternatively to configuration for improved or optimized ability to print the target using a lithographic process). The resultant targets may use one or more measurement tool-driven optical proximity correction (MT-OPC) assist features to aid in improvement or optimization of the metrology process response. In an embodiment, the pitch and/or dimension of the MT-OPC assist features is sub-resolution for the metrology apparatus.

For example, configuration of a target layout may begin by placing one or more MT-OPC assist features at the periphery of the available target area, so as to 'isolate' the target from the environment and to reduce edge effects of periodic structures in a dark field image. The one or more assist features are not observed in the dark field image captured by the measurement apparatus, as their higher diffraction orders are usually not transmitted to the sensor (noting that the zeroth order is also blocked).

Further, the available target area, inside of the one or more MT-OPC assist features, is filled with periodic structure features. For each periodic structure this may be done in the direction towards the center, beginning from the periphery. Periodic structure features may be positioned in this way, while adapting their length, if needed, to fit commensurately with the desired pitches and feature-space values of the neighboring periodic structure. One or more additional MT-OPC assist features may be positioned between the periodic structures to reduce periodic structure edge effects and separate the periodic structures in the dark field image. Consequently, in an embodiment, each periodic structure may have one or more MT-OPC assist features around its whole periphery. Such target layouts help to improve pattern recognition and to limit crosstalk. In an embodiment, the periodic structures of each sub-target of an extended operating range metrology target may be handled separately such that, for example, the periodic structures of one sub-target is processed as described above before the periodic structure of another sub-target.

Thus, the configuration of a full target design may comprise:

1. Configuration (e.g., optimization) of the periodic structures with respect to design restrictions. Such design restrictions depend on the application given a specific product design, for example: feature widths, sub-segmentation, "line on line" or "line on trench", etc.
2. Configuration of the whole target layout for improved or optimum metrology process detection, in some cases using one or more MT-OPC assist features. Sub-segmentation and/or other design restrictions may be applied to the MT-OPC assist features, where appropriate.
3. Performing one or more lithography OPC cycles to the entire target layout to help ensure that the desired target layout devised in steps 1 and 2 can be properly printed.

Configuration of the target may include configuration of any parameter or aspect of the target. This can include, for example, periodic structure pitch, MT-OPC assist feature pitch, length and width of any feature, periodic structure duty cycle, etc. The configuration process takes into account the entire available target region. In addition to or alternatively to using one or more MT-OPC assist features, the length and dimension (e.g., CD) of one or more periodic structure features adjacent to the gap between adjacent periodic structures may be modified. For example, the length of periodic structure features extending toward the gap may be shortened or lengthened. As another example, a periodic structure feature extending along the gap may have its dimension narrowed or widened relative to other features of that periodic structure.

A potential target layout may be evaluated in a suitable measurement apparatus simulation tool. It may require several iterations to arrive at a desired (e.g., optimum) target layout specific for the measurement apparatus configuration.

For example, in each iteration, the configuration of the target layout may be altered to help achieve improved or optimum metrology process detection by, for example, changing the size, placement, number of features, pitch, etc. of the one of more MT-OPC assist features. As will be appreciated, such change in the configuration may be done automatically by the software and/or guided by a user. In an embodiment, the simulation takes account of the different layers of an extended operating range metrology target (e.g., in terms of different refractive indices, thicknesses, etc.). In an embodiment, the simulation takes accounts of a difference in pitch, feature dimension (CD), etc. between sub-targets.

Thus, desirably, this configuration may be carried out in an automated fashion. An 'automated' method includes (not exclusively) (i) one or more accurate optical models that can predict accurately the measurement apparatus response, within an acceptable timeframe and (ii) well-defined criteria for configuration. For example, criteria may include one or more selected from the following:

Periodic structure edge intensities having the same order of magnitude as the periodic structure center intensities.

Minimum variation of edge effects in the presence of overlay, defocus and/or aberrations of the measurement apparatus. In an embodiment, robustness for the measurement recipe (e.g., wavelength, focus, etc.)

Sufficient spacing between the periodic structures for improved or optimum target pattern recognition, for the relevant wavelength range (e.g., spacing $\geq \lambda/2$, with $\lambda$ representing the measurement radiation wavelength). For example, at least 1 line of sensor pixels between the adjacent periodic structure regions that exceed an intensity threshold.

Maximum periodic structure area.

Ideally these criteria are balanced in devising the final target arrangement.

FIG. 14 shows examples of an extended operating range metrology target similar to the design of FIG. 12A. Of course, in an embodiment, a different design of an extended operating range metrology may be used, such as the design of FIG. 9 or of any of FIGS. 12B-E.

Figure 14A:
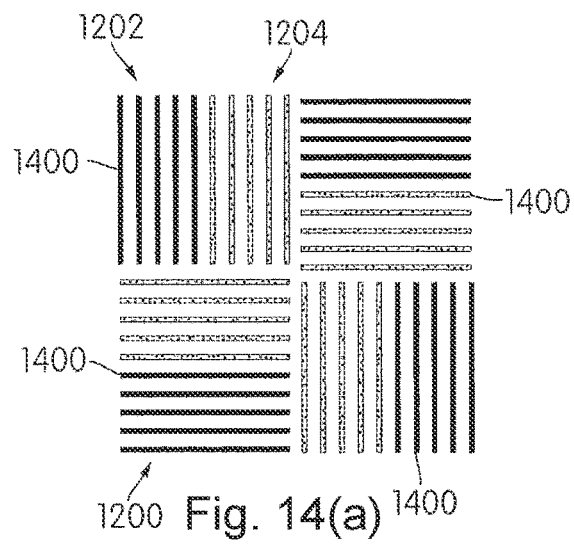
FIGS. 14(a) to (f) illustrate examples of a non-optimized target layout and a target layout according to an embodiment of the invention, and of expected resulting dark field images of these targets using different measurement radiation wavelengths.

FIG. 14(a) shows an example non-optimized target layout 1200 of an extended operating range metrology target comprising two sub-targets 1202 and 1204. The non-optimized target layout 1200 also comprises four periodic structures 1400, each comprising, in this case, a portion of sub-targets 1202 and 1204. Each periodic structure 1400 comprises a plurality of periodic structure features (e.g., grating lines). The number of periodic structure features is calculated as a function of pitch and the total predetermined grating area. Further, the predefined periodic structure features are centered at the predetermined periodic structures midpoint. This results in non-matching and non-optimized periodic structure-to-periodic structure distances for metrology apparatus observation. FIG. 14(c) illustrates an example simulation of a dark field image that may result from the target layout of FIG. 14(a), and which shows clearly visible edge effects. These edge effects can be seen as regions of very high intensity measurements 1430 at the periphery of the periodic structure regions 1440. In FIGS. 14(c) to 14(f), regions with darker shading indicate higher intensities. FIG. 14(e) illustrates a further example simulation of a dark field image that may result from the target layout of FIG. 14(a), using a different wavelength than for the example of FIG. 14(c). It can be seen that the images of the periodic structures in FIG. 14(e) are not clearly delineated and so would not be easily recognized.

Figure 14B:
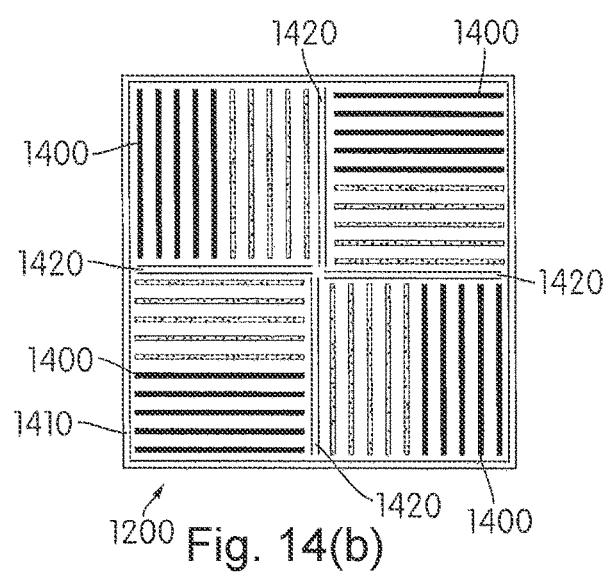
Figure 14C:
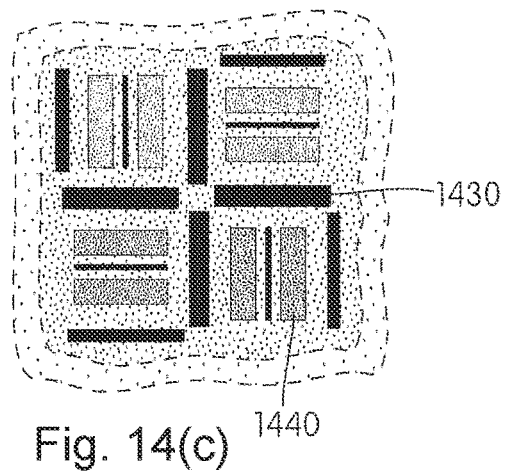
Figure 14D:
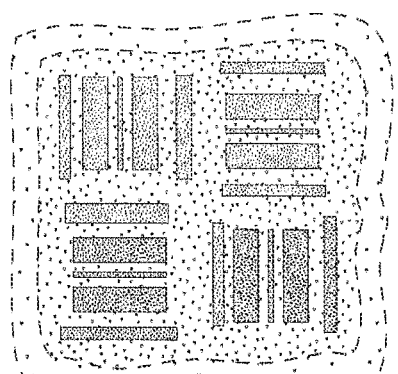
Figure 14E:
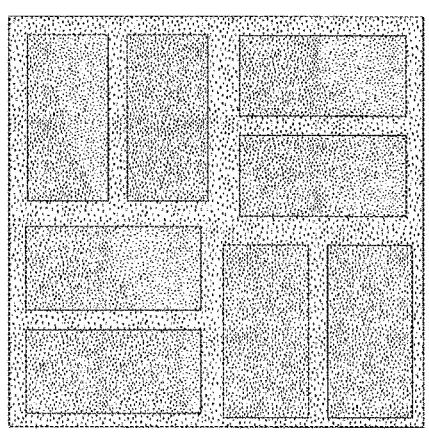
Figure 14F:
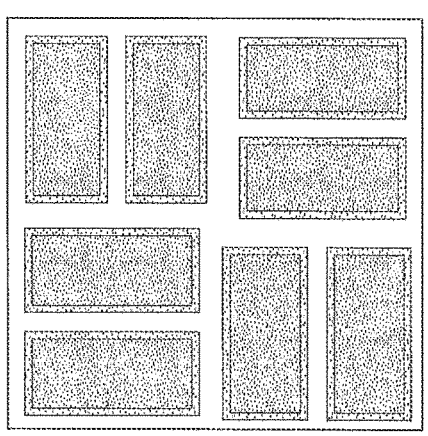

FIG. 14(b) shows an improved version of the target layout 1200 of FIG. 14(a), comprising identical periodic structures 1400 to that of the FIG. 14(a) arrangement, and further comprising one or more MT-OPC assist features 1410, 1420. A first set of one or more MT-OPC assist features 1410 is located at the periphery of the target (e.g., so as to surround it), and a second set of one or more MT-OPC assist features 1420 is located between a plurality of the periodic structures 1400. In an embodiment, each periodic structure 1400 is surrounded by a combination of one or more MT-OPC assist features 1410, 1420. FIG. 14(d) illustrates an example simulation of a dark field image that may result from the target layout of FIG. 14(b), which shows reduced edge effects. FIG. 14(f) illustrates a further example simulation of a dark field image that may result from the target layout of FIG. 14(b), using a different wavelength than for the example of FIG. 14(d). It can be seen that the images of the periodic structures in FIG. 14(e) are fairly clearly delineated and so should be easily recognized.

Thus, a comparison of FIGS. 14(c) and 14(d) shows a far more uniform intensity distribution in the region of each periodic structure, with fewer edge effects, in FIG. 14(d). A comparison of FIGS. 14(e) and 14(f) shows enhanced dark field image resolution of FIG. 14(f) compared to FIG. 14(e), with improved separation of the periodic structures (i.e., lower intensity between periodic structures in FIG. 14(f) when compared to FIG. 14(e)), thus improving dark field pattern recognition.

In this example, the one or more MT-OPC assist features have a small pitch, for example, of the order of 160 nm, resulting in evanescent waves. The one or more MT-OPC assist features provide edge effect reduction and separation of the periodic structure from the environment.

Figure 15:
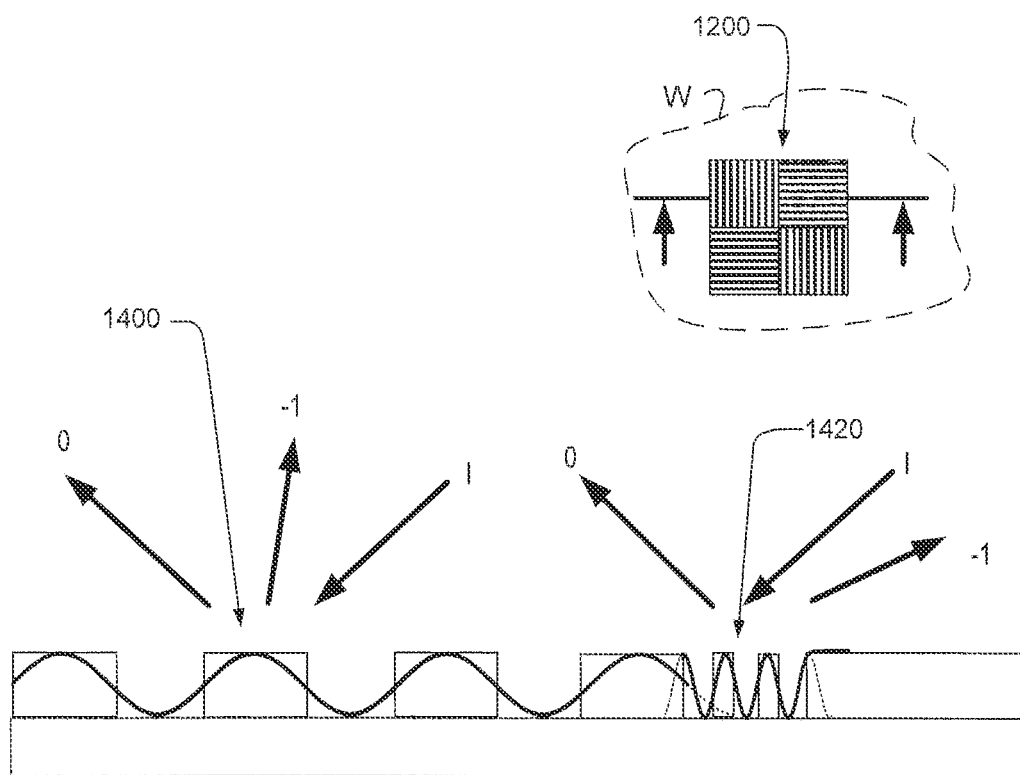
FIG. 15 illustrates a partial cross section of a target according to an embodiment of the invention.

FIG. 15 illustrates a magnified, partial view of a cross section of a target 1200 comprising a periodic structure 1400 and one or more MT-OPC assist features 1420. In an embodiment, the one or more MT-OPC assist features 1420 are positioned in the periodic structure space-feature-space rhythm, avoiding abrupt steps (e.g., sharp, rectangular window). In this way, the one or more assist features 1420 are positioned close to the periodic structure 1400 lines, while breaking the excitations within the periodic structure resultant from its finite dimensions (e.g., softening the edges). FIG. 15 shows a representation of such matched positioning of the basic frequencies in the periodic structures features and in the one or more MT-OPC assist features, next to the neighboring 90°-rotated periodic structure. In this example, the pitch of the MT-OPC assist features is such that diffraction orders associated with the MT-OPC assist features are not transmitted to the detector. While FIG. 15 shows the periodic structure of the one or more MT-OPC assist features 1420 having two features, it will be appreciated it may have just one feature or more than two features.

Ensuring that the periodic structure 1400 and one or more MT-OPC assist features 1420 are in phase with each other helps avoid the "step frequency set" that causes high-intensity edge effects. The periodic structure 1400 and the one or more MT-OPC assist features 1420 being in phase means that the one or more MT-OPC assist features 1420 extend the continuous surface of the periodic structure 1400. While there still are edge effects, those of high intensity are outside of the transmission band of the measurement apparatus and are not detected by it. In this way intensity peaks actually measured by the measurement apparatus are reduced. Thus, in an embodiment, the one or more MT-OPC assist features are strongly coupled to the periodic structures with a spectrum outside the transmission band to the measurement detector.

In an embodiment, the MT-OPC assist features should be in phase with its associated measurement periodic structure (s) but the designs for imaging the periodic structure and measuring the periodic structure may make this not possible. As an example, the design of the sub-targets of an extended operating range metrology target may get into problems with fitting the sub-targets in its constrained area as well as fitting the one or more assist features at the periphery of the sub-targets or between adjacent sub-targets. This issue with MT-OPC assist features may be solved by providing a disruption in the middle of the MT-OPC assist feature. For example, where the MT-OPC assist feature comprises a periodic structure of three or more features, one or more of the middle features may be enlarged. Similarly, where the MT-OPC assist feature comprises a periodic structure of two or more features, one or more of the middle spaces between features may be enlarged. Consequently, the area consumed by the MT-OPC assist feature may be enlarged. The enlargement of the feature and/or space may be other than the middle. The enlargement of the feature and/or space and its location are designed so as to facilitate improved (e.g., as best as possible) matching of the phase.

In an embodiment, for one or more assist features located between adjacent periodic structures, the gap between the periodic structures is the same as or about the same as the cross-wise dimensions (CD) of the features of one or both of the adjacent periodic structures. In an embodiment, for one or more assist features located between adjacent periodic structures, the cross-wise dimension of the spaces between the one or more assist features and the adjacent periodic structures is equal or about equal and in an embodiment, is equal or about equal to the cross-wise dimension between a plurality of the assist features.

In an embodiment, optical waves diffracted from these one or more assist features 1420 nominally do not carry any energy (evanescent or destructively interfering), or are outside the part of the spectrum that is transmitted to the detector (blocked propagating waves). In this example, incident radiation I, diffracted zeroth order radiation 0 and first order radiation −1 is shown. The −1 order radiation diffracted by the one or more assist features 1420 is blocked, and only −1 order radiation diffracted by periodic structure 1400 is transmitted to the sensor. However, due to the finiteness of the one or more assist features 1420, the 'tails' of the assist feature reflections may leak into the spectrum transmitted to the sensor and will interact with the spectrum from the periodic structure features.

For well separated periodic structures in the dark field image, the one or more MT-OPC assist features 1420, in an embodiment, fill a space between the periodic structures that has a width that is at least half the wavelength of the measurement apparatus. The same holds for the separation and crosstalk reduction from the environment on the target.

Figure 16A:
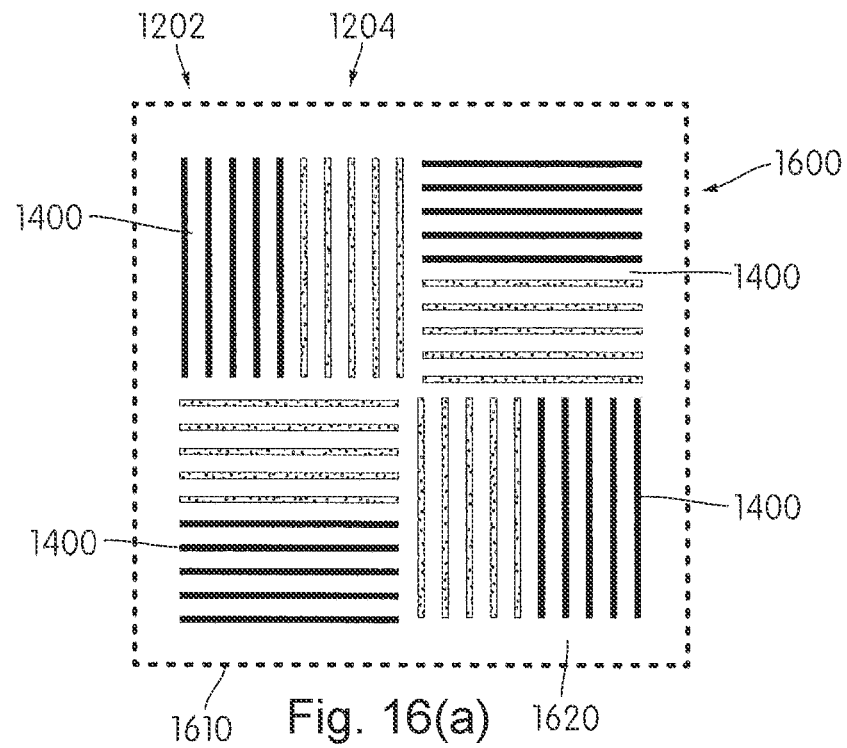
FIG. 16(a) illustrates an example of a non-optimized target layout.
Figure 16B:
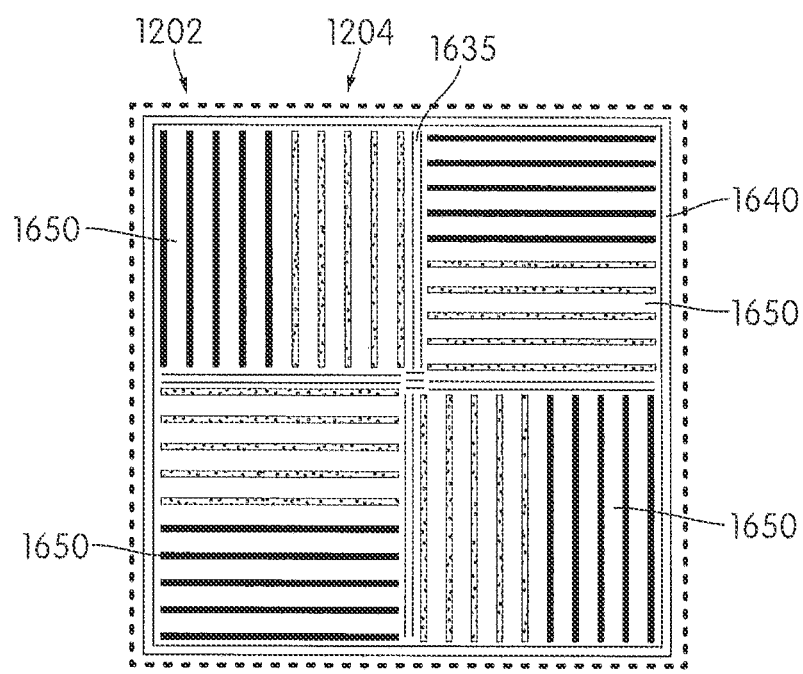
FIG. 16(b) illustrates an example of a target layout according to an embodiment of the invention.

FIG. 16(*a*) shows a target arrangement of an extended operating range metrology target 1600, the target comprising two sub-targets 1202 and 1204. The target 1600 also comprises four periodic structures 1650, each comprising, in this case, a portion of sub-targets 1202 and 1204. The target 1600 occupies, in practice, an area 1610. The target layout includes a 'clearance' region 1620 at the target boundaries, to improve dark field pattern recognition and reduce crosstalk from the environment. In FIG. 16(*b*), the target layout of FIG. 16(*a*) is replaced by a target layout 1630 optimized for the entire target area 1610. The target layout includes one or more MT-OPC assist features 1635 at locations around its periphery, and further one or more MT-OPC assist features 1640 between a plurality of the periodic structures 1650. The MT-OPC assist features 1635, 1640 help ensure dark field pattern recognition performance and optical crosstalk reduction from the environment, such that the 'clearance' region 1620 will not be needed. Therefore, the size, number of features and pitch of each periodic structure 1650 can be configured to the available target area 1610. Corresponding dark field image simulation results (not illustrated) would show a strong reduction in edge effects, while pattern recognition would be improved by the periodic structure to periodic structure separation.

Figure 17:
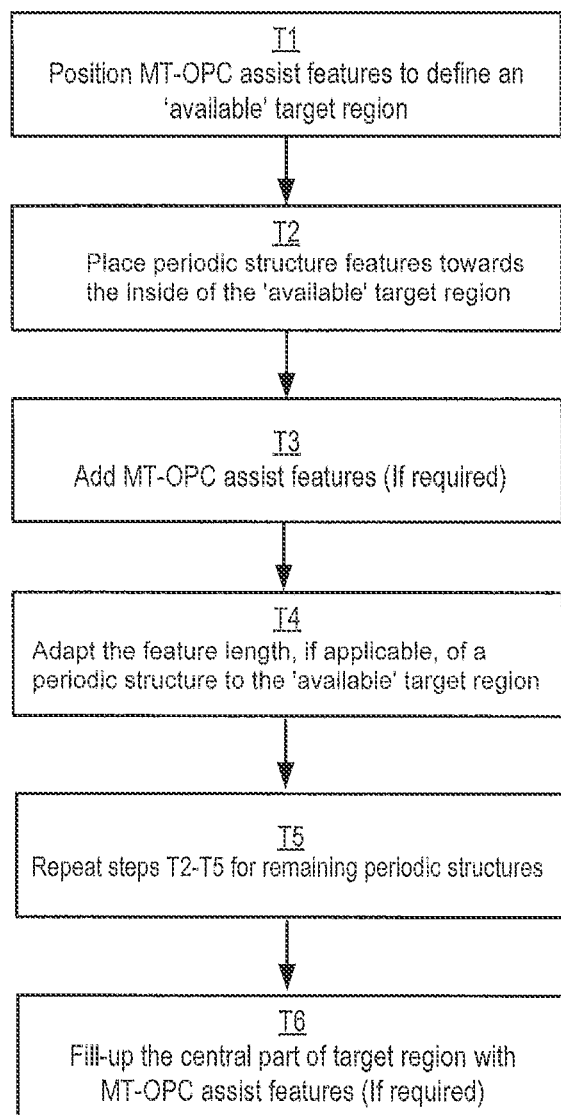
FIG. 17 is a flowchart of a method of devising a target arrangement according to an embodiment of the invention.
Figure 18A:
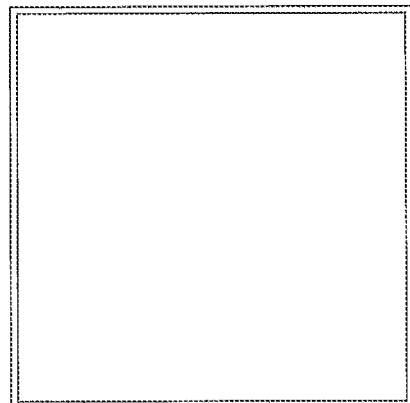
FIGS. 18(a)-(f) illustrate an embodiment of the method depicted in FIG. 17 being performed to devise a target arrangement.
Figure 18B:
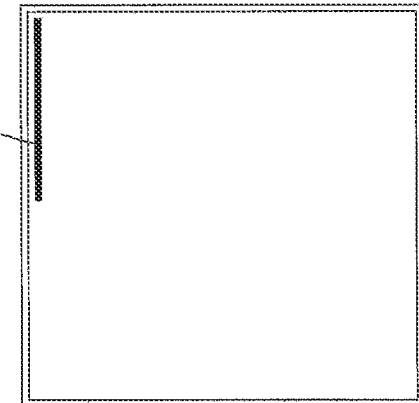
Figure 18C:
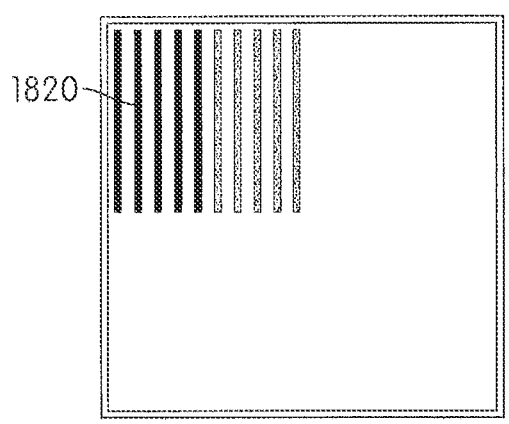
Figure 18D:
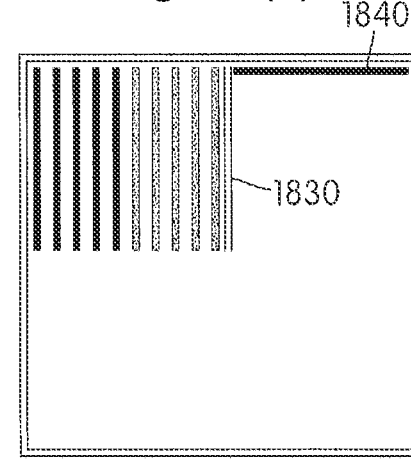
Figure 18E:
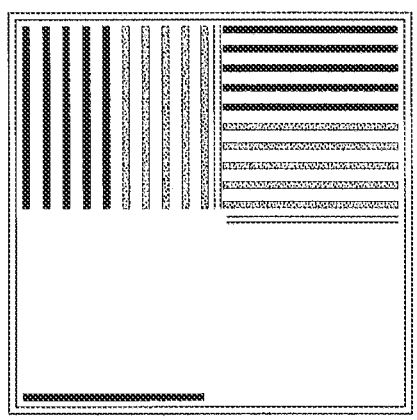
Figure 18F:
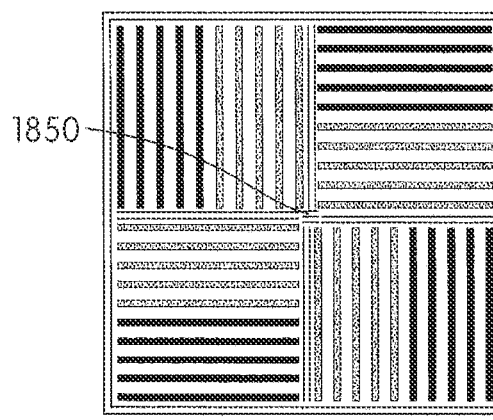

FIG. 17 is a flowchart illustrating a method of devising an extended operating range metrology target arrangement according to an embodiment. The method comprises:

Step T1—Provide one or more MT-OPC assist features, with 'sub-resolution' pitch and/or dimension, for example, near the boundary and/or inside a design target region. This defines an 'available/empty' design target region. The characteristics of the one or more assist features (e.g. feature width, shape . . . ) may be chosen, for example, to efficiently isolate the target from the environment in the dark field image.

Step T2—Based on the one or more MT-OPC assist features placed at the target boundary, place periodic structure features of a first periodic structure (comprising features of one or more of the sub-targets of the extended operating range metrology target) sequentially in a direction towards the inside of the target region, beginning at the boundary. For example, place features until part of the last placed feature is located over a halfway point of the available target area in the periodic structure direction.

Step T3—Add one or more MT-OPC assist features (if needed), having a form based on the size and pitch of adjacent periodic structure features, and further having a 'sub-resolution' pitch and/or dimension.

Step T4—Based on the latter one or more MT-OPC assist features, adapt the feature length, if applicable, of the next periodic structure to the remaining available target region.

Step T5—Repeat steps T2-T4 for the remaining periodic structures.

Step T6—Optionally, fill-up the central part of target region with one or more MT-OPC assist features.

An example application of this method is illustrated in FIG. 18. FIG. 18(*a*) corresponds to step T1. One or more MT-OPC assist features 1810 are drawn close to the border of an available target region, with a pitch chosen to isolate the target from the environment and to reduce periodic structure edge effects. FIGS. 18(*b*) and (*c*) correspond to step T2, with periodic structure feature 1820 placed so as to fill up approximately one quarter of the target region allocated to this periodic structure. FIG. 18(*d*) corresponds to step T3, with one or more further MT-OPC assist features 1830 added, matched to the adjacent periodic structure features. FIG. 18(*d*) also illustrates the beginning of step T4, with the length of feature 1840 having been adapted to the remaining available area. FIG. 18(*e*) corresponds to an intermediate point during step T5, with two periodic structures placed and a third begun. FIG. 18(*f*) illustrates the completed target arrangement, with one or more additional MT-OPC assist features 1850 placed within a central region of the target layout as described in step T6. This method may require several iterations, with each target arrangement obtained at step T6 being evaluated using a metrology simulation tool.

Evaluation may comprise determining whether a particular arrangement meets one or more predefined criteria and/or comparing multiple different arrangements devised in accordance with this method so as to determine the best one (based on one or more predefined criteria).

Instead of filling the central region of the target with one or more additional MT-OPC assist features 1850, this region could be filled with a special target (cross) for performing patterning device writing quality measurements.

Overlay metrology involves two stacked periodic structures (i.e., a two layer target). For such targets, the lower target layout may be devised using the method of FIG. 18. The upper target layout usually contains an overlay bias, ranging from five to several tens of nanometers. In such an arrangement, the upper target layout may simply match the lower target layout, with the exception of the bias(es). In an example, the bias may be applied to only the periodic structure features in the upper target layout, with no bias applied to the one or more MT-OPC assist features in the upper target layout. In an example, MT-OPC assist features may be omitted from the upper target layout, which may help avoid generation of an asymmetric signal perturbing the measurement, and is especially applicable if the back-reflected diffraction of the upper periodic structure is weak and the main back-reflected diffraction originates from the lower periodic structure.

For "line-on-trench" instead of "line-on-line" target configurations, the upper target layout may be inverted, to obtain the "line-on-trench" configuration. For duty-cycles which differ from 50%, it is possible to design the upper target layout as the "line-on-line" version with a reverse duty cycle (100%—duty-cycle), which is then inverted to obtain the "line-on-trench" configuration. The design of MT-OPC assist features in case of duty-cycle differences between upper and lower target layouts may lead to a more complex layout configuration procedure, however, those skilled in the art will be able to implement and customize the present method for such arrangements.

To help ensure printability and compliance with semiconductor manufacturer design rules, the dimensions of the one or more MT-OPC assist features may allow sub-segmentation of the one or more MT-OPC assist features.

The dimensions and/or shape of the one or more MT-OPC assist features may be customized to the needs of the application. For instance, in the example of FIG. 15, the MT-OPC assist features 1420 are represented by 'continuous rectangular' shapes. However, continuous rectangular shapes may lead to electric charging effects on a reticle or a printed circuit at sharp edges. To overcome this issue, shapes edges may be 'deleted' from the layout.

In the above mentioned examples, the one or more MT-OPC assist features are 'sub-resolution' (i.e., have a smaller resolution than that of product features). However, the one or more MT-OPC assist features may have dimensions below, within or above the resolution of the sensor, depending on the application. For example, the one or more outer MT-OPC assist features can be adapted to structures located in the area around the target (e.g., device features). Where the pitch of the features around the target is below or outside the range of detection of the metrology apparatus or the features around the target are about the same size as the MT-OPC assist feature, then there may be no change in the MT-OPC assist feature required. Where the pitch of the features in the area around the target is within the range of detection of the metrology apparatus or the features around the target are not about the same size as the nominal MT-OPC assist feature, then the MT-OPC assist feature may be changed in size (e.g., larger) to suppress the effect of one or more features in the area around the target.

The present method for configuring a target layout/design may be applied, for example, during design/configuration processes of metrology targets for all metrology applications (including alignment). For example, the present method may be applied to alignment targets used in overlay correction systems and/or in advanced alignment systems.

As shown in the above examples, one or more MT-OPC assist features may be placed at the target boundary and/or may be placed around a periodic structure in order reduce edge effects. In addition to this, one or more MT-OPC assist features may be placed between the periodic structure features (e.g. for a large pitch periodic structure such as an alignment periodic structure) in order to sharpen or soften feature-space transitions. This may help enhancement of the diffraction efficiency into desirable orders by improving or optimizing the intrinsic diffraction efficiency for the detected orders, or improving or optimizing the ordering of energy into the relevant diffraction orders. This may aid detectability for low 'substrate quality' stacks. Furthermore, the gain set point in alignment sensor electronics may be improved, particularly for low substrate quality stacks, during the read-out and scanning over the target.

Further, the one or more MT-OPC assist features need not be located in the same layers as a periodic structure. For example, the one or more MT-OPC assist features may be located in a different layer desirably above, but also possibly below, the applicable periodic structure. Having the MT-OPC assist features in a different layer may facilitate manufacturability (e.g., the MT-OPC assist features may not be printable using the projection settings use to print the periodic structure, which may be the projection settings to print a device pattern).

Further, while the embodiment of MT-OPC assist features have been described as specific uniform periodic structures adjacent or between the target periodic structures, the MT-OPC assist features may take other forms. For example, the assist features may take a form as described in United States Patent Application Publication No. 2013-0271740, which is incorporated herein in its entirety by reference.

The present method may be combined with current methods for improving parameter estimation in, for example, dark field metrology.

The methods disclosed above result in larger ROIs and consequently, larger photon counts during intensity measurements. This improves the reproducibility for a constant target region. Improved reproducibility may also result from the reduction of edge effects, reducing inaccuracy in ROI positioning. In addition, reduction of edge effects improves pattern recognition as a consequence of a better defined dark field target image. Furthermore, the full gray scale dynamic range of the measurement apparatus sensor may be used as edge effects will not saturate the dark field image. Consequently, reproducibility is further improved and non-linear sensor effects which result from photon noise at low intensities are avoided. Photon noise is the square root of the number of measured photons. The number of measured photons is the product of the number of used pixels, the gray level and the sensitivity. To obtain a more stable measurement either the number of pixels or number of gray levels needs to be increased; sensor sensitivity is fixed. By using one or more MT-OPC assist features, more gray levels can be obtained.

Adding one or more MT-OPC assist features to individual periodic structures improves the isolation from the in-die environment when distributing each periodic structure separately among device structures. The flexibility for in-die placement of the targets/periodic structures is therefore improved due to the isolation of the periodic structures from the surroundings.

Further, by the use of one or more MT-OPC assist features, the target region may be reduced (i.e. smaller target dimensions) while keeping a same reproducibility. Reduced target dimensions enable denser intra-field measurements. This improves, e.g., higher order overlay corrections over the die on on-product substrate and lithographic apparatus performance characterization.

An embodiment of one or more these MT-OPC assist feature techniques may be implemented at, for example, module 1312 of FIG. 19 and/or implemented at blocks B2-B5 of FIG. 20.

Figure 21:
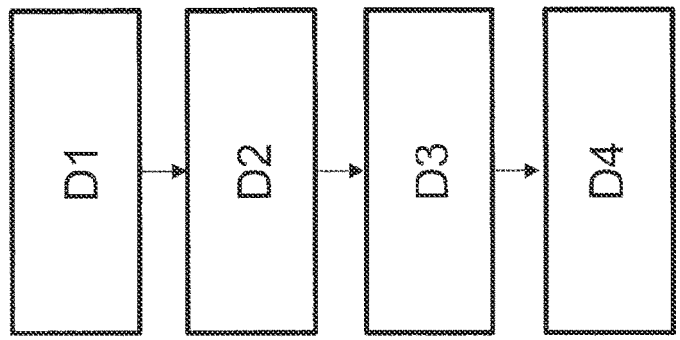
FIG. 21 depicts a flowchart illustrating a process in which the extended operating range metrology target is used to monitor performance, and as a basis for controlling metrology, design and/or production processes according to an embodiment of the invention.

FIG. 21 shows a flowchart illustrating a process in which the extended operating range metrology target is used to monitor performance, and as a basis for controlling metrology, design and/or production processes. In step D1, substrates are processed to produce product features and one or more extended operating range metrology targets as described herein. At step D2, lithographic process parameter (e.g., overlay) values are measured and calculated using, e.g., the method of FIG. 6. At step D3, the measured lithographic process parameter (e.g., overlay) value is used (together with other information as may be available), to update a metrology recipe. The updated metrology recipe is used for re-measurement of the lithographic process parameter, and/or for measurement of the lithographic process parameter on a subsequently processed substrate. In this way, the calculated lithographic process parameter is improved in accuracy. The updating process can be automated if desired. In step D4, the lithographic process parameter value is used to update a recipe that controls the lithographic patterning step and/or other process step in the device manufacturing process for re-work and/or for processing of further substrates. Again this updating can be automated if desired.

While the embodiments of extended operating range metrology target described herein have mostly been described in the terms of overlay measurement, the embodiments of the extended operating range metrology target described herein may be used to measure one or more additional or alternative lithographic process parameters. For example, the extended operating range metrology target may be used to measure exposure dose variation, measure exposure focus/defocus, etc. Thus, in an embodiment, the same extended operating range metrology target may be used to measure a plurality of different parameters. For example, the extended operating range metrology target may be arranged to measure overlay and measure one or more other parameters such as critical dimension, focus, dose, etc. As an example, one or more of the sub-targets may be designed to measure overlay (e.g., have their associated periodic structures in different layers) and one or more other sub-targets may be designed to measure critical dimension, and/or focus, and/or dose, etc. In an embodiment, a particular sub-target may be designed to measure two or more parameters, e.g., overlay and one or more other parameters such as critical dimension, focus, dose, etc.

In an embodiment, the periodic structures are desirably longer than wide as, for example, shown in FIG. 14(A). FIG. 14(A) depicts each of the periodic structures of sub-target 1202 and 1204 as being longer than its width. Such an arrangement helps reduce crosstalk between the X and Y directions. For smaller periodic structures as desired for, e.g., an extended operating range metrology target, the crosstalk tends to be stronger because the ratio between grating sides and total surface area is larger. The area that causes crosstalk is 0.5 times the wavelength times the grating side times 2. Accordingly, longer than wide periodic structures tend to reduce cross-talk and thus may be more advantageous.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target periodic structure' as used herein do not require that the structure has been provided specifically for the measurement being performed. Further, pitch P of the metrology target is close to the resolution limit of the optical system of the scatterometer, but may be much larger than the dimension of typical product features made by lithographic process in the target portions C. In practice the features and/or spaces of the overlay periodic structures may be made to include smaller structures similar in dimension to the product features.

In certain embodiment, the periodic structures of the sub-targets of an extended operating range metrology target may be rotationally symmetric. That is there may be two or more sub-targets (e.g., three or more, four or more, etc.) of the extended operating range metrology target, wherein the sub-targets are configured to share a common center of symmetry and each sub-target is invariant to 180 degree or more rotation about the common center of symmetry. Further, each sub-target may include two or more periodic structures (e.g., three or more, four or more, etc.), wherein each of the periodic structures has an individual center of symmetry and each periodic structure is invariant to 180 degree or more rotation about the individual center of symmetry.

But, in an embodiment, the periodic structures of the sub-targets of an extended operating range metrology target may be rotationally asymmetric. This may be accomplished in any of a number of ways. For example, a sub-target of three of more sub-targets may be shifted (located) away from a common center of symmetry of the other sub-targets. As another example, one or more of the features of one or more of the periodic structures of a sub-target may be slightly shortened, lengthened or shifted relative to one or more of the features of one or more other periodic structures of the sub-target or relative to one or more of the features of one or more periodic structures of another sub-target. As another example, one or more dummy structures may be inserted between periodic structures of a sub-target or between sub-targets to disrupt any symmetry. In an embodiment, the one or more dummy structures are rotationally asymmetric. The shift, shortening or lengthening may be below the measurable range of the measurement apparatus. In an embodiment, the shift, shortening or lengthening is in the 1 nm range or less. Such a change will have small to negligible effect on measurement readings. Similarly, the dummy structures may have feature size or pitch below the effective measurement range of the measurement apparatus. In an embodiment, the assist feature described herein may be such a dummy structure.

The term "structure" is used herein without limitation to any particular form of structure such as a simple grating line. Indeed, coarse structural features, such as the lines and spaces of a grating, can be formed by collections of finer sub-structures.

In association with the physical periodic structures of the targets as realized on substrates and patterning devices, an embodiment may include a computer program containing one or more sequences of machine-readable instructions describing a method of designing a target for a substrate, a method of producing a target on a substrate, a method of measuring a target on a substrate and/or a method of analyzing a measurement to obtain information about a lithographic process. An embodiment may comprise computer code containing one or more sequences of machine-readable instructions or data describing the target. This computer program or code may be executed for example within unit PU in the apparatus of FIG. 3 and/or the control unit LACU of FIG. 2. There may also be provided a data storage medium (e.g., semiconductor memory, magnetic or optical disk, etc.) having such a computer program or code stored therein. Where an existing metrology apparatus, for example of the type shown in FIG. 3, is already in production and/or in use, an embodiment of the invention can be implemented by the provision of an updated computer program product for causing a processor to perform one or more of the method described herein. The computer program or code may optionally be arranged to control the optical system, substrate support and the like to perform a method of measuring a parameter of the lithographic process on a suitable plurality of targets. The computer program or code can update the lithographic and/or metrology recipe for measurement of further substrates. The computer program or code may be arranged to control (directly or indirectly) the lithographic apparatus for the patterning and processing of further substrates.

Further embodiments according to the invention can be found in below numbered clauses:

1. A method of measuring a parameter of a lithographic process, the method comprising:
    illuminating a diffraction measurement target on a substrate with radiation, the measurement target comprising at least a first sub-target and at least a second sub-target, wherein the first and second sub-targets each comprise a pair of periodic structures and wherein the first sub-target has a different design than the second sub-target, the different design comprising the first sub-target periodic structures having a different pitch, feature width, space width, and/or segmentation than the second sub-target periodic structures; and
    detecting radiation scattered by at least the first and second sub-targets to obtain for that target a measurement representing the parameter of the lithographic process.
2. The method of clause 1, wherein the first sub-target at least partly overlays a fifth periodic structure and the second sub-target at least partly overlays a sixth periodic structure, wherein the fifth periodic structure is at a different layer on the substrate than the sixth periodic structure.
3. The method of clause 1 or clause 2, wherein features of the pair of periodic structures of each of the first and second sub-targets extend in a same direction.
4. The method of clause 1 or clause 2, wherein the first and second sub-targets each comprise a first pair of periodic structures having features extending in a first direction and a second pair of periodic structures having features extending in a second different direction.
5. The method of clause 2, wherein the first and second sub-targets each comprise a first pair of periodic structures having features extending in a first direction and a second pair of periodic structures having features extending in a second different direction, wherein the fifth periodic structure has features extending in the first direction and the sixth periodic structure has features extending in the second direction.
6. The method of any of clauses 1-5, further comprising at least a third sub-target and at least a fourth sub-target, wherein the third and fourth sub-targets each comprise a pair of periodic structures.
7. The method of clause 6, wherein the third sub-target at least partly overlays a ninth periodic structure and the fourth sub-target at least partly overlays a tenth periodic structure, wherein the ninth periodic structure is at a different layer on the substrate than the tenth periodic structure.
8. The method of clause 6 or clause 7, wherein the third and fourth sub-targets each comprise a first pair of periodic structures having features extending in a first direction and a second pair of periodic structures having features extending in a second different direction.
9. The method of clause 7, wherein the third and fourth sub-targets each comprise a first pair of periodic structures having features extending in a first direction and a second pair of periodic structures having features extending in a second different direction, wherein the ninth periodic structure has features extending in the first direction and the tenth periodic structure has features extending in the second direction.
10. The method of any of clauses 1-9, wherein the parameter of the lithographic process comprises overlay.
11. The method of any of clauses 1-10, wherein illuminating comprising illuminating a measurement spot on the diffraction measurement target that covers at one time at least part of each of the periodic structures of the first and second sub-targets.
12. The method of any of clauses 1-11, wherein at least part of each of the periodic structures of the first and second sub-targets is within a contiguous area of less than or equal to 1000 $\mu m^2$ on the substrate.
13. The method of any of clauses 1-11, wherein at least part of each of the periodic structures of the first and second sub-targets is within a contiguous area of less than or equal to 400 $\mu m^2$ on the substrate.
14. The method of any of clauses 1-13, wherein each of the sub-targets is designed for a different process stack for the substrate.
15. The method of any of clauses 1-14, wherein each of the sub-targets is designed for a different layer-pair for multiple layer overlay measurement.
16. A diffraction measurement target comprising at least a first sub-target and at least a second sub-target, wherein the first and second sub-targets each comprise a pair of periodic structures and wherein the first sub-target has a different design than the second sub-target, the different design comprising the first sub-target periodic structures having a different pitch, feature width, space width, and/or segmentation than the second sub-target periodic structures.
17. The target of clause 16, wherein, when on a substrate, the first sub-target at least partly overlays a fifth periodic structure and the second sub-target at least partly overlays a sixth periodic structure, and the fifth periodic structure is at a different layer than the sixth periodic structure.
18. The target of clause 16 or clause 17, wherein features of the pair of periodic structures of each of the first and second sub-targets extend in a same direction.
19. The target of clause 16 or clause 17, wherein the first and second sub-targets each comprise a first pair of periodic structures having features extending in a first direction and a second pair of periodic structures having features extending in a second different direction.
20. The target of clause 17, wherein the first and second sub-targets each comprise a first pair of periodic structures having features extending in a first direction and a second pair of periodic structures having features extending in a second different direction, wherein the fifth periodic structure has features extending in the first direction and the sixth periodic structure has features extending in the second direction.
21. The target of any of clauses 16-20, further comprising at least a third sub-target and at least a fourth sub-target, wherein the third and fourth sub-targets each comprise a pair of periodic structures.
22. The target of clause 21, wherein, when on a substrate, the third sub-target at least partly overlays a ninth periodic structure and the fourth sub-target at least partly overlays a tenth periodic structure, and the ninth periodic structure is at a different layer than the tenth periodic structure.
23. The target of clause 21 or clause 22, wherein the third and fourth sub-targets each comprise a first pair of periodic structures having features extending in a first direction and a second pair of periodic structures having features extending in a second different direction.
24. The target of clause 22, wherein the third and fourth sub-targets each comprise a first pair of periodic structures having features extending in a first direction and a second pair of periodic structures having features extending in a second different direction, wherein the ninth periodic structure has features extending in the first direction and the tenth periodic structure has features extending in the second direction.
25. The target of any of clauses 16-24, wherein, when on a substrate, at least part of each of the periodic structures of the first and second sub-targets is within a contiguous area of less than or equal to 1000 $\mu m^2$ on the substrate.
26. The target of any of clauses 16-24, wherein, when on a substrate, at least part of each of the periodic structures of the first and second sub-targets is within a contiguous area of less than or equal to 400 $\mu m^2$ on the substrate.
27. A method of measuring a parameter of a lithographic process, the method comprising:
illuminating a diffraction measurement target on a substrate with radiation, the measurement target comprising at least a first sub-target and at least a second sub-target in a first layer, wherein the first sub-target comprises a first periodic structure and the second sub-target comprises a second periodic structure, wherein a third periodic structure is located at least partly underneath the first periodic structure in a second different layer under the first layer and there being no periodic structure underneath the second periodic structure in the second layer, and wherein a fourth periodic structure is located at least partly underneath the second periodic structure in a third different layer under the second layer; and
detecting radiation scattered by at least the first through fourth periodic structures to obtain for that target a measurement representing the parameter of the lithographic process.
28. The method of clause 27, wherein the first sub-target has a different design than the second sub-target.
29. The method of clause 28, wherein the different design comprises the first sub-target having a different pitch, feature width, space width, and/or segmentation than the second sub-target.
30. The method of any of clauses 27-29, wherein the first and second sub-targets each comprise a further periodic structure having features extending in a second direction different to a first direction in which the features of the first and second periodic structures respectively extend.
31. The method of any of clauses 27-29, wherein the second periodic structure has features extending in a different second direction to a first direction in which features of the first periodic structure extends.
32. The method of clause 30 or clause 31, wherein the third periodic structure has features extending in the first direction and the fourth periodic structure has features extending in the second direction.
33. The method of any of clauses 27-29, wherein features of the periodic structures of each of the first and second sub-targets and of the third and fourth periodic structures extend in a same direction.
34. The method of any of clauses 27-33, further comprising at least a third sub-target and at least a fourth sub-target, wherein the third and fourth sub-targets each comprise a periodic structure.
35. The method of clause 34, wherein the third sub-target at least partly overlays a fifth periodic structure on the substrate and the fourth sub-target at least partly overlays a sixth periodic structure on the substrate, wherein the fifth periodic structure is at a different layer than the sixth periodic structure.
36. The method of clause 34 or clause 35, wherein the third sub-target comprises a periodic structure having features extending in a first direction and the fourth sub-target comprises a periodic structure having features extending in a second different direction.
37. The method of clause 35, wherein the third sub-target comprises a periodic structure having features extending in a first direction and the fourth sub-target comprises a periodic structure having features extending in a second different direction, wherein the fifth periodic structure has features extending in the first direction and the sixth periodic structure has features extending in the second direction.
38. The method of any of clauses 27-37, wherein the parameter of the lithographic process comprises overlay.
39. The method of any of clauses 27-38, wherein illuminating comprising illuminating a measurement spot on the diffraction measurement target that covers at one time at least part of each of the periodic structures of the first and second sub-targets.
40. The method of any of clauses 27-39, wherein at least part of each of the periodic structures of the first and second sub-targets is within a contiguous area of less than or equal to 1000 $\mu m^2$ on the substrate.
41. The method of any of clauses 27-39, wherein at least part of each of the periodic structures of the first and second sub-targets is within a contiguous area of less than or equal to 400 $\mu m^2$ on the substrate.
42. The method of any of clauses 27-41, wherein each of the sub-targets is designed for a different process stack for the substrate.
43. The method of any of clauses 27-42, wherein each of the sub-targets is designed for a different layer-pair for multiple layer overlay measurement.
44. A diffraction measurement target comprising at least a first sub-target and at least a second sub-target that, when on a substrate, are in a first layer, wherein the first sub-target comprises a first periodic structure and the second sub-target comprises a second periodic structure, and comprising a third periodic structure, when on the substrate, located at least partly underneath the first periodic structure in a second different layer under the first layer and there being no periodic structure underneath the second periodic structure in the second layer, and comprising a fourth periodic structure, when on the substrate, located at least partly underneath the second periodic structure in a third different layer under the second layer.

45. The target of clause 44, wherein the first sub-target has a different design than the second sub-target.

46. The target of clause 45, wherein the different design comprises the first sub-target having a different pitch, feature width, space width, and/or segmentation than the second sub-target.

47. The target of any of clauses 44-46, wherein the first and second sub-targets each comprise a further periodic structure having features extending in a second direction different to a first direction in which the features of the first and second periodic structures respectively extend.

48. The target of any of clauses 44-47, wherein the second periodic structure has features extending in a different second direction to a first direction in which features of the first periodic structure extends.

49. The target of clause 47 or clause 48, wherein the third periodic structure has features extending in the first direction and the fourth periodic structure has features extending in the second direction.

50. The target of any of clauses 44-46, wherein features of the periodic structures of each of the first and second sub-targets and of the third and fourth periodic structures extend in a same direction.

51. The target of any of clauses 46-50, further comprising at least a third sub-target and at least a fourth sub-target, wherein the third and fourth sub-targets each comprise a periodic structure.

52. The target of clause 51, wherein, when on a substrate, the third sub-target at least partly overlays a fifth periodic structure on the substrate and the fourth sub-target at least partly overlays a sixth periodic structure on the substrate, and the fifth periodic structure is at a different layer than the sixth periodic structure.

53. The target of clause 51 or clause 52, wherein the third sub-target comprises a periodic structure having features extending in a first direction and the fourth sub-target comprises a periodic structure having features extending in a second different direction.

54. The target of clause 52, wherein the third sub-target comprises a periodic structure having features extending in a first direction and the fourth sub-target comprises a periodic structure having features extending in a second different direction, wherein the fifth periodic structure has features extending in the first direction and the sixth periodic structure has features extending in the second direction.

55. The target of any of clauses 44-54, wherein, when on the substrate, at least part of each of the periodic structures of the first and second sub-targets is within a contiguous area of less than or equal to 1000 μm².

56. The target of any of clauses 44-55, wherein, when on the substrate, at least part of each of the periodic structures of the first and second sub-targets is within a contiguous area of less than or equal to 400 μm².

57. A method of measuring a parameter of a lithographic process, the method comprising:
    illuminating a diffraction measurement target on a substrate with radiation, the measurement target comprising at least a first sub-target and at least a second sub-target, wherein the first and second sub-targets each comprise a first pair of periodic structures having features extending in a first direction and a second pair of periodic structures having features extending in a second different direction, and wherein the first sub-target has a different design than the second sub-target; and
    detecting radiation scattered by at least the first and second sub-targets to obtain for that target a measurement representing the parameter of the lithographic process.

58. The method of clause 57, wherein at least one of the periodic structures of the first sub-target has a first period and a first feature or space width, wherein at least one of the periodic structures of the second sub-target has a second period and a second feature or space width, and wherein the different design comprises the first period, the first feature or space width, or both, being different than respectively the second period, the second feature or space width, or both.

59. The method of clause 57 or clause 58, wherein the first sub-target at least partly overlays a ninth periodic structure and the second sub-target at least partly overlays a tenth periodic structure, wherein the ninth periodic structure is at a different layer on the substrate than the tenth periodic structure.

60. The method of clause 59, wherein features of the ninth periodic structure extend in the first direction and features of the tenth periodic structure extend in the second direction.

61. The method of clause 60, further comprising at least a third sub-target and at least a fourth sub-target, wherein the third and fourth sub-targets each comprise a periodic structure.

62. The method of clause 61, wherein the third sub-target at least partly overlays a thirteenth periodic structure and the fourth sub-target at least partly overlays a fourteenth periodic structure, wherein the thirteenth periodic structure is at a different layer on the substrate than the fourteenth periodic structure and thirteenth and fourteenth periodic structures are at different layers than the ninth and tenth periodic structures.

63. The method of any of clauses 57-62, wherein the measurement target fits within an area of 400 μm².

64. The method of any of clauses 57-63, wherein the parameter of the lithographic process comprises overlay.

65. The method of any of clauses 57-64, wherein each of the sub-targets is designed for a different process stack for the substrate.

66. The method of any of clauses 57-65, wherein illuminating comprising illuminating a measurement spot on the diffraction measurement target that covers at one time at least part of each of the periodic structures of the first and second sub-targets.

67. A diffraction measurement target comprising at least a first sub-target and at least a second sub-target, wherein the first and second sub-targets each comprise a first pair of periodic structures having features extending in a first direction and a second pair of periodic structures having features extending in a second different direction, and wherein the first sub-target has a different design than the second sub-target.

68. The target of clause 67, wherein, when on a substrate, the first sub-target at least partly overlays a ninth periodic structure and the second sub-target at least partly overlays a tenth periodic structure, and the ninth periodic structure is at a different layer on the substrate than the tenth periodic structure.

69. The target of clause 68, wherein features of the ninth periodic structure extend in the first direction and features of the tenth periodic structure extend in the second direction.

70. The target of clause 69, further comprising at least a third sub-target and at least a fourth sub-target, wherein the third and fourth sub-targets each comprise a periodic structure.
72. The target of clause 70, wherein, when on a substrate, the third sub-target at least partly overlays a thirteenth periodic structure and the fourth sub-target at least partly overlays a fourteenth periodic structure, wherein the thirteenth periodic structure is at a different layer on the substrate than the fourteenth periodic structure and thirteenth and fourteenth periodic structures are at different layers than the ninth and tenth periodic structures.
73. The target of any of clauses 67-72, wherein, when on a substrate, the measurement target fits within an area of 400 μm².
74. The target of any of clauses 67-73, wherein at least one of the periodic structures of the first sub-target has a first period and a first feature or space width, wherein at least one of the periodic structures of the second sub-target has a second period and a second feature or space width, and wherein the different design comprises the first period, the first feature or space width, or both, being different than respectively the second period, the second feature or space width, or both.
75. The target of any of clauses 67-74, wherein each of the sub-targets is designed for a different process stack for a lithographic substrate.
76. A method of measuring a parameter of a lithographic process, the method comprising:
    illuminating a diffraction measurement target on a substrate with radiation, the measurement target comprising at least a first sub-target and at least a second sub-target, wherein the first and second sub-targets each comprise a first pair of periodic structures having features extending in a first direction and a second pair of periodic structures having features extending in a second different direction, and wherein at least part of each of the periodic structures of the first and second sub-targets is within a contiguous area of less than or equal to 1000 μm² on the substrate; and
    detecting radiation scattered by at least the first and second sub-targets to obtain for that target a measurement representing the parameter of the lithographic process.
77. The method of clause 76, wherein the first sub-target has a different design than the second sub-target.
78. The method of clause 77, wherein the different design comprises the first sub-target having a different pitch, feature width, space width, and/or segmentation than the second sub-target.
79. The method of any of clauses 76-78, wherein the first sub-target at least partly overlays a ninth periodic structure and the second sub-target at least partly overlays a tenth periodic structure, wherein the ninth periodic structure is at a different layer on the substrate than the tenth periodic structure.
80. The method of clause 79, wherein features of the ninth periodic structure extend in the first direction and features of the tenth periodic structure extend in the second direction.
81. The method of clause 80, further comprising at least a third sub-target and at least a fourth sub-target, wherein the third and fourth sub-targets each comprise a periodic structure.
82. The method of clause 81, wherein the third sub-target at least partly overlays a thirteenth periodic structure and the fourth sub-target at least partly overlays a fourteenth periodic structure, wherein the thirteenth periodic structure is at a different layer on the substrate than the fourteenth periodic structure and thirteenth and fourteenth periodic structures are at different layers than the ninth and tenth periodic structures.
83. The method of any of clauses 76-82, wherein the parameter of the lithographic process comprises overlay.
84. The method of any of clauses 76-83, wherein illuminating comprising illuminating a measurement spot on the diffraction measurement target that covers at one time at least part of each of the periodic structures of the first and second sub-targets.
85. The method of any of clauses 76-84, wherein at least part of each of the periodic structures of the first and second sub-targets is within a contiguous area of less than or equal to 400 μm² on the substrate.
86. The method of any of clauses 76-85, wherein each of the sub-targets is designed for a different process stack for the substrate.
87. The method of any of clauses 76-86, wherein each of the sub-targets is designed for a different layer-pair for multiple layer overlay measurement.
88. A diffraction measurement target comprising at least a first sub-target and at least a second sub-target, wherein the first and second sub-targets each comprise a first pair of periodic structures having features extending in a first direction and a second pair of periodic structures having features extending in a second different direction, and wherein at least part of each of the periodic structures of the first and second sub-targets is within a contiguous area of less than or equal to 1000 μm² on a substrate.
89. The target of clause 88, wherein the second sub-target has a different design than the first-sub target.
90. The target of clause 88 or clause 89, wherein, when on a substrate, the first sub-target at least partly overlays a ninth periodic structure and the second sub-target at least partly overlays a tenth periodic structure, and the ninth periodic structure is at a different layer on the substrate than the tenth periodic structure.
91. The target of clause 90, wherein features of the ninth periodic structure extend in the first direction and features of the tenth periodic structure extend in the second direction.
92. The target of clause 91, further comprising at least a third sub-target and at least a fourth sub-target, wherein the third and fourth sub-targets each comprise a periodic structure.
93. The target of clause 92, wherein, when on a substrate, the third sub-target at least partly overlays a thirteenth periodic structure and the fourth sub-target at least partly overlays a fourteenth periodic structure, wherein the thirteenth periodic structure is at a different layer on the substrate than the fourteenth periodic structure and thirteenth and fourteenth periodic structures are at different layers than the ninth and tenth periodic structures.
94. The target of any of clauses 88-93, wherein, when on the substrate, at least part of each of the periodic structures of the first and second sub-targets is within a contiguous area of less than or equal to 400 μm².
95. A method of metrology target design, the method comprising:
    receiving an indication for the design of a diffractive metrology target having a plurality of sub-targets, each sub-target comprising a first pair of periodic structures having features extending in a first direction and a second pair of periodic structures having features extending in a second different direction;
    receiving a constraint on the area, a dimension, or both, of the diffractive metrology target; and selecting, by a processor, a design of the diffractive metrology target based at least on the constraint.

96. The method of clause 95, wherein the constraint on the area, a dimension, or both, of the diffractive metrology target comprises at least part of each of the periodic structures of the first and second sub-targets is within a contiguous area of less than or equal to 1000 µm² on the substrate.

97. The method of clause 95 or clause 96, further comprising receiving information regarding at least two different process stacks and wherein the design of the diffractive metrology target comprises each of the sub-targets being designed for a different process stack.

98. The method of any of clauses 95-97, further comprising receiving information regarding multiple layer-pairs to be measured by the diffractive metrology target and wherein the design of the diffractive metrology target comprises each of the sub-targets being designed for a different layer-pair.

99. The method of any of clauses 95-98, wherein the design of the diffractive metrology target comprises the first sub-target having a different pitch, feature width, space width, and/or segmentation than the second sub-target.

100. A method comprising:
illuminating with radiation a diffraction measurement target on a substrate, the measurement target comprising at least a first sub-target, a second sub-target and a third sub-target, wherein the first, second and third sub-targets are different in design.

101. The method of clause 100, wherein the different design comprises one of the first to third sub-targets having a different pitch, feature width, space width, and/or segmentation than another of the first to third sub-targets.

102. The method of clause 100 or clause 101, wherein the first sub-target at least partly overlays a first periodic structure, the second sub-target at least partly overlays a second periodic structure, and the second sub-target at least partly overlays a second periodic structure, wherein the first periodic structure is at a different layer on the substrate than the second and third periodic structures and the second periodic structure is at a different layer on the substrate than the first and second periodic structures.

103. The method of any of clauses 100-102, wherein illuminating comprising illuminating a measurement spot on the diffraction measurement target that covers at one time at least part of each of a periodic structure of the first to third sub-targets.

104. The method of any of clauses 100-103, wherein at least part of a periodic structure of each of the first to third sub-targets is within a contiguous area of less than or equal to 400 µm² on the substrate.

105. The method of any of clauses 100-104, wherein each of the first to third sub-targets is designed for a different process stack for the substrate.

106. The method of any of clauses 100-105, wherein each of the first to third sub-targets is designed for a different layer-pair for multiple layer overlay measurement.

107. A diffraction metrology target comprising at least a first sub-target, a second sub-target and a third sub-target, wherein the first, second and third sub-targets are different in design.

108. The target of clause 107, wherein the different design comprises one of the first to third sub-targets having a different pitch, feature width, space width, and/or segmentation than another of the first to third sub-targets.

109. The target of clause 107 or clause 108, wherein at least part of a periodic structure of each of the first to third sub-targets is within a contiguous area of less than or equal to 400 µm².

110. The target of any of clauses 107-109, wherein each of the first to third sub-targets is designed for a different process stack for a substrate.

111. The target of any of clauses 107-110, wherein each of the first to third sub-targets is designed for a different layer-pair for multiple layer overlay measurement.

112. A method comprising measuring overlay between two layers, the method comprising:
illuminating with radiation a diffraction measurement target on a substrate having a portion of the target on each of the two layers, wherein the two layers are separated by at least one other layer.

113. The method of clause 112, wherein a first layer of the two layers comprises at least a first sub-target and a second sub-target, wherein a first periodic structure is located at least partly underneath the first sub-target in a second layer of the two layers and there being no periodic structure underneath the second sub-target in the second layer.

114. The method of clause 113, wherein the first and second sub-targets are different in design.

115. The method of clause 114, wherein the different design comprises the first sub-target having a different pitch, feature width, space width, and/or segmentation than the second sub-target.

116. The method of any of clauses 113-115, wherein a second periodic structure is located at least partly underneath the second sub-target in the at least one other layer.

117. The method of any of clauses 113-116, wherein illuminating comprising illuminating a measurement spot on the diffraction measurement target that covers at one time at least part of each of a periodic structure of the first and second sub-targets.

118. The method of any of clauses 113-117, wherein at least part of a periodic structure of each of the first and second sub-targets is within a contiguous area of less than or equal to 400 µm² on the substrate.

119. The method of any of clauses 113-118, wherein each of the first and second sub-targets is designed for a different process stack for the substrate.

120. The method of any of clauses 113-119, wherein each of the first and second sub-targets is designed for a different layer-pair for multiple layer overlay measurement.

121. A method of devising an arrangement of a diffraction measurement target, the target comprising a plurality of sub-targets, each sub-target comprising a plurality of periodic structures and each sub-target designed to measure a different layer-pair or to measure for a different process stack, the method comprising:
locating the periodic structures of the sub-targets within a target area; and
locating an assist feature at a periphery of at least one of the sub-targets, the assist feature configured to reduce a measured intensity peak at the periphery of the at least one sub-target.

122. The method of clause 121, wherein the assist feature adjacent to and orientated with a particular periodic structure of a sub-target is positioned in phase with that periodic structure.

123. The method of clause 121 or clause 122, wherein the assist feature comprises a plurality of assist features and the target area is defined by the plurality of assist features substantially surrounding the target area.

124. The method of clause 123, wherein the assist feature comprises a further plurality of assist features provided between each sub-target within the target area.

125. The method of clause 124, wherein the further plurality of assist features are located to fill a space between the sub-targets comprising at least a half a wavelength of the relevant inspection wavelength.

126. The method of any of clauses 121-125, wherein each sub-target is substantially surrounded by the assist feature so as to isolate each sub-target from its surrounding environment.

127. The method of any of clauses 121-126, wherein the assist feature comprises features having a pitch substantially smaller than a pitch of a periodic structure of a sub-target of the plurality of sub-targets.

128. The method of any of clauses 121-127, wherein a pitch of a plurality of structures of the assist feature is such that the assist feature is not detected during inspection of the target using a metrology process.

129. The method of any of clauses 121-128, wherein the assist feature is located immediately adjacent each outermost substructure of each sub-target.

130. The method of any of clauses 121-129, further comprising:
modeling a resultant image obtained by inspection of the target using a diffraction-based metrology process; and
evaluating whether the target arrangement is optimized for detection using the diffraction-based metrology process.

131. The method of clause 130, wherein the method is repeated iteratively in order to optimize the target arrangement.

132. The method of clause 130 or clause 131, wherein a criteria for considering whether a particular target arrangement is considered optimized include at least one selected from:
determining whether intensities at the sub-target periphery are of the same order of magnitude as those at the sub-target center, when inspected using the diffraction-based metrology process;
determining whether there is minimum intensity variation at the sub-target periphery in the presence of overlay, defocus and/or aberrations when inspected using the diffraction-based metrology process;
determining whether there is sufficient spacing between the sub-targets for optimum target-recognition for the relevant inspection wavelength range; and/or
determining whether the total grating area is maximized.

133. The method of any of clauses 121-132, wherein the target comprises two or more overlaid target layers, with an upper target layer comprising an overlay bias and the assist feature, and wherein the bias is not applied to the assist feature in the upper layer.

134. The method of any of clauses 121-132, wherein the target comprises two or more overlaid target layers, with an upper target layer comprising an overlay bias, and wherein the upper layer does not comprise any assist feature.

135. The method of any of clauses 121-132, wherein the assist feature is located in a different layer than the at least one sub-target.

136. A diffraction measurement target comprising:
a plurality of sub-targets in a target area of the target, each sub-target comprising a plurality of periodic structures and each sub-target designed to measure a different layer-pair or to measure for a different process stack; and
an assist feature at the periphery of at least one of the sub-targets, the assist feature configured to reduce a measured intensity peak at the periphery of the sub-targets.

137. The target of clause 136, wherein the assist feature comprises features having a pitch substantially smaller than a pitch of a periodic structure of a sub-target of the plurality of sub-targets.

138. The target of clause 136 or clause 137, wherein each sub-target is substantially surrounded by the assist feature so as to isolate each sub-target from its surrounding environment.

139. The target of any of clauses 136-138, wherein the assist feature comprises a plurality of assist features and the plurality of assist features substantially surround the target area.

140. The target of clause 139, wherein the assist feature comprises a further plurality of assist features which are provided between each sub-target within the target area.

141. The target of any of clauses 136-140, wherein a pitch of features of the assist feature is such that the assist feature is not detected during inspection of the target using a metrology process.

142. The target of any of clauses 136-141, wherein the assist feature is configured to reduce diffraction intensity peaks at each sub-target periphery.

143. The target of any of clauses 136-142, wherein the assist feature is located immediately adjacent each outermost substructure of each sub-target.

144. The target of any of clauses 136-143, wherein the assist feature adjacent to and orientated with a particular periodic structure of a sub-target is positioned in phase with that periodic structure.

145. A method of manufacturing devices wherein a device pattern is applied to a series of substrates using a lithographic process, the method including inspecting at least a diffraction measurement target formed as part of or beside the device pattern on at least one of the substrates using the method of any of clauses 1-9, 15-24, 31-37, 43-51, 61-67, or 73-81, and controlling the lithographic process for later substrates in accordance with the result of the method.

146. A non-transitory computer program product comprising machine-readable instructions for causing a processor to cause performance of the method of any of clauses 1-9, 15-24, 31-37, 43-51, 56-67, 73-81 or 82-96.

147. A non-transitory computer program product comprising machine-readable instructions or data defining the target of any of clauses 10-14, 25-30, 38-42, 52-55, 68-72 or 97-105.

148. A substrate comprising the target of any of clauses 10-14, 25-30, 38-42, 52-55, 68-72 or 97-105.

149. A patterning device configured to at least in part form the diffraction measurement target according to any of clauses 10-14, 25-30, 38-42, 52-55, 68-72 or 97-105.

150. A system comprising: an inspection apparatus configured to provide a beam on a diffraction measurement target on a substrate and to detect radiation diffracted by the target to determine a parameter of a lithographic process; and the non-transitory computer program product of clause 146 or clause 147.

151. The system of clause 150, further comprising a lithographic apparatus comprising a support structure configured to hold a patterning device to modulate a radiation beam and a projection optical system arranged to project the modulated onto a radiation-sensitive substrate.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
    illuminating a first sub-target of a measurement target on a substrate with radiation having a first wavelength, and illuminating a second sub-target of the measurement target on the substrate with radiation having a second wavelength,
        wherein the first wavelength is tuned for the first sub-target and the second wavelength is tuned for the second sub-target and the first wavelength is different than the second wavelength, and
        wherein each of the first sub-target and the second sub-target has a first periodic structure having features extending in a first direction and a second periodic structure having features extending in a second different direction; and
    detecting at least some of the radiation coming from the first sub-target and at least some of the radiation coming from the second sub-target to obtain for the measurement target a measurement representing a parameter of a lithographic process, wherein a value of the parameter is obtained from the first sub-target using the first wavelength without using the second wavelength and from the second sub-target using the second wavelength without using the first wavelength.

2. The method of claim 1, wherein the first sub-target has a different feature width or different space width than the second sub-target.

3. The method of claim 1, wherein the first and second periodic structures of the second sub-target meet at a central portion of the measurement target and the first and second periodic structures of the first sub-target are arranged around a periphery of the first and second periodic structures of the second sub-target.

4. The method of claim 1, wherein the illuminating comprises illuminating the first sub-target with radiation having a first polarization, and illuminating the second sub-target of the measurement target on the substrate with radiation having a second polarization, wherein the first polarization is different from the second polarization.

5. The method of claim 1, wherein at least part of the first sub-target is located on a different layer than at least part of the second sub-target.

6. The method of claim 1, wherein the measurement target has an area of less than or equal to 1000 $\mu m^2$ on the substrate.

7. The method of claim 1, wherein the parameter of the lithographic process is overlay.

8. The method of claim 1, wherein the detecting radiation comprises forming a dark field image of at least the first and second sub-targets.

9. The method of claim 1, further comprising configuring, based on the measurement representing the parameter, the lithographic process or a metrology process.

10. A non-transitory computer program product comprising machine-readable instructions therein, the instructions, upon execution by a computer system, configured to cause the computer system to at least cause:
    illumination of a first sub-target of a measurement target on a substrate with radiation having a first wavelength, and illumination of a second sub-target of the measurement target on the substrate with radiation having a second wavelength,
        wherein the first wavelength is tuned for the first sub-target and the second wavelength is tuned for the second sub-target and the first wavelength is different than the second wavelength, and
        wherein (i) at least part of the first sub-target is located on a different layer than at least part of the second sub-target, or (ii) each of the first sub-target and the second sub-target has a first periodic structure having features extending in a first direction and a second periodic structure having features extending in a second different direction, or (iii) both (i) and (ii); and
    detection of at least some of the radiation coming from the first sub-target and at least some of the radiation coming from the second sub-target to obtain for the measurement target a measurement representing a parameter of a lithographic process, wherein a value of the parameter is obtained from the first sub-target using the first wavelength without using the second wavelength and from the second sub-target using the second wavelength without using the first wavelength.

11. A metrology apparatus comprising the computer product of claim 10.

12. The computer program product of claim 10, wherein at least part of the first sub-target is located on a different layer than at least part of the second sub-target.

13. The computer program product of claim 10, wherein each of the first sub-target and the second sub-target has a first periodic structure having features extending in a first direction and a second periodic structure having features extending in a second different direction.

14. A method comprising:

illuminating a first sub-target of a measurement target on a substrate with radiation having a first wavelength, and illuminating a second sub-target of the measurement target on the substrate with radiation having a second wavelength, wherein the first wavelength is tuned for the first sub-target and the second wavelength is tuned for the second sub-target and the first wavelength is different than the second wavelength, and wherein at least part of the first sub-target is located on a different layer than at least part of the second sub-target; and detecting at least some of the radiation coming from the first sub-target and at least some of the radiation coming from the second sub-target to obtain for the measurement target a measurement representing a parameter of a lithographic process, wherein a value of the parameter is obtained from the first sub-target using the first wavelength without using the second wavelength and from the second sub-target using the second wavelength without using the first wavelength.

15. The method of claim 14, wherein the first sub-target has a different feature width, different pitch, or different space width than the second sub-target.

16. The method of claim 14, wherein the first and second periodic structures of the second sub-target meet at a central portion of the measurement target and the first and second periodic structures of the first sub-target are arranged around a periphery of the first and second periodic structures of the second sub-target.

17. The method of claim 14, wherein the illuminating comprises illuminating the first sub-target with radiation having a first polarization, and illuminating the second sub-target of the measurement target on the substrate with radiation having a second polarization, wherein the first polarization is different from the second polarization.

18. The method of claim 14, wherein (i) the first sub-target has a periodic structure of features with a pitch of the features selected from the range 100-1000 nm, or (ii) the second sub-target has a periodic structure of features with a pitch of the features selected from the range 100-1000 nm, or (iii) both (i) and (ii).

19. The method of claim 14, wherein the measurement target has an area of less than or equal to 1000 $\mu m^2$ on the substrate.

20. The method of claim 14, wherein the parameter of the lithographic process is overlay.

21. The method of claim 14, wherein the detecting radiation comprises forming a dark field image of at least the first and second sub-targets.

22. The method of claim 14, further comprising configuring, based on the measurement representing the parameter, the lithographic process or a metrology process.

23. A non-transitory computer program product comprising machine-readable instructions therein, the instructions, upon execution by a computer system, configured to cause the computer system to at least:

determine a design of first sub-target of a measurement target for formation on a substrate, a first wavelength of radiation for illumination of the first sub-target, a design of second sub-target of the measurement target for formation on the substrate, and a second wavelength of radiation for illumination of the second sub-target, wherein (i) the design of the first sub-target, or (ii) the first wavelength, or (iii) both (i) and (ii), is configured such that the first wavelength is tuned for the first sub-target and (iv) the design of the second sub-target, or (v) the second wavelength, or (vi) both (iv) and (v), is configured such that the second wavelength is tuned for the second sub-target, wherein each of the first sub-target and the second sub-target has a first periodic structure having features extending in a first direction and a second periodic structure having features extending in a second different direction, and wherein the first and second wavelengths are different; and produce a design of the measurement target comprising the designs of the first and second sub-targets and a metrology recipe comprising the first and second wavelengths so as to enable a value of the parameter to be obtained from the first sub-target using the first wavelength without using the second wavelength and from the second sub-target using the second wavelength without using the first wavelength.

24. The medium of claim 23, wherein the first sub-target has a different feature width or different space width than the second sub-target.

25. The medium of claim 23, wherein the first and second periodic structures of the second sub-target meet at a central portion of the measurement target and the first and second periodic structures of the first sub-target are arranged around a periphery of the first and second periodic structures of the second sub-target.

26. The medium of claim 23, wherein the instructions configured to cause the computer system to perform the determination are further configured to cause the computer system to analyze robustness to variation in measurement radiation focus.

27. The medium of claim 23, wherein the instructions are further configured to cause the computer system to determine a first polarization of radiation for illumination of the first sub-target and a second polarization of radiation for illumination of the second sub-target, wherein (vii) the design of the first sub-target, or (viii) the first polarization, or (ix) both (vii) and (viii), is configured such that the first polarization is tuned for the first sub-target and (x) the design of the second sub-target, or (xi) the second polarization, or (xii) both (x) and (xi), is configured such that the second polarization is tuned for the second sub-target, and wherein the first polarization is different from the second polarization.

28. The medium of claim 23, wherein the design of the measurement target is configured to have the measurement target have an area of less than or equal to 1000 $\mu m^2$ on the substrate.

29. The medium of claim 23, wherein the parameter of the lithographic process is overlay.

* * * * *

UNITED STATES PATENT AND TRADEMARK OFFICE
CERTIFICATE OF CORRECTION

| | | |
|---|---|---|
| PATENT NO. | : 11,428,521 B2 | |
| APPLICATION NO. | : 17/519641 | |
| DATED | : August 30, 2022 | |
| INVENTOR(S) | : Kaustuve Bhattacharyya et al. | |

It is certified that error appears in the above-identified patent and that said Letters Patent is hereby corrected as shown below:

On the Title Page

Please add:
(30) Foreign Application Priority Data
Aug. 29, 2014 (EP) ................ 14182962

Signed and Sealed this
Second Day of July, 2024

Katherine Kelly Vidal
*Director of the United States Patent and Trademark Office*